(12) United States Patent
Coe-Sullivan et al.

(10) Patent No.: US 9,054,329 B2
(45) Date of Patent: Jun. 9, 2015

(54) LIGHT-EMITTING DEVICES AND DISPLAYS WITH IMPROVED PERFORMANCE

(75) Inventors: Seth Coe-Sullivan, Belmont, MA (US); Dorai Ramprasad, Columbia, MD (US); Ioannis Kymissis, New York, NY (US); Vladimir Bulovic, Lexington, MA (US); Marshall Cox, North Haven, CT (US); Caroline J. Roush, Somerville, MA (US); Peter T. Kazlas, Sudbury, MA (US); Jonathan S. Steckel, Cambridge, MA (US)

(73) Assignee: QD VISION, INC., Lexington, MA (US)

( * ) Notice: Subject to any disclaimer, the term of this patent is extended or adjusted under 35 U.S.C. 154(b) by 129 days.

(21) Appl. No.: 12/313,779
(22) Filed: Nov. 24, 2008
(65) Prior Publication Data

US 2009/0278141 A1 Nov. 12, 2009

Related U.S. Application Data

(63) Continuation of application No. PCT/US2007/013152, filed on Jun. 4, 2007.
(Continued)

(51) Int. Cl.
*H01L 33/00* (2010.01)
*H01L 51/50* (2006.01)
(Continued)

(52) U.S. Cl.
CPC .............. *H01L 51/5012* (2013.01); *B82Y 20/00* (2013.01); *B82Y 30/00* (2013.01); *C09K 11/02* (2013.01); *C09K 11/565* (2013.01); *C09K 11/883* (2013.01); *H05B 33/145* (2013.01)

(58) Field of Classification Search
USPC ................... 257/40, 642, 643, 759, E51.001, 257/E25.008, E25.009; 438/29
See application file for complete search history.

(56) References Cited

U.S. PATENT DOCUMENTS 5,200,668 A 4/1993 Ohashi et al.
5,238,607 A 8/1993 Herron et al.
(Continued)

FOREIGN PATENT DOCUMENTS

JP 2007086615 3/1995
JP H10-270173 A 10/1998
(Continued)

OTHER PUBLICATIONS

Adachi, et al., "High-Efficiency Red Electrophosphorescence Devices", *Appl. Phys. Lett.* 78, 1622, 2001.
(Continued)

*Primary Examiner* — Marc Armand

(57) ABSTRACT

Light-emitting devices and displays with improved performance are disclosed. A light-emitting device includes an emissive material disposed between a first electrode, and a second electrode. Various embodiments include a device having a peak external quantum efficiency of at least about 2.2%; a device that emits light having a CIE color coordinate of x greater than 0.63; a device having an external quantum efficiency of at least about 2.2 percent when measured at a current density of 5 mA/cm². Also disclosed is a light-emitting device comprising a plurality of semiconductor nanocrystals capable of emitting red light upon excitation, wherein the device has a peak luminescent efficiency of at least about 1.5 lumens per watt. Also disclosed is a light-emitting device comprising a plurality of semiconductor nanocrystals capable of emitting red light upon excitation, wherein the device has a luminescent efficiency of at least about 1.5 lumens per watt when measured at a current density of 5 milliamps/square centimeter. Also disclosed is a light-emitting device comprising a plurality of semiconductor nanocrystals capable of emitting green light upon excitation, wherein the device has a peak external quantum efficiency of at least about 1.1 percent. Further disclosed is a light-emitting device comprising a plurality of semiconductor nanocrystals, wherein the device has a luminescent efficiency of at least about 3 lumens per watt when measured at a current density of 5 mA/cm². Further disclosed is a light-emitting device comprising a plurality of semiconductor nanocrystals capable of emitting green light upon excitation, wherein the device has an external quantum efficiency of at least about 2% when measured at a current density of 5 mA/cm². Other light-emitting devices and displays with improved performance are disclosed. Also disclosed are methods for preparing and for purifying semiconductor nanocrystals.

48 Claims, 29 Drawing Sheets

Related U.S. Application Data

(60) Provisional application No. 60/810,767, filed on Jun. 2, 2006, provisional application No. 60/810,914, filed on Jun. 5, 2006, provisional application No. 60/804,921, filed on Jun. 15, 2006, provisional application No. 60/825,373, filed on Sep. 12, 2006, provisional application No. 60/825,374, filed on Sep. 12, 2006, provisional application No. 60/825,370, filed on Sep. 12, 2006, provisional application No. 60/886,261, filed on Jan. 23, 2007.

(51) Int. Cl.
| | | |
|---|---|---|
| *B82Y 20/00* | (2011.01) | |
| *B82Y 30/00* | (2011.01) | |
| *C09K 11/02* | (2006.01) | |
| *C09K 11/56* | (2006.01) | |
| *C09K 11/88* | (2006.01) | |
| *H05B 33/14* | (2006.01) | |

(56) References Cited

U.S. PATENT DOCUMENTS

| | | | | |
|---|---|---|---|---|
| 5,244,828 | A | 9/1993 | Okada et al. | |
| 5,281,543 | A | 1/1994 | Fukuzawa et al. | |
| 5,512,131 | A | 4/1996 | Kumar et al. | |
| 5,537,000 | A | 7/1996 | Alivisatos et al. | |
| 5,578,379 | A | 11/1996 | Stutzmann et al. | |
| 5,607,876 | A | 3/1997 | Biegelsen et al. | |
| 5,663,573 | A | 9/1997 | Epstein et al. | |
| 5,736,754 | A | 4/1998 | Shi et al. | |
| 5,766,779 | A | 6/1998 | Shi et al. | |
| 5,783,292 | A | 7/1998 | Tokito et al. | |
| 5,866,039 | A | 2/1999 | Morton | |
| 5,882,779 | A | 3/1999 | Lawandy | |
| 5,917,279 | A | 6/1999 | Elschner et al. | |
| 5,949,089 | A | 9/1999 | Kim et al. | |
| 6,129,986 | A | 10/2000 | Bessho et al. | |
| 6,157,047 | A | 12/2000 | Fujita et al. | |
| 6,180,239 | B1 | 1/2001 | Whitesides et al. | |
| 6,194,237 | B1 | 2/2001 | Kim et al. | |
| 6,207,229 | B1 | 3/2001 | Bawendi et al. | |
| 6,239,355 | B1 | 5/2001 | Salafsky | |
| 6,319,426 | B1 * | 11/2001 | Bawendi et al. | 252/301.4 R |
| 6,322,901 | B1 | 11/2001 | Bawendi et al. | |
| 6,501,091 | B1 | 12/2002 | Bawendi et al. | |
| 6,512,172 | B1 | 1/2003 | Salafsky et al. | |
| 6,515,314 | B1 | 2/2003 | Duggal et al. | |
| 6,518,168 | B1 | 2/2003 | Clem et al. | |
| 6,544,808 | B2 | 4/2003 | Hoon | |
| 6,544,870 | B2 | 4/2003 | Park et al. | |
| 6,555,255 | B2 | 4/2003 | Barton et al. | |
| 6,576,291 | B2 | 6/2003 | Bawendi et al. | |
| 6,586,785 | B2 | 7/2003 | Flagan et al. | |
| 6,608,439 | B1 | 8/2003 | Sokolik et al. | |
| 6,617,583 | B1 | 9/2003 | Bawendi et al. | |
| 6,697,403 | B2 | 2/2004 | Lee et al. | |
| 6,706,551 | B2 | 3/2004 | Andriessen | |
| 6,753,273 | B2 | 6/2004 | Holonyak et al. | |
| 6,797,412 | B1 | 9/2004 | Jain et al. | |
| 6,803,719 | B1 | 10/2004 | Miller et al. | |
| 6,815,064 | B2 | 11/2004 | Treadway et al. | |
| 6,838,743 | B2 | 1/2005 | Yamada et al. | |
| 6,838,816 | B2 | 1/2005 | Su et al. | |
| 6,846,565 | B2 | 1/2005 | Korgel et al. | |
| 6,853,013 | B2 | 2/2005 | Hirai et al. | |
| 6,859,477 | B2 | 2/2005 | Deppe et al. | |
| 6,861,155 | B2 | 3/2005 | Bawendi et al. | |
| 6,918,946 | B2 | 7/2005 | Korgel et al. | |
| 6,940,087 | B2 | 9/2005 | Komoda et al. | |
| 6,955,856 | B2 | 10/2005 | Lee et al. | |
| 6,995,505 | B2 | 2/2006 | Kim et al. | |
| 7,015,139 | B2 | 3/2006 | Yamashita | |
| 7,015,498 | B2 | 3/2006 | Ebe et al. | |
| 7,056,471 | B1 | 6/2006 | Han et al. | |
| 7,172,791 | B2 | 2/2007 | Treadway et al. | |
| 7,199,393 | B2 | 4/2007 | Park et al. | |
| 7,208,768 | B2 | 4/2007 | Ono et al. | |
| 7,326,908 | B2 | 2/2008 | Sargent et al. | |
| 7,332,211 | B1 | 2/2008 | Bulovic et al. | |
| 7,361,413 | B2 * | 4/2008 | Kinlen | 428/690 |
| 7,422,790 | B1 | 9/2008 | Scher et al. | |
| 7,569,248 | B2 | 8/2009 | Jang et al. | |
| 7,592,618 | B2 | 9/2009 | Khang et al. | |
| 7,645,397 | B2 | 1/2010 | Parce et al. | |
| 7,700,200 | B2 | 4/2010 | Bulovic at al. | |
| 7,722,422 | B2 | 5/2010 | Cok | |
| 7,732,237 | B2 | 6/2010 | Xie | |
| 7,732,823 | B2 | 6/2010 | Kawaguchi | |
| 7,777,233 | B2 | 8/2010 | Kahen et al. | |
| 7,880,377 | B2 | 2/2011 | Orita et al. | |
| 7,888,700 | B2 | 2/2011 | Kahen | |
| 8,232,722 | B2 | 7/2012 | Bawendi et al. | |
| 8,334,527 | B2 | 12/2012 | Iizumi et al. | |
| 8,354,785 | B2 | 1/2013 | Clough et al. | |
| 8,377,333 | B2 | 2/2013 | Ramprasad et al. | |
| 8,404,154 | B2 | 3/2013 | Breen et al. | |
| 8,470,617 | B2 | 6/2013 | Coe-Sullivan et al. | |
| 8,610,232 | B2 | 12/2013 | Coe-Sullivan et al. | |
| 8,618,561 | B2 | 12/2013 | Coe-Sullivan | |
| 8,691,114 | B2 | 4/2014 | Ramprasad et al. | |
| 8,835,941 | B2 | 9/2014 | Coe-Sullivan et al. | |
| 2002/0146590 | A1 | 10/2002 | Matsuo et al. | |
| 2003/0034486 | A1 | 2/2003 | Korgel | |
| 2003/0035917 | A1 | 2/2003 | Hyman | |
| 2003/0042850 | A1 | 3/2003 | Bertram et al. | |
| 2003/0071794 | A1 | 4/2003 | Arakawa et al. | |
| 2003/0106488 | A1 | 6/2003 | Huang et al. | |
| 2004/0023010 | A1 * | 2/2004 | Bulovic et al. | 428/209 |
| 2004/0091710 | A1 | 5/2004 | Bawendi et al. | |
| 2004/0137263 | A1 | 7/2004 | Burn et al. | |
| 2004/0209115 | A1 | 10/2004 | Thompson et al. | |
| 2004/0227703 | A1 | 11/2004 | Lamvik et al. | |
| 2004/0241424 | A1 | 12/2004 | Barbera-Guillem | |
| 2004/0265622 | A1 | 12/2004 | Sadasivan et al. | |
| 2005/0001538 | A1 | 1/2005 | Ozkan et al. | |
| 2005/0012182 | A1 | 1/2005 | Jang et al. | |
| 2005/0051769 | A1 | 3/2005 | Jang et al. | |
| 2005/0051777 | A1 | 3/2005 | Hill | |
| 2005/0116621 | A1 | 6/2005 | Bellmann et al. | |
| 2005/0116633 | A1 | 6/2005 | Yamazaki et al. | |
| 2005/0117868 | A1 | 6/2005 | Chen et al. | |
| 2005/0129947 | A1 | 6/2005 | Peng et al. | |
| 2005/0135079 | A1 | 6/2005 | Yin Chua et al. | |
| 2005/0214536 | A1 | 9/2005 | Schrier et al. | |
| 2005/0230673 | A1 | 10/2005 | Mueller et al. | |
| 2005/0236556 | A1 | 10/2005 | Sargent et al. | |
| 2005/0258418 | A1 | 11/2005 | Steckel et al. | |
| 2005/0274944 | A1 | 12/2005 | Jang et al. | |
| 2005/0276993 | A1 | 12/2005 | Sohn et al. | |
| 2005/0279989 | A1 | 12/2005 | Li et al. | |
| 2006/0034065 | A1 | 2/2006 | Thurk | |
| 2006/0043361 | A1 | 3/2006 | Lee et al. | |
| 2006/0063029 | A1 | 3/2006 | Jang et al. | |
| 2006/0068154 | A1 | 3/2006 | Parce et al. | |
| 2006/0097264 | A1 * | 5/2006 | Kim et al. | 257/72 |
| 2006/0105199 | A1 | 5/2006 | Gerlach et al. | |
| 2006/0105200 | A1 | 5/2006 | Poplavskyy et al. | |
| 2006/0157686 | A1 | 7/2006 | Jang et al. | |
| 2006/0158089 | A1 | 7/2006 | Saito et al. | |
| 2006/0196075 | A1 | 9/2006 | Coe-Sullivan et al. | |
| 2006/0197437 | A1 * | 9/2006 | Krummacher et al. | 313/501 |
| 2006/0198128 | A1 | 9/2006 | Piepgras et al. | |
| 2006/0204675 | A1 | 9/2006 | Gao et al. | |
| 2006/0220528 | A1 | 10/2006 | Engelhardt et al. | |
| 2006/0232194 | A1 | 10/2006 | Tung et al. | |
| 2006/0236918 | A1 | 10/2006 | Jun et al. | |
| 2006/0273304 | A1 | 12/2006 | Cok | |
| 2007/0001581 | A1 | 1/2007 | Stasiak et al. | |
| 2007/0034856 | A1 | 2/2007 | Ohsawa et al. | |
| 2007/0069202 | A1 | 3/2007 | Choi et al. | |
| 2007/0087219 | A1 | 4/2007 | Ren et al. | |
| 2007/0103068 | A1 | 5/2007 | Bawendi et al. | |
| 2007/0111324 | A1 | 5/2007 | Nie et al. | |
| 2007/0154735 | A1 * | 7/2007 | Nakayama | 428/690 |
| 2007/0170446 | A1 | 7/2007 | Cho et al. | |

(56) References Cited

U.S. PATENT DOCUMENTS

| | | |
|---|---|---|
| 2007/0190675 A1 | 8/2007 | Yamazaki et al. |
| 2007/0200492 A1* | 8/2007 | Cok et al. .................... 313/506 |
| 2007/0215856 A1 | 9/2007 | Kwon et al. |
| 2007/0247061 A1* | 10/2007 | Adamovich et al. ......... 313/504 |
| 2007/0257608 A1 | 11/2007 | Tyan et al. |
| 2007/0298160 A1 | 12/2007 | Jang et al. |
| 2008/0001167 A1 | 1/2008 | Coe-Sullivan et al. |
| 2008/0007156 A1 | 1/2008 | Gibson et al. |
| 2008/0012031 A1 | 1/2008 | Jang et al. |
| 2008/0074050 A1 | 3/2008 | Chen et al. |
| 2008/0150425 A1 | 6/2008 | Cho et al. |
| 2008/0169753 A1 | 7/2008 | Skipor et al. |
| 2008/0180020 A1 | 7/2008 | Cok |
| 2008/0203895 A1 | 8/2008 | Miller et al. |
| 2008/0203899 A1 | 8/2008 | Miller et al. |
| 2008/0217602 A1 | 9/2008 | Kahen |
| 2008/0218068 A1 | 9/2008 | Cok |
| 2008/0238299 A1 | 10/2008 | Cho et al. |
| 2008/0252209 A1 | 10/2008 | Jang et al. |
| 2008/0278063 A1 | 11/2008 | Cok |
| 2008/0296534 A1 | 12/2008 | Lifshitz et al. |
| 2009/0001385 A1 | 1/2009 | Skipor et al. |
| 2009/0001403 A1 | 1/2009 | Skipor et al. |
| 2009/0009057 A1 | 1/2009 | Lee et al. |
| 2009/0017268 A1 | 1/2009 | Skipor et al. |
| 2009/0039764 A1 | 2/2009 | Cho et al. |
| 2009/0174022 A1 | 7/2009 | Coe-Sullivan et al. |
| 2009/0181478 A1 | 7/2009 | Cox et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0251759 A1 | 10/2009 | Domash et al. |
| 2009/0280586 A1 | 11/2009 | Coe-Sullivan et al. |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan et al. |
| 2009/0320909 A1 | 12/2009 | Arango et al. |
| 2010/0001256 A1 | 1/2010 | Coe-Sullivan et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0068468 A1 | 3/2010 | Coe-Sullivan et al. |
| 2010/0108984 A1 | 5/2010 | Cho et al. |
| 2010/0132770 A1 | 6/2010 | Beatty et al. |
| 2010/0134520 A1 | 6/2010 | Coe-Sullivan et al. |
| 2010/0237323 A1 | 9/2010 | Akai et al. |
| 2010/0240901 A1 | 9/2010 | Bulovic et al. |
| 2010/0283014 A1 | 11/2010 | Breen et al. |
| 2010/0289001 A1 | 11/2010 | Kahen et al. |
| 2010/0289003 A1 | 11/2010 | Kahen et al. |
| 2011/0006285 A1 | 1/2011 | Lifshitz et al. |
| 2011/0025224 A1 | 2/2011 | Wood et al. |
| 2011/0080090 A1 | 4/2011 | Wood et al. |
| 2011/0095261 A1 | 4/2011 | Kazlas et al. |
| 2011/0101303 A1 | 5/2011 | Choi et al. |
| 2011/0127932 A1 | 6/2011 | Halpert et al. |
| 2011/0140075 A1 | 6/2011 | Zhou et al. |
| 2011/0287566 A1 | 11/2011 | Jang et al. |
| 2012/0292594 A1 | 11/2012 | Zhou et al. |
| 2013/0009131 A1 | 1/2013 | Kazlas et al. |
| 2013/0037778 A1 | 2/2013 | Kazlas et al. |
| 2013/0221291 A1 | 8/2013 | Ramprasad et al. |
| 2013/0234109 A1 | 9/2013 | Breen et al. |
| 2014/0312300 A1 | 10/2014 | Ramprasad et al. |

FOREIGN PATENT DOCUMENTS

| | | |
|---|---|---|
| JP | H11-040361 A | 2/1999 |
| JP | 2000030859 | 1/2000 |
| JP | 2005228996 | 8/2005 |
| KR | 100636959 B1 | 10/2006 |
| KR | 101176861 B1 | 8/2012 |
| WO | WO 2004/068584 A1 | 8/2004 |
| WO | WO 2006/064896 A1 | 6/2006 |
| WO | WO2007143197 A2 | 12/2007 |
| WO | WO2007143197 A3 | 12/2007 |

OTHER PUBLICATIONS

Akimov, I.A., et al., "Semiconductor nanocrystals in a polymeric matrix: new optical media", *Op. Spectrosc.* 72(4), pp. 558 et seq Apr. 1992.

Alivisatos, A.P., "Perspectives on the Physical Chemistry of Semiconductor Nanocrystals", *J. Phys. Chem.* vol. 100, No. 31, pp. 13226 et seq (1996).

Alivisatos, A.P., "Semiconductor Clusters, Nanocrystals, and Quantum Dots", *Science, New Series*, vol. 271, No. 5251, 933-937 (Feb. 16, 1996).

Anikeeva, P.O., et al., "Electroluminescence from a mixed red-green-blue colloidal quantum dot monolayer ", *Nanoletters* Published on Jul. 5, 2007.

Anikeeva, P.O., et al., "Photoluminescence of CdSe/ZnS core/shell quantum dots enhanced by energy transfer from a phosphorescent donor", *Chem. Phys. Letters*, 424 120-125 (2006).

Bullis, "Nanocrystal Displays", Technology Review, May/Jun. 2006, pp. 78-80.

Bulovic, V., "Organic and Nanostructural Materials in Optoelectronic Applications: Physical Processes and Active Devices", Chapter 26. *Organic and Nanostructured Materials in Optoelectronic Applications*, pp. 26-1-26-40 (undated).

Bulovic, V., et al., "Molecular Organic Light-Emitting Devices", *Semiconductor and Semimetals*, 64, 255, 2000.

Coe, S., et al., "Electroluminescence from single monolayers of nanocrystals in molecular organic devices", *Nature*, vol. 420, No. 6917, pp. 800-803 (2002).

Coe-Sullivan, "Hybrid Organic/Quantum Dot Thin Film Structures and Devices", MIT Thesis in partial fulfillment of Ph.D. in Electrical Engineering and Computer Science (2005).

Coe-Sullivan, "The Application of Quantum Dots in Display Technology", Material Matters, vol. 2, No. 1, pp. 13-14. (Sigma-Aldrich 2007).

Coe-Sullivan, et al., "Large-Area Ordered Quantum-Dot Monolayers via Phase Separation During Spin-Casting", Adv. Funct. Mater. 2005.

Coe-Sullivan, et al., "Method for fabrication of saturated RGB quantum dot light emitting devices". *Proc. Of SPIE* vol. 5739, pp. 108-115 (2005).

Coe-Sullivan, et al., "Tuning the performance of hybrid organic/inorganic quantum dot light-emitting devices", *Organic Electronics* 4 123-130 (2003).

D'Andrade, et al., "Bright White Electrophosphorescent Triple-Emissive Layer Organic Light Emitting Device", MRS Fall Meeting, BB6.2 2001.

Dabbousi, et al., "(CdSe) ZnS Core-Shell Quantum Dots: Synthesis and Characterizaqtion of a Size Series of Highly Luminescent Nanocrystallites", *J. Phys. Chem.* 101, 9463, 1997.

Dirr, et al., "Organic Light Emitting Diodes with Reduced Spectral and Spacial Halfwidths", *Jpn. J. Appl Phys.* 37, 1457, 1998.

Eason, et al., "High-brightness blue and green light-emitting diodes", *Appl. Phys. Left.*, vol. 66, (2) 115 (1995).

Forrest, S.R., et al., "Measuring the Efficiency of Organic Light-Emitting Devices", Advanced Materials, vol. 15, Issue 13, pp. 1043-1048 (2003 WILEY-VCH Verlag GmbH & Co. KGaA, Weinheim).

Gao, M., "Lateral Patterning of CdTe Nanocrystal Films by the Electric Field Directed Layer-by-Layer Assembly Methos", *Langmuir*, 4098-4102 2002.

Ichikawa, et al., "Bipyridyl oxadiazoles as efficient and durable electron-transporting and hole-blocking molecular materials", *J. Mater. Chem.*, 2006, 16, pp. 221-225.

International Search Report and Written Opinion, dated Jul. 18, 2008, mailed in PCT/US2007/13152, filed Jun. 4, 2007, which is the parent of the present application.

(56) References Cited

OTHER PUBLICATIONS

Jang, E., et al., "High quality CdSeS synthesized by facile single injection process and their , electroluminescence", *Chem. Commun*, 2964-2965 2003.
Jun, S. et al., "Interfused Semiconductor Nanocrystals: Brilliant blue photoluminescence and electroluminescence", *Chem. Comm.*, 2005, pp. 4616-4618.
Kim, L., et al., "Contact Printing of Quantum Dot Light-Emitting Devices",*Nano. Letters*, vol. 8, No. 12, 4513-4517.
Lee et al., "High-Efficiency Fluorescent Blue Organic Light-Emitting Device with Balanced Carrier Transport", *J. Electrochem. Soc.*, vol. 154, (7), pp. J226-J228.
Lee, T., "Organic light-emitting diodes formed by soft contact lamination", *PNAS*, vol. 101, No. 2, 429-433 Jan. 13, 2004.
Levy, G., et al., "An 852x600 Pixel OLED-on-Silicon Color Microdisplay Using CMOS Subtreshold-Voltage-Scaling Current Drivers", *IEEE*, 2002.
Lim, et al., "Preparation of highly luminescent nanocrystals and their application in light-emitting diodes", *Adv. Mater.* (2007), 19, pp. 1927-1932.
Lin, X., et al., "Formation of Long-Range-Ordered Nanocrystal Superlattices on Silicon Nitride Substrates", *J. Phys. Chem. B*, 105, 3353-3357 (2001).
Mashford, et al., "High-efficiency quantum-dot light-emitting devices with enhanced charge injection", Nature Photonics 7, pp. 407-412 (2013).
Mattoussi, H., et al., "Electroluminescence from heterostructures of poly(phenylene vinylene) and inorganic CdSe nanocrystals", *J. Appl. Phys.* vol. 83, No. 12, pp. 7965 (1998).
Moeller, G., et I, "Quantum-dot light-emitting devices for displays", Information Display, pp. 2-6 Feb. 2006.
Murray, et al., "Synthesis and Characterization of Nearly Monodisperse CdE (E=S, Se, Te) Semiconductor Nanocrystallites", *J. Am. Chem. Soc.*, 115:8706 (1993).
Murray, et al., Ph.D. Thesis entitled "Synthesis and Characterization of II-VI Quantum Dots and Their Assembly into 3-D Quantum Dot Superlattices", *MIT*, Sep. 1995.
National Science Foundation, "Materials and Devices for Information Technology Research", *Fourth Annual Report*, pp. 52-56, 2006.
Santhanam, et al., "Microcontact Printing of Uniform Nanoparticle Arrays", *Nano Letters*, 4, 41-44, 2004.
Santhanam, V., et al., "Self-Assembly of Uniform Monolayer Arrays of Nanoparticles", *Langmuir*, 19, 7881-7887 (2003).
Schlamp, M.G., et al., "Improved efficiencies in light emitting diodes made with CdSe(CdS) core/shell type nanocrystals and a semiconducting polymer", *J. Appl. Phys.*, 82, 5837-5842 (1997).
Steckel, J. et al., "Blue Luminescence from (CdS)ZnS Core-Shell Nanocrystals", *Angew. Chem. Int. Ed.* 2004.
Steckel, J. et al., "Color-Saturated Green-Emitting QD-LEDs"*Angew. Chem. Int. Ed.*, vol. 45, 2006.
Steckel, J.S., et al., "1.3 µm to 1.55 µm Tunable Electroluminescence from PbSe Quantum Dots Embedded within an Organic Device", *Adv. Mater.*, 15, No. 21 Nov. 4, 2003.
Steckel, Jonathan S., Ph.D. Thesis entitled "The Synthesis of Inorganic Semiconductor Nanocrystalline Materials For the Purpose of Creating Hybrid Organic/Inorganic Light-Emitting Devices", Massachusetts Institute of Technology, Feb. 2006.
Tullo, Alexander H., "Printable electronics is attracting growing interest and is gearing up for commercial applications", *Chemical & Engineering News*, vol. 84, No. 7, pp. 45-51. Feb. 13, 2006.
Xie, R. et al. "Synthesis and Characterization of Highly Luminescent CdSe-Core CdS/AnCdS/ZnS Multishell Nanocrystals" *J. Am. Chem. Soc.*, 2005.
Yamasaki et al., "Organic light-emitting device with an ordered monolayer of silica microshperes as a scattering medium", *Appl. Phys. Lett.* 76, 1243 (2000).
Zhao, J. et al., "Efficient CdSe/CdS Quantum Dot Light-Emitting Diodes Using a Thermally Polymerized Hole Transport Layer" *Nano Letters* vol. 6, No. 3 2006.
Chen, et al. "Colloidal ZnSe, ZnSe/ZnS, and ZnSe/ZnSeS Quantum Dots Synthesized from ZnO", J. Phys. Chem. B (2004), vol. 108, pp. 17119-17123.
International Search Report and Written Opinion for International Application No. PCT/US2007/019796, filed Jul. 17, 2008. (PCT/US2007/019796 is the parent of copending U.S. Appl. No. 12/381,530, filed Mar. 12, 2009, both of which claim priority to U.S. Appl. No. 60/825,370.).
Donega, "Single-Step Synthesis to Control the Photoluminescence Quantum Yield and Size Dispersion of CdSe Nanocrystals", J. Phys. Chem. B (2003), vol. 107, pp. 489-496.
Xie, "Preparation and Characterization of Overcoated II-VI Quantum Dots", J. of Nanoscience and Nanotech (2005), vol. 5, No. 6, pp. 880-887.
Zhong, "Alloyed $ZnxCd1-xS$ Nanocrystals with Highly Narrow Luminescence Spectral Width", J. Am. Chem. Soc. (2003), vol. 125, pp. 13559013563.
Zhong, et al. "Composition-Tunable $ZnxCd1-xSe$ Nanocrystals with High Luminescence and Stability", J. Am. Chem. Soc., (2003), vol. 125, pp. 8589-8594.
Zhong, et al., "Embryonic nuclei-induced alloying process for the reproducible synthesis of blue-emitting $Zn_xCd_{1-x}Se$ nanocrystals with long-time thermal stability in size distribuytion and emission wavelength", J. Phys. Chem. B, 2004, 108, 15552-15559.
Bailey, et al., "Alloyed semiconductor quantum dots: tuning the optical properties without changing the particle size", *J. Am. Chem. Soc.*, 2003, 125, 7100-7106.
Jang, et al., "High quality CdSeS nanocrystals synthesized by facile single injection process and their electroluminescence", *Chem. Commun.*, 2003, 2964-2966.
Jiang, et al., "Optimizing the synthesis of red- to near-IR-emitting CdS-capped $CdTexSe1-x$ alloyed quantum dots for biomedical imaging", *Chem. Mater.*, 2006, 18, 4845-4854.
Petrov, "Size and band-gap dependences of the first hyperpolarizability of $CdxZn1-xS$ nanocrystals", *J. Phys. Chem. B* 2002, 106, 5325-5334.
Protiere, et al., "Highly luminescent $Cd1-xZnXSe$/ZnSe core/shell nanocrystals emitting in the blue-green spectral region", *Small*, 2007, 3. No. 3, 399-403.
Talapin, et al., "Highly luminescent monodisperse CdSe and CdSe/ZnS nanocrystals synthesized in a hexadecylamine-trioctylphosphine oxide-trioctyl phosphine mixture", *Nano Letters*, 2001, vol. 1, No. 4, 207-211.
Vogel, R., et al., "Quantum-Sized PbS, CdS, Ag2S, Sb2S2 and Bi2S3 Particles as Sensitizers for Various. Nanoporous Wide-Bandgap Semiconductors", *J. Phys Chem.*, vol. 98 (1994), pp. 3183-3188.
Wang, et al., "Room-temperature synthesis and characterization of nanocrystalline CdS, ZnS, and $CdxZn1-xS$", *Chem. Mater.* , 2002, 14, 3028-3033.
Zhong, et al., High-quality violet-to red-emitting ZnSe/CdSe core/shell nanocrystals, *Chem. Mater.*, 2005, 17, 4038-4042.

\* cited by examiner

060510D
E105/ RQD/ 200 Ang bAlq2/ Mg/Ag

| | | B1 | B2 | B3 | B4 | C1 |
|---|---|---|---|---|---|---|
| 5 mA/cm2 | L | 4.40E-04 | 5.76E-04 | 6.36E-04 | 6.72E-04 | 2.25E-03 |
| | V | 10.36 | 10.81 | 10.90 | 10.87 | 10.76 |
| | EQE | 1.91 | 1.92 | 1.88 | 1.87 | 1.58 |
| | L CS200 | 111.82 | 103.00 | 105.00 | 118.58 | 119.00 |
| | PW | 618.26 | 618.26 | 617.92 | 617.92 | 618.96 |
| | FWHM | 35.09 | 34.74 | 35.44 | 35.44 | 35.09 |
| | cd/A | 2.24 | 2.06 | 2.10 | 2.37 | 2.38 |
| | lm/W | 0.68 | 0.60 | 0.60 | 0.69 | 0.69 |
| 20 mA/cm | L | 1.25E-03 | 1.62E-03 | 1.78E-03 | 1.88E-03 | 6.24E-03 |
| | V | 14.93 | 15.29 | 15.37 | 15.30 | 14.73 |
| | EQE | 1.35 | 1.33 | 1.30 | 1.29 | 1.08 |
| | L CS200 | 311.85 | 145.00 | 158.00 | 300.92 | 270.00 |
| | PW | 617.92 | 618.26 | 620.00 | 620.00 | 618.26 |
| | FWHM | 35.09 | 35.78 | 35.08 | 35.08 | 35.78 |
| | cd/A | 1.56 | 0.73 | 0.79 | 1.50 | 1.35 |
| | lm/W | 0.33 | 0.15 | 0.16 | 0.31 | 0.29 |
| | x mean | 0.63 | 0.62 | 0.63 | 0.63 | 0.63 |
| | y mean | 0.34 | 0.35 | 0.34 | 0.34 | 0.34 |

FIG. 3

060510E
RQD Saturated BME

| | | B1 | B2 | B3 | B4 | C1 |
|---|---|---|---|---|---|---|
| 5 mA/cm2 | L | 6.11E-04 | 8.25E-04 | 8.99E-04 | 1.01E-03 | 4.24E-03 |
| | V | 6.98 | 6.82 | 6.81 | 6.79 | 6.72 |
| | EQE | 2.65 | 2.75 | 2.65 | 2.81 | 2.96 |
| | L CS200 | 148.92 | 171.40 | 182.04 | 164.75 | 193.79 |
| | PW | 618.96 | 618.96 | 618.26 | 620.70 | 618.96 |
| | FWHM | 35.78 | 35.77 | 35.78 | 36.84 | 35.78 |
| | cd/A | 2.98 | 3.43 | 3.64 | 3.30 | 3.88 |
| | lm/W | 1.34 | 1.58 | 1.68 | 1.52 | 1.81 |
| 20 mA/cm2 | L | 1.84E-03 | 2.52E-03 | 2.80E-03 | 3.16E-03 | 1.36E-02 |
| | V | 10.06 | 9.77 | 9.65 | 9.51 | 9.27 |
| | EQE | 1.97 | 2.08 | 2.04 | 2.18 | 2.35 |
| | L CS200 | 489.05 | 552.73 | 544.97 | 559.96 | 636.99 |
| | PW | 618.61 | 618.26 | 619.31 | 617.22 | 618.96 |
| | FWHM | 36.81 | 36.46 | 36.12 | 97.64 | 36.12 |
| | cd/A | 2.45 | 2.76 | 2.72 | 2.80 | 3.18 |
| | lm/W | 0.76 | 0.89 | 0.89 | 0.92 | 1.08 |
| | x mean | 0.59 | 0.59 | 0.59 | 0.59 | 0.61 |
| | y mean | 0.38 | 0.38 | 0.38 | 0.38 | 0.37 |

| | | B1 | B2 | B3 | B4 | C1 |
|---|---|---|---|---|---|---|
| 5 mA/cm2 | L | 5.13E-04 | 7.04E-04 | 8.38E-04 | 8.51E-04 | 2.76E-03 |
| | V | 6.87 | 6.77 | 6.73 | 6.69 | 6.42 |
| | EQE | 2.22 | 2.35 | 2.47 | 2.37 | 1.93 |
| | L CS200 | 160.06 | 178.65 | 160.63 | 177.91 | 153.81 |
| | PW | 618.96 | 618.96 | 618.26 | 618.96 | 618.26 |
| | FWHM | 35.43 | 35.43 | 35.43 | 35.08 | 34.73 |
| | cd/A | 3.20 | 3.57 | 3.21 | 3.56 | 3.08 |
| | lm/W | 1.46 | 1.66 | 1.50 | 1.67 | 1.51 |
| 20 mA/cm2 | L | 1.77E-03 | 2.45E-03 | 2.90E-03 | 3.00E-03 | 9.98E-03 |
| | V | 9.15 | 9.00 | 8.89 | 8.75 | 8.36 |
| | EQE | 1.90 | 2.02 | 2.12 | 2.07 | 1.73 |
| | L CS200 | 640.19 | 602.27 | 625.48 | 610.67 | 540.94 |
| | PW | 617.57 | 618.96 | 618.96 | 618.96 | 618.96 |
| | FWHM | 35.43 | 35.42 | 35.77 | 35.77 | 35.08 |
| | cd/A | 3.20 | 3.01 | 3.13 | 3.05 | 2.70 |
| | lm/W | 1.10 | 1.05 | 1.10 | 1.10 | 1.02 |
| | x mean | 0.66 | 0.65 | 0.66 | 0.65 | 0.66 |
| | y mean | 0.34 | 0.34 | 0.34 | 0.34 | 0.34 |

| | | B1 | B2 | B3 | B4 | C1 | C2 |
|---|---|---|---|---|---|---|---|
| 5 mA/cm2 | L | 3.42E-04 | 4.92E-04 | 5.84E-04 | 6.34E-04 | 2.55E-03 | 2.51E-03 |
| | V | 7.31 | 7.18 | 7.19 | 7.16 | 7.34 | 7.40 |
| | EQE | 1.48 | 1.64 | 1.72 | 1.76 | 1.79 | 1.77 |
| | L CS200 | 97.75 | 102.43 | 111.85 | 115.61 | 126.79 | 131.05 |
| | PW | 618.96 | 617.92 | 618.96 | 618.96 | 618.26 | 618.96 |
| | FWHM | 35.77 | 35.77 | 36.12 | 36.12 | 36.12 | 35.77 |
| | cd/A | 1.96 | 2.05 | 2.24 | 2.31 | 2.54 | 2.62 |
| | lm/W | 0.84 | 0.90 | 0.98 | 1.01 | 1.09 | 1.11 |
| 20 mA/cm | L | 1.08E-03 | 1.55E-03 | 1.86E-03 | 2.05E-03 | 8.29E-03 | 8.25E-03 |
| | V | 10.33 | 10.15 | 10.08 | 9.93 | 10.27 | 10.31 |
| | EQE | 1.16 | 1.28 | 1.36 | 1.41 | 1.44 | 1.44 |
| | L CS200 | 306.27 | 325.15 | 352.34 | 376.77 | 418.04 | 421.79 |
| | PW | 618.96 | 619.31 | 619.31 | 620.00 | 620.35 | 618.96 |
| | FWHM | 36.12 | 35.77 | 36.11 | 36.46 | 36.12 | 36.46 |
| | cd/A | 1.53 | 1.63 | 1.76 | 1.88 | 2.09 | 2.11 |
| | lm/W | 0.47 | 0.50 | 0.55 | 0.60 | 0.64 | 0.64 |
| | x mean | 0.64 | 0.65 | 0.65 | 0.63 | 0.64 | 0.64 |
| | y mean | 0.34 | 0.34 | 0.34 | 0.34 | 0.34 | 0.34 |

060516M
E105/ RQD/ TAZ/ Alq3/ LiF:Al

| | | B1 | B2 | B3 | B4 | C1 |
|---|---|---|---|---|---|---|
| 5 mA/cm² | L | 6.48E-04 | 8.05E-04 | 8.85E-04 | 9.51E-04 | 3.17E-03 |
| | V | 7.90 | 8.07 | 8.14 | 8.15 | 8.06 |
| | EQE | 2.80 | 2.63 | 2.61 | 2.49 | 2.32 |
| | L CS200 | 143.54 | 101.64 | 154.16 | 149.20 | 142.30 |
| | PW | 617.92 | 617.57 | 617.22 | 618.96 | 618.61 |
| | FWHM | 35.08 | 35.08 | 35.09 | 34.73 | 35.08 |
| | cd/A | 2.87 | 2.03 | 3.08 | 2.98 | 2.85 |
| | lm/W | 1.14 | 0.79 | 1.19 | 1.15 | 1.11 |
| 20 mA/cm² | L | 1.83E-03 | 2.27E-03 | 2.49E-03 | 2.64E-03 | 8.78E-03 |
| | V | 10.24 | 10.46 | 10.51 | 10.48 | 10.43 |
| | EQE | 1.96 | 1.84 | 1.82 | 1.71 | 1.59 |
| | L CS200 | 360.49 | 239.86 | 377.77 | 418.31 | 345.64 |
| | PW | 617.22 | 620.00 | 620.70 | 618.61 | 618.96 |
| | FWHM | 35.08 | 35.08 | 35.09 | 34.73 | 35.43 |
| | cd/A | 1.80 | 1.20 | 1.89 | 2.09 | 1.73 |
| | lm/W | 0.55 | 0.36 | 0.56 | 0.63 | 0.52 |
| | x mean | 0.6008 | 0.5818 | 0.5890 | 0.5831 | 0.6139 |
| | y mean | 0.2773 | 0.2682 | 0.2731 | 0.2698 | 0.2830 |

060524E
E105/ RQD/ TPBi/ Alq3/ LiF:Al

|  |  | B1 | B2 | B3 | B4 | C1 | C2 |
|---|---|---|---|---|---|---|---|
| 5 mA/cm2 | L | 4.80E-04 | 6.23E-04 | 7.06E-04 | 7.58E-04 | 3.00E-03 | 2.92E-03 |
|  | V | 4.91 | 4.99 | 5.02 | 5.06 | 5.16 | 5.19 |
|  | EQE | 2.08 | 2.03 | 2.08 | 1.98 | 2.20 | 2.24 |
|  | L CS200 |  |  | 170.05 | 146.99 | 146.64 |  |
|  | PW |  |  |  |  |  |  |
|  | FWHM |  |  |  |  |  |  |
|  | cd/A |  |  | 3.40 | 2.94 | 2.93 |  |
|  | lm/W |  |  | 2.13 | 1.82 | 1.78 |  |
| 20 mA/cm | L | 1.48E-03 | 1.90E-03 | 2.15E-03 | 2.27E-03 | 8.88E-03 | 8.56E-03 |
|  | V | 6.85 | 7.04 | 7.11 | 7.16 | 7.60 | 7.73 |
|  | EQE | 1.59 | 1.54 | 1.57 | 1.47 | 1.61 | 1.63 |
|  | L CS200 |  |  | 358.99 | 329.23 | 340.81 | 330.53 |
|  | PW |  |  | 616.87 | 616.87 |  |  |
|  | FWHM |  |  | 35.81 | 35.80 |  |  |
|  | cd/A |  |  | 1.79 | 1.65 | 1.70 | 1.65 |
|  | lm/W |  |  | 0.79 | 0.72 | 0.70 | 0.67 |
|  | x mean | -- | -- | 0.6504 | 0.6482 | 0.6471 | 0.6486 |
|  | y mean | -- | -- | 0.3203 | 0.3198 | 0.3196 | 0.3202 |

| | B1 | B2 | B3 | B4 | C2 |
|---|---|---|---|---|---|
| L | 0.0007 | 0.0009 | 0.0010 | 0.0010 | 0.0041 |
| V | 3.76 | 3.76 | 3.76 | 3.76 | 4.12 |
| EQE | 2.85 | 2.78 | 2.88 | 2.69 | 3.17 |
| L CS200 | 199.31 | 206.44 | 206.38 | 202.25 | 203.87 |
| cd/A | 3.99 | 4.13 | 4.13 | 4.04 | 4.08 |
| lm/W | 3.33 | 3.45 | 3.44 | 3.37 | 3.11 |

20 mA/cm2

| | B1 | B2 | B3 | B4 | C2 |
|---|---|---|---|---|---|
| L | 0.0020 | 0.0027 | 0.0031 | 0.0032 | 0.0129 |
| V | 5.10 | 5.10 | 5.11 | 5.10 | 5.73 |
| EQE | 2.19 | 2.14 | 2.23 | 2.09 | 2.44 |
| L CS200 | 444.06 | 430.51 | 436.24 | 442.45 | 441.29 |
| PW | 621.74 | 619.94 | 619.34 | 620.34 | 619.54 |
| FWHM | 31.28 | 30.88 | 29.88 | 30.88 | 29.29 |
| cd/A | 2.22 | 2.15 | 2.18 | 2.21 | 2.21 |
| lm/W | 1.37 | 1.33 | 1.34 | 1.36 | 1.21 |

| | | | | | |
|---|---|---|---|---|---|
| x mean | 0.6601 | 0.6594 | 0.6586 | 0.6585 | 0.6625 |
| y mean | 0.3342 | 0.3348 | 0.3354 | 0.3354 | 0.3326 |

060908F

| | | B1 | B2 | B3 | B4 | C1 | C2 | D1 |
|---|---|---|---|---|---|---|---|---|
| 5 mA/cm² | L | 0.0007 | 0.0009 | 0.0011 | 0.0011 | 0.0044 | 0.0043 | 0.0078 |
| | V | 3.72 | 3.68 | 3.68 | 3.67 | 3.89 | 3.87 | 4.22 |
| | EQE | 3.09 | 2.84 | 3.13 | 2.93 | 3.24 | 3.33 | 1.76 |
| | L CS200 | 63.25 | 164.49 | 231.26 | 223.77 | 205.71 | 211.26 | 152.43 |
| | cd/A | 1.27 | 3.29 | 4.63 | 4.48 | 4.11 | 4.23 | 3.05 |
| | lm/W | 1.07 | 2.81 | 3.95 | 3.83 | 3.32 | 3.43 | 2.27 |
| 20 mA/cm² | L | 0.0021 | 0.0027 | 0.0033 | 0.0034 | 0.0137 | 0.0134 | 0.0249 |
| | V | 4.95 | 4.90 | 4.91 | 4.90 | 5.31 | 5.28 | 5.81 |
| | EQE | 2.27 | 2.16 | 2.38 | 2.23 | 2.48 | 2.55 | 1.39 |
| | L CS200 | 373.20 | 413.54 | 462.76 | 445.43 | 420.97 | 434.28 | 343.73 |
| | PW | 618.94 | 623.33 | 620.14 | 620.34 | 620.14 | 619.94 | 619.74 |
| | FWHM | 31.08 | 30.68 | 31.48 | 31.08 | 28.49 | 28.69 | 29.69 |
| | cd/A | 1.87 | 2.07 | 2.31 | 2.23 | 2.10 | 2.17 | 1.72 |
| | lm/W | 1.18 | 1.32 | 1.48 | 1.43 | 1.25 | 1.29 | 0.93 |
| x mean | | 0.6588 | 0.6614 | 0.6620 | 0.6615 | 0.6601 | 0.6603 | 0.6528 |
| y mean | | 0.3363 | 0.3335 | 0.3331 | 0.3338 | 0.3346 | 0.3344 | 0.3399 |

| | | B1 | B2 | B3 | B4 | C1 | C2 | D1 |
|---|---|---|---|---|---|---|---|---|
| 5 mA/cm2 | L | 0.0007 | 0.0009 | 0.0010 | 0.0011 | 0.0042 | 0.0042 | 0.0155 |
| | V | 3.73 | 3.73 | 3.73 | 3.74 | 3.98 | 3.95 | 4.45 |
| | EQE | 3.03 | 2.97 | 3.01 | 2.99 | 3.08 | 3.24 | 3.49 |
| | L CS200 | 223.39 | 211.93 | 191.07 | 219.74 | 194.92 | 203.97 | 222.85 |
| | cd/A | 4.47 | 4.24 | 3.82 | 4.39 | 3.90 | 4.08 | 4.46 |
| | lm/W | 3.76 | 3.57 | 3.22 | 3.69 | 3.07 | 3.24 | 3.14 |
| 20 mA/cm2 | L | 0.0021 | 0.0027 | 0.0030 | 0.0034 | 0.0127 | 0.0129 | 0.0468 |
| | V | 5.01 | 5.03 | 5.03 | 5.05 | 5.49 | 5.40 | 6.15 |
| | EQE | 2.22 | 2.21 | 2.21 | 2.21 | 2.30 | 2.45 | 2.61 |
| | L CS200 | 458.80 | 440.39 | 406.71 | 443.01 | 397.65 | 424.61 | 464.64 |
| | PW | 621.54 | 621.74 | 620.94 | 620.54 | 618.94 | 619.74 | 620.34 |
| | FWHM | 18.34 | 31.28 | 30.88 | 30.88 | 28.49 | 28.89 | 24.91 |
| | cd/A | 2.29 | 2.20 | 2.03 | 2.22 | 1.99 | 2.12 | 2.32 |
| | lm/W | 1.44 | 1.38 | 1.27 | 1.38 | 1.14 | 1.23 | 1.19 |
| | x mean | 0.6635 | 0.6594 | 0.6596 | 0.6633 | 0.6598 | 0.6596 | 0.6643 |
| | y mean | 0.3315 | 0.3344 | 0.3343 | 0.3317 | 0.3343 | 0.3345 | 0.3309 |

070108A
E105/ RQD-137/ Alq3

| | | B1 | B2 | B3 | B4 |
|---|---|---|---|---|---|
| 5 mA/cm2 | L | 9.10E-04 | 1.21E-03 | 1.38E-03 | 1.47E-03 |
| | V | 5.63 | 5.58 | 5.56 | 5.58 |
| | EQE | 3.93 | 3.96 | 4.06 | 3.85 |
| | L CS200 | 257.10 | 266.86 | 268.26 | 269.03 |
| | cd/A | 5.14 | 5.34 | 5.37 | 5.38 |
| | lm/W | 2.87 | 3.00 | 3.03 | 3.03 |
| 20 mA/cm2 | L | 3.01E-03 | 4.07E-03 | 4.61E-03 | 4.88E-03 |
| | V | 7.67 | 7.58 | 7.52 | 7.57 |
| | EQE | 3.22 | 3.28 | 3.36 | 3.16 |
| | L CS200 | 584.55 | 618.29 | 632.08 | 624.65 |
| | PW | 617.35 | 613.95 | 616.55 | 615.75 |
| | FWHM | 42.87 | 43.46 | 43.07 | 43.07 |
| | cd/A | 2.92 | 3.09 | 3.16 | 3.12 |
| | lm/W | 1.20 | 1.28 | 1.32 | 1.30 |
| | x mean | 0.635 | 0.628 | 0.626 | 0.628 |
| | y mean | 0.354 | 0.358 | 0.360 | 0.359 |

|  |  | 060718A | | | | 060718B | | | | 060718C | | | | 060718D | | | |
|---|---|---|---|---|---|---|---|---|---|---|---|---|---|---|---|---|---|
|  |  | B4 | C1 | C2 | D1 | B4 | C1 | C2 | D1 | B4 | C1 | C2 | D1 | B4 | C1 | C2 | D1 |
| 5 mA/cm2 | L | 0.0003 | 0.0012 | 0.0011 | 0.0031 | 0.0003 | 0.0011 | 0.0011 | 0.0032 | 0.0003 | 0.0010 | 0.0010 | 0.0008 | 0.0003 | 0.0010 | 0.0010 | 0.0031 |
|  | V | 3.36 | 3.31 | 3.28 | 3.35 | 3.25 | 3.29 | 3.29 | 3.28 | 3.17 | 3.28 | 3.34 | 3.18 | 3.14 | 3.20 | 3.19 | 3.27 |
|  | EQE | 0.87 | 0.89 | 0.89 | 0.72 | 0.76 | 0.81 | 0.81 | 0.73 | 0.69 | 0.76 | 0.77 | 0.19 | 0.69 | 0.76 | 0.77 | 0.72 |
|  | LCS200 | 96.70 | 123.96 | 125.45 | 114.10 | 119.14 | 140.51 | 145.53 | 162.83 | 134.83 | 125.24 | 115.13 | 25.43 | 118.67 | 132.81 | 139.95 | 111.31 |
|  | cd/A | 1.93 | 2.48 | 2.51 | 2.28 | 2.38 | 2.81 | 2.91 | 3.26 | 2.70 | 2.50 | 2.30 | 0.51 | 2.37 | 2.66 | 2.80 | 2.23 |
|  | lm/W | 1.81 | 2.35 | 2.40 | 2.14 | 2.30 | 2.68 | 2.77 | 3.12 | 2.67 | 2.40 | 2.16 | 0.50 | 2.37 | 2.61 | 2.76 | 2.14 |
| 20 mA/cm2 | L | 0.0010 | 0.0037 | 0.0036 | 0.0101 | 0.0009 | 0.0035 | 0.0035 | 0.0105 | 0.0009 | 0.0033 | 0.0031 | 0.0041 | 0.0009 | 0.0034 | 0.0033 | 0.0104 |
|  | V | 4.46 | 4.43 | 4.37 | 4.61 | 4.11 | 4.27 | 4.30 | 4.34 | 3.97 | 4.29 | 4.43 | 4.48 | 3.87 | 4.04 | 4.02 | 4.35 |
|  | EQE | 0.65 | 0.68 | 0.69 | 0.57 | 0.62 | 0.65 | 0.67 | 0.60 | 0.56 | 0.61 | 0.60 | 0.23 | 0.57 | 0.62 | 0.63 | 0.59 |
|  | LCS200 | 196.94 | 255.94 | 262.34 | 255.76 | 255.66 | 303.87 | 304.71 | 380.68 | 283.24 | 262.92 | 231.68 | 82.92 | 257.94 | 289.12 | 307.41 | 251.16 |
|  | PW | 532.84 | 534.89 | 535.71 | 532.42 | 532.84 | 533.25 | 537.36 | 532.01 | 533.04 | 534.07 | 533.66 | 534.07 | 543.31 | 536.74 | 536.95 | 533.66 |
|  | FWHM | 37.81 | 31.24 | 30.21 | 28.16 | 37.61 | 31.03 | 31.45 | 27.34 | 38.85 | 30.63 | 29.80 | 48.93 | 33.69 | 32.87 | 34.11 | 35.56 |
|  | cd/A | 0.98 | 1.28 | 1.31 | 1.28 | 1.28 | 1.52 | 1.52 | 1.90 | 1.42 | 1.31 | 1.16 | 0.41 | 1.29 | 1.45 | 1.54 | 1.26 |
|  | lm/W | 0.69 | 0.91 | 0.94 | 0.87 | 0.98 | 1.12 | 1.11 | 1.38 | 1.12 | 0.96 | 0.82 | 0.29 | 1.05 | 1.12 | 1.20 | 0.91 |
| x mean |  | 0.3164 | 0.3121 | 0.3118 | 0.3159 | 0.3109 | 0.3111 | 0.3111 | 0.3185 | 0.3109 | 0.3144 | 0.3168 | 0.3554 | 0.3127 | 0.3152 | 0.3138 | 0.3152 |
| y mean |  | 0.6278 | 0.6278 | 0.6279 | 0.6227 | 0.6315 | 0.6309 | 0.6319 | 0.6197 | 0.6302 | 0.6251 | 0.6227 | 0.5525 | 0.6286 | 0.6246 | 0.6253 | 0.6239 |

061128K
E105(500)/ G130/ TPBi(500)

| | | B1 | B2 | B3 | B4 | C1 | C2 | D1 |
|---|---|---|---|---|---|---|---|---|
| 5 mA/cm2 | L | 3.61E-04 | 2.97E-08 | 5.18E-04 | 5.40E-04 | 2.71E-08 | 2.31E-03 | 7.76E-03 |
| | V | 5.33 | 40.00* | 5.38 | 5.43 | 40.00* | 5.73 | 6.40 |
| | EQE | 1.58 | 0.00* | 1.55 | 1.43 | 0.00* | 1.79 | 1.77 |
| | L CS200 | 332.21 | 295.33 | 322.94 | 316.96 | 290.46 | 321.67 | 299.22 |
| | cd/A | 6.64 | 5.91 | 6.46 | 6.34 | 5.81 | 6.43 | 5.98 |
| | lm/W | 3.91 | 0.46* | 3.77 | 3.67 | 0.46* | 3.52 | 2.93 |
| 20 mA/cm2 | L | 9.81E-04 | 3.09E-08 | 1.43E-03 | 1.50E-03 | 2.66E-08 | 6.41E-03 | 2.13E-02 |
| | V | 7.14 | 40.00* | 7.15 | 7.21 | 40.00* | 7.75 | 8.58 |
| | EQE | 1.06 | 0.00* | 1.06 | 0.98 | 0.00* | 1.23 | 1.20 |
| | L CS200 | 717.93 | 618.51 | 694.78 | 668.32 | 646.09 | 703.00 | 689.46 |
| | PW | 535.51 | 536.74 | 537.36 | 535.92 | 536.74 | 536.54 | 537.36 |
| | FWHM | 34.71 | 34.91 | 34.71 | 34.50 | 33.68 | 33.68 | 23.00 |
| | cd/A | 3.59 | 3.09 | 3.47 | 3.34 | 3.23 | 3.52 | 3.45 |
| | lm/W | 1.58 | 0.24* | 1.53 | 1.45 | 0.25* | 1.42 | 1.26 |
| | x mean | 0.249 | 0.246 | 0.247 | 0.246 | 0.251 | 0.250 | 0.248 |
| | y mean | 0.648 | 0.634 | 0.641 | 0.637 | 0.653 | 0.655 | 0.658 |

\* Denotes bad contact to pixel during measurement

LIGHT-EMITTING DEVICES AND DISPLAYS WITH IMPROVED PERFORMANCE

This application is a continuation of commonly owned PCT Application No. PCT/US2007/013152 filed 4 Jun. 2007, which was published in the English language as PCT Publication No. WO 2007/143197 on 13 Dec. 2007. The PCT Application claims priority from commonly owned U.S. Patent Application Nos. 60/810,767 filed 2 Jun. 2006, 60/810,914 filed 5 Jun. 2006, 60/804,921 filed 15 Jun. 2006, 60/825,373 filed 12 Sep. 2006, 60/825,374 filed 12 Sep. 2006, 60/825,370 filed 12 Sep. 2006, and 60/886,261 filed 23 Jan. 2007. The disclosures of each of the above-listed applications are hereby incorporated herein by reference in their entireties.

TECHNICAL FIELD

The present invention relates to the field of light-emitting devices including semiconductor nanocrystals and to displays including light-emitting devices including semiconductor nanocrystals.

BACKGROUND OF THE INVENTION

Light-emitting devices can be used to provide illumination. Light emitting devices also can be included, for example, in displays (e.g., flat-panel displays), screens (e.g., computer screens), and other items that require illumination. Accordingly, increases in the efficiency of a light-emitting device and displays are desirable.

SUMMARY OF THE INVENTION

One aspect of the present invention is directed to a light-emitting device comprising a first electrode opposite a second electrode, and an emissive material disposed between the electrodes, the emissive material comprising a plurality of semiconductor nanocrystals, wherein the device has a peak external quantum efficiency of at least about 2.2 percent. Preferably, the device has a peak external quantum efficiency of at least about 2.5 percent. More preferably, the device has a peak external quantum efficiency of at least about 3.0 percent. Yet more preferably, the device has a peak external quantum efficiency of at least about 3.5 percent. Yet more preferably, the device has a peak external quantum efficiency of at least about 4.0 percent. Most preferably, the device has a peak external quantum efficiency of at least about 4.5 percent.

In certain embodiments of the light-emitting device of the present invention, the device emits light with a luminescent efficiency of at least about 3.7 cd/A. In certain embodiments of the light-emitting device of the present invention, the device emits light with a luminescent efficiency of at least about 2.7 lumens per watt.

In certain embodiments of the light-emitting device of the present invention, the device may further include a layer comprising a material capable of transporting charge disposed between the electrodes. In certain embodiments of the light-emitting device of the present invention, the device includes a layer comprising a matrix, a first electrode adjacent to the layer, a second electrode opposed to the first electrode, and an emissive material comprising a plurality of semiconductor nanocrystal disposed between the electrodes.

In certain embodiments of the light-emitting device of the present invention, the device includes a substrate, an anode disposed on the substrate, a hole injection layer disposed over the substrate, a material capable of transporting holes disposed over the hole injection layer, a material capable of blocking holes disposed over the material capable of transporting holes, a material capable of transporting electrons disposed over the material capable of blocking holes, a cathode disposed over the material capable of transporting electrons; and an emissive material comprising a plurality of semiconductor nanocrystals disposed between the anode and the cathode. In an alternative embodiment, the device includes a substrate, a cathode disposed on the substrate, a material capable of transporting electrons disposed over the cathode, a material capable of blocking holes disposed over the material capable of transporting electrons, a material capable of transporting holes disposed over the material capable of blocking holes, a hole injection layer disposed over the material capable of transporting holes, an anode disposed over the hole injection layer, and an emissive material comprising a plurality of semiconductor nanocrystals disposed between the cathode and the anode.

Another aspect of the present invention is directed to a display including at least one light-emitting device including an emissive material comprising a plurality of semiconductor nanocrystals disposed between a first electrode, and a second electrode, wherein the at least one light-emitting device has a peak external quantum efficiency of at least about 2.2%. Preferably, the display includes at least one light-emitting device having a peak external quantum efficiency of at least about 2.5 percent. More preferably, the display includes at least one light-emitting device having a peak external quantum efficiency of at least about 3.0 percent. Yet more preferably, the display includes at least one light-emitting device having a peak external quantum efficiency of at least about 3.5 percent. Yet more preferably, the display includes at least one light-emitting device having a peak external quantum efficiency of at least about 4.0 percent. Most preferably, the display includes at least one light-emitting device having a peak external quantum efficiency of at least about 4.5 percent.

Yet another aspect of the present invention is directed to a display comprising an array of light-emitting devices, wherein at least one of the light-emitting devices comprises a plurality of semiconductor nanocrystals and has a peak external quantum efficiency of at least about 2.2%. Preferably, the peak external quantum efficiency is at least about 2.5%. More preferably, the peak external quantum efficiency is at least about 3.0%. Yet more preferably, the peak external quantum efficiency is at least about 3.5%. Most preferably, the peak external quantum efficiency is at least about 4.0%. Most preferably, the device has a peak external quantum efficiency of at least about 4.5 percent.

A further aspect of the present invention is directed to a light-emitting device including a first electrode opposite a second electrode, and an emissive material disposed between the electrodes, the emissive material comprising a plurality of semiconductor nanocrystals, wherein the device emits light having a CIE color coordinate of x greater than 0.63. Preferably, the device emits light having a CIE color coordinate of x greater than 0.65.

A still further aspect of the present invention is directed to a display including at least one light-emitting device including a first electrode opposite a second electrode, and an emissive material disposed between the electrodes, the emissive material comprising a plurality of semiconductor nanocrystals, wherein the device emits light having a CIE color coordinate of x greater than 0.63. Preferably, the device emits light having a CIE color coordinate of x greater than 0.65.

Another aspect of the present invention is directed to a light-emitting device comprising a first electrode opposite a second electrode, and an emissive material disposed between the electrodes, the emissive material comprising a plurality of semiconductor nanocrystals, wherein the device has an external quantum efficiency of at least about 2.2 percent when measured at a current density of 5 mA/cm². Preferably, the device has an external efficiency of at least about 2.5 percent when measured at a current density of 5 mA/cm². More preferably, the device has an external efficiency of at least about 3.0 percent when measured at a current density of 5 mA/cm². Most preferably, the device has an external efficiency of at least about 3.5 percent when measured at a current density of 5 mA/cm². In certain embodiments of the light-emitting device of the present invention, the device may further include a layer comprising a material capable of transporting charge disposed between the electrodes.

Yet another aspect of the present invention is directed to a light-emitting device comprising a first electrode opposite a second electrode, and an emissive material disposed between the electrodes, the emissive material comprising a plurality of semiconductor nanocrystals capable of emitting red light upon excitation, wherein the device has a peak luminescent efficiency of at least about 1.5 lumens per watt.

Yet another aspect of the present invention is directed to a display including at least one light-emitting device comprising: a first electrode opposite a second electrode, and an emissive material disposed between the electrodes, the emissive material comprising a plurality of semiconductor nanocrystals capable of emitting red light upon excitation, wherein the device has a peak luminescent efficiency of at least about 1.5 lumens per watt.

Yet another aspect of the present invention is directed to a light-emitting device comprising a first electrode opposite a second electrode, and an emissive material disposed between the electrodes, the emissive material comprising a plurality of semiconductor nanocrystals capable of emitting red light upon excitation, wherein the device has a luminescent efficiency of at least about 1.5 lumens per watt when measured at a current density of 5 milliamps/square centimeter.

Yet another aspect of the present invention is directed to a display including at least one light-emitting device comprising: a first electrode opposite a second electrode, and an emissive material disposed between the electrodes, the emissive material comprising a plurality of semiconductor nanocrystals capable of emitting red light upon excitation, wherein the device has a luminescent efficiency of at least about 1.5 lumens per watt when measured at a current density of 5 milliamps/square centimeter.

Yet another aspect of the present invention is directed to a light-emitting device comprising: a first electrode opposite a second electrode, and an emissive material disposed between the electrodes, the emissive material comprising a plurality of semiconductor nanocrystals capable of emitting green light upon excitation, wherein the device has a peak external quantum efficiency of at least about 1.1 percent. Preferably, the device has a peak external quantum efficiency of at least about 1.5 percent. More preferably, the device has a peak external quantum efficiency of at least about 2.0 percent. Yet more preferably, the device has a peak external quantum efficiency of at least about 2.5 percent. Most preferably, the device has a peak external quantum efficiency of at least about 2.8 percent.

Yet another aspect of the present invention is directed to a display including at least one light-emitting device comprising: a first electrode opposite a second electrode, and an emissive material disposed between the electrodes, the emissive material comprising a plurality of semiconductor nanocrystals capable of emitting green light upon excitation, wherein the device has a peak external quantum efficiency of at least about 1.1 percent. Preferably, the device has a peak external quantum efficiency of at least about 1.5 percent. More preferably, the device has a peak external quantum efficiency of at least about 2.0 percent. Yet more preferably, the device has a peak external quantum efficiency of at least about 2.5 percent. Most preferably, the device has a peak external quantum efficiency of at least about 2.8 percent.

Yet another aspect of the present invention is directed to a light-emitting device comprising a first electrode opposite a second electrode, and an emissive material disposed between the electrodes, the emissive material comprising a plurality of semiconductor nanocrystals, wherein the device has a luminescent efficiency of at least about 3 lumens per watt when measured at a current density of 5 mA/cm².

Yet another aspect of the present invention is directed to a display including at least one light-emitting device comprising a first electrode opposite a second electrode, and an emissive material disposed between the electrodes, the emissive material comprising a plurality of semiconductor nanocrystals, wherein the device has a luminescent efficiency of at least about 3 lumens per watt when measured at a current density of 5 mA/cm².

Yet another aspect of the present invention is directed to a light-emitting device comprising a first electrode opposite a second electrode, and an emissive material disposed between the electrodes, the emissive material comprising a plurality of semiconductor nanocrystals capable of emitting green light upon excitation, wherein the device has an external quantum efficiency of at least about 2% when measured at a current density of 5 mA/cm². In certain embodiments, at least a portion of the semiconductor nanocrystals include a core comprising CdZnSe and a shell on at least a portion of a surface of the core, the shell comprising CdZnS.

Yet another aspect of the present invention is directed to a display including at least one light-emitting device comprising a first electrode opposite a second electrode, and an emissive material disposed between the electrodes, the emissive material comprising a plurality of semiconductor nanocrystals capable of emitting green light upon excitation, wherein the device has an external quantum efficiency of at least about 2% when measured at a current density of 5 mA/cm².

Yet another aspect of the present invention is directed to a light-emitting device comprising a first electrode, a second electrode opposed to the first electrode, and a layer comprising a material capable of transporting charge disposed between the electrodes, an emissive material comprising a plurality of semiconductor nanocrystals capable of emitting green light upon excitation disposed between the first electrode and the second electrode, wherein the device has a luminescent efficiency of at least about 4 lumens per watt when measured at a current density of 5 mA/cm².

Yet another aspect of the present invention is directed to a display including at least one light-emitting device comprising a first electrode, a second electrode opposed to the first electrode, and a layer comprising a material capable of transporting charge disposed between the electrodes, an emissive material comprising a plurality of semiconductor nanocrystals capable of emitting green light upon excitation disposed between the first electrode and the second electrode, wherein the device has a luminescent efficiency of at least about 4 lumens per watt when measured at a current density of 5 mA/cm².

Yet another aspect of the present invention is directed to a light-emitting device comprising a layer comprising a matrix, a first electrode adjacent to the layer, a second electrode opposed to the first electrode, and an emissive material comprising a plurality of semiconductor nanocrystals capable of emitting green light upon excitation disposed between the first electrode and the second electrode, wherein the device has a peak external quantum efficiency of at least about 1.1 percent. In certain embodiments, the semiconductor nanocrystals are included in the matrix. In certain embodiments of the light-emitting device of the present invention, the device includes a substrate, an anode disposed on the substrate, a hole injection layer disposed over the substrate, a material capable of transporting holes disposed over the hole injection layer, a material capable of blocking holes disposed over the material capable of transporting holes, a material capable of transporting electrons disposed over the material capable of blocking holes, a cathode disposed over the material capable of transporting electrons; and an emissive material comprising a plurality of semiconductor nanocrystals disposed between the anode and the cathode. In an alternative embodiment, the device includes a substrate, a cathode disposed on the substrate, a material capable of transporting electrons disposed over the cathode, a material capable of blocking holes disposed over the material capable of transporting electrons, a material capable of transporting holes disposed over the material capable of blocking holes, a hole injection layer disposed over the material capable of transporting holes, an anode disposed over the hole injection layer, and an emissive material comprising a plurality of semiconductor nanocrystals disposed between the cathode and the anode.

Yet another aspect of the present invention is directed to a display including at least one light-emitting device comprising a layer comprising a matrix, a first electrode adjacent to the layer, a second electrode opposed to the first electrode, and an emissive material comprising a plurality of semiconductor nanocrystals capable of emitting green light upon excitation disposed between the first electrode and the second electrode, wherein the device has a peak external quantum efficiency of at least about 1.1 percent.

Yet another aspect of the present invention is directed to a light-emitting device comprising: a first electrode opposite a second electrode, and an emissive material disposed between the electrodes, the emissive material comprising a plurality of semiconductor nanocrystals capable of emitting green light upon excitation, wherein the device has a peak luminescent efficiency of at least about 7.1 lumens per watt. In certain embodiments, a device emits light with a peak emission at a wavelength in a range of from about 520 nm to about 550 nm. In certain embodiments, the device further includes a layer comprising a material capable of transporting charge disposed between the electrodes. In certain embodiments, a layer comprising a matrix disposed between the first electrode and the second electrode.

Yet another aspect of the present invention is directed to a display including at least one light-emitting device including an emissive material comprising a plurality of semiconductor nanocrystals capable of emitting green light upon excitation disposed between a first electrode, and a second electrode, wherein the at least one light-emitting device has a luminescent efficiency of at least about 7.1 lumens per watt. In certain embodiments, at least one light-emitting device has a peak emission at a wavelength in a range of from about 520 nm to about 550 nm.

In each of the various aspects and embodiments of the present invention directed to a light-emitting device of the present invention or a display of the present invention including a light-emitting device, the semiconductor nanocrystals can be included in the device in a predetermined arrangement at a thickness of three or less monolayers. In certain embodiments, the semiconductor nanocrystals can be included in the device in a predetermined arrangement at a thickness of two or less monolayers. In certain embodiments, the semiconductor nanocrystals can be included in the device in a predetermined arrangement at a thickness of about one monolayer. In certain embodiments, the emissive material can be disposed as monolayer.

In each of the various aspects and embodiments of the present invention directed to a light-emitting device of the present invention or a display of the present invention including a light-emitting device, at least a portion of the semiconductor nanocrystals can include a core including a first semiconductor material and a shell overcoating the core, the shell comprising a second semiconductor material. In these aspects and embodiments, at least a portion of the semiconductor nanocrystals can include a ligand attached to the surface thereof. In these aspects and embodiments, at least a portion of the semiconductor nanocrystals can include a core including a first semiconductor material and a shell overcoating the core, the shell comprising a second semiconductor material and wherein the core comprises a Group II-VI compound, Group II-V compound, Group III-VI compound, Group III-V compound, Group IV-VI compound, Group I-III-VI compound, Group II-IV-VI compound, or Group II-IV-V compound, Group IV element, an alloy including any of the foregoing, and/or a mixture including any of the foregoing. In these aspects and embodiments, at least a portion of the semiconductor nanocrystals can include a core including a first semiconductor material and a shell overcoating the core, the shell comprising a second semiconductor material and wherein the shell comprises a Group II-VI compound, Group II-V compound, Group III-VI compound, Group III-V compound, Group IV-VI compound, Group I-III-VI compound, Group II-IV-VI compound, or Group II-IV-V compound, Group IV element, an alloy including any of the foregoing, and/or a mixture including any of the foregoing. In these aspects and embodiments, the semiconductor nanocrystals when excited in solution can emit light with a quantum efficiency of at least about 10%. In these aspects and embodiments, the semiconductor nanocrystals when excited in solution can emit light with a quantum efficiency of at least about 20%. In these aspects and embodiments, the semiconductor nanocrystals when excited in solution can emit light with a quantum efficiency of at least about 30%. In these aspects and embodiments, the semiconductor nanocrystals when excited in solution can emit light with a quantum efficiency of at least about 40%. In these aspects and embodiments, the semiconductor nanocrystals when excited in solution can emit light with a quantum efficiency of at least about 50%. In these aspects and embodiments, the semiconductor nanocrystals when excited in solution can emit light with a quantum efficiency of at least about 60%. In these aspects and embodiments, the semiconductor nanocrystals when excited in solution can emit light with a quantum efficiency of at least about 70%. In these aspects and embodiments, the semiconductor nanocrystals when excited in solution can emit light with a quantum efficiency of at least about 80%. In these aspects and embodiments, the device can be capable of emitting light with a full width at half maximum of not more than 50 nm. In these aspects and embodiments, the device can be capable of emitting light with a full width at half maximum of not more than 40 nm. In these aspects and embodiments, the device can be capable of emitting light with a full width at half maximum of not more than 30 nm. In these aspects and embodiments, the device can be capable of emitting light with a full width at half maximum of not more than 20 nm. In certain embodiments, semiconductor nanocrystals can be included within a layer of the device. In certain embodiments, semiconductor nanocrystals can be disposed as a layer between other layers of the device.

In each of the various aspects and embodiments of the present invention directed to a light-emitting device of the present invention or a display of the present invention including a light-emitting device, the device can further include a material capable of transporting charge. In certain embodiments, the material capable of transporting charge can include a material capable of transporting holes. In certain embodiments, the material capable of transporting charge can include a material capable of transporting electrons. In certain embodiments, the material capable of transporting charge can include a material capable of transporting holes and electrons.

Certain preferred materials capable of transporting charge that can be included in certain embodiments of light-emitting devices and/or displays of the present invention include, but are not limited to, spiro-TPD, LT-N820, LT-N821, TPBi, and Alq3.

In each of the various aspects and embodiments of the present invention directed to a display, the display can further include one or more additional light-emitting devices wherein each of the devices includes a different emissive material. In certain embodiments, each of the different emissive materials can comprise a plurality of semiconductor nanocrystals that emit light with an emission wavelength that is distinguishable from that of the semiconductor nanocrystals including in each of the other different emissive materials. In certain embodiments, the emission wavelengths of each of the different semiconductor nanocrystals can be selected from an ultraviolet, red, orange, yellow, green, blue-green, blue, violet, other visible, or infrared emission wavelength, or a combination thereof. In certain embodiments including more than one light-emitting device, the devices can be disposed in the display in a predetermined arrangement. In these embodiments of the display of the present invention, the light-emitting devices are disposed in the display in a predetermined arrangement comprising a pattern including a feature with a dimension of less than 1 millimeter.

Yet another aspect of the present invention is directed to a light-emitting device comprising: a first electrode opposite a second electrode, and an emissive material disposed between the electrodes, the emissive material comprising a plurality of semiconductor nanocrystals, wherein the device is capable of emitting light with a brightness of at least 100 nits when driven at a voltage less than or equal to 4 volts. In certain embodiments, the emissive material comprises a printed layer of semiconductor nanocrystals.

Yet another aspect of the present invention is directed to a method for purifying semiconductor nanocrystals comprising isolating the semiconductor nanocrystals from their growth medium in an environment which includes less than 10 ppm water and less than 10 ppm oxygen. Preferably, the environment includes less than 1 ppm water and less than 1 ppm oxygen. Yet more preferably, the environment includes less than 0.1 ppm water and less than 0.1 ppm oxygen. Most preferably, the method further includes use of anhydrous liquids. In certain embodiments, the semiconductor nanocrystals further comprise an overcoating on at least a portion of an outer surface thereof.

Another aspect of the present invention is directed to a semiconductor nanocrystal purified in accordance with this method.

Yet another aspect of the present invention is directed to a method for preparing nanocrystals comprising a semiconductor material, the method comprising heating a mixture comprising a liquid medium and semiconductor material precursors in the presence of equimolar amounts of a first ligand compound including an amine group and a second ligand compound including an acid group, the equimolar amount being determined based on the amine group content of the first ligand compound and the acid group content of the second ligand compound. In certain embodiments, the first ligand compound is represented by the formula X-L, wherein X is the acid group and L comprises an aryl group, a heteroaryl group, or a straight or branched C2-18 hydrocarbon chain. In certain embodiments, the second ligand compound is represented by the formula Y-L, wherein Y is the amine group and L comprises an aryl group, a heteroaryl group, or a straight or branched C2-18 hydrocarbon chain. In certain embodiments, the hydrocarbon chain includes at least one double bond, at least one triple bond, or at least one double bond and one triple bond. IN certain embodiments, the hydrocarbon chain is interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—, wherein each of Ra and Rb, independently, is hydrogen, alkyl, alkenyl, alkynyl, alkoxy, hydroxylalkyl, hydroxyl, or haloalkyl. In certain embodiments, the aryl group is a substituted or unsubstituted cyclic aromatic group. In certain embodiments, the aryl group includes phenyl, benzyl, naphthyl, tolyl, anthracyl, nitrophenyl, or halophenyl. In certain embodiments, the heteroaryl group comprises an aryl group with one or more heteroatoms in the ring, for instance furyl, pyridyl, pyrrolyl, phenanthryl. In certain embodiments, X comprises a phosphinic acid group or a carboxylic acid group. In certain embodiments, X comprises an oleic acid group or a myristic acid group. In certain preferred embodiments, X comprises a phosphonic acid group.

Another aspect of the present invention is directed to a semiconductor nanocrystal prepared in accordance with this method.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

BRIEF DESCRIPTION OF THE DRAWINGS

In the drawings:

FIGS. 3-12 provide data for a number of different pixels (individual light-emitting devices) (designated as, e.g., B1, B2, B3, B4, C1, C2, or D1 (corresponding to their respective location on the test device coupon (see FIG. 23))) included on test device coupons of the examples. The data includes current in the sensing photodetector (L), voltage (V), external quantum efficiency (EQE), Candelas/m2 (L CS200 (measured by a calibrated L CS200 instrument)), peak emission wavelength (PW), full width of the peak at half maximum (FWHM), candelas/amp (cd/A), and lumens/watt (lm/W) for each of the designated pixels at a current density of 5 mA/cm2 and at 20 mA/cm2.

FIGS. 24 and 25 provide data for different pixels (individual light-emitting devices) (designated as B1, B2, B3, B4, C1, C2, or D1 (corresponding to their respective location on the test device coupon (see FIG. 23))) included on test device coupons of the examples. The data includes current in the sensing photodetector (L), voltage (V), external quantum efficiency (EQE), Candelas/m2 (L CS200 (measured by a calibrated L CS200 instrument)), peak emission wavelength (PW), full width of the peak at half maximum (FWHM), candelas/amp (cd/A), and lumens/watt (1 lm/W) for each of the designated pixels at a current density of 5 mA/cm2 and at 20 mA/cm2.

Figure 1:
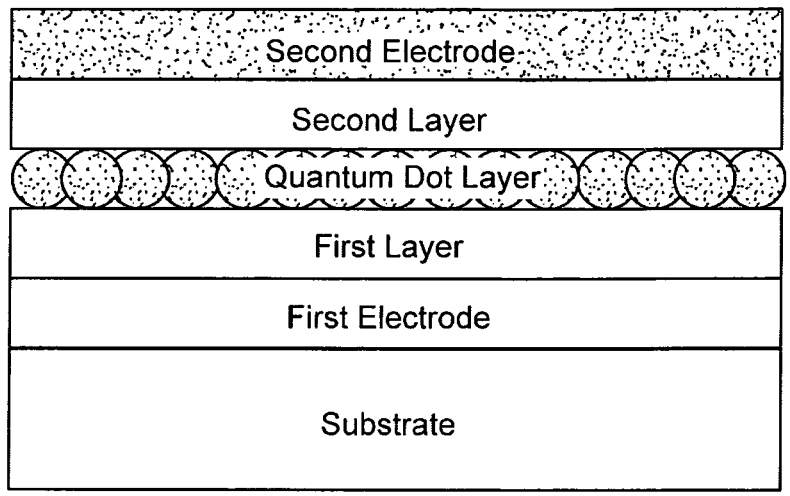
FIG. 1 is schematic drawing depicting a light-emitting device.

The attached figures are simplified representations presented for purposes of illustration only; the actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

The invention relates to light-emitting devices and displays with improved performance.

A light-emitting device in accordance with one aspect of the present invention can have a peak external quantum efficiency of at least about 2.2%. In certain embodiments, the light-emitting device can have a peak external quantum efficiency of at least about 2.5%. In certain other embodiments, the light-emitting device can have a peak external quantum efficiency of at least about 3.0%. In certain other embodiments, the light-emitting device can have a peak external quantum efficiency of at least about 3.5%. In certain other embodiments, the light-emitting device can have a peak external quantum efficiency of at least about 4.0%.

In certain other embodiments, the light-emitting device can have an external quantum efficiency of at least about 2.2% when measured at a current density of 5 mA/cm$^2$, or at least about 2.5, when measured at a current density of 5 mA/cm$^2$, or at least about 3% when measured at a current density of 5 mA/cm$^2$.

In certain embodiments, for example, a light-emitting device comprises an emissive material disposed between a first electrode and a second electrode wherein the emissive material comprises semiconductor nanocrystals capable of emitting red light upon excitation. In certain embodiments, the emissive material comprises semiconductor nanocrystals capable of emitting red light having a peak emission at a wavelength in the range from about 590 nm to about 630 nm upon excitation.

In accordance with another aspect of the invention, a light-emitting device comprises an emissive material disposed between a first electrode and a second electrode wherein the emissive material comprises semiconductor nanocrystals capable of emitting green light upon excitation can have a luminescent efficiency of at least about 3 lumens per watt. In certain embodiments, the device can have a luminescent efficiency of at least about 7.1 lumens per watt. In certain other embodiments, the green light-emitting device can have an external quantum efficiency of at least about 1.0% when measured at a current density of 5 mA/cm$^2$, or at least about 1.5%, when measured at a current density of 5 mA/cm$^2$, or at least about 1.8% when measured at a current density of 5 mA/cm$^2$. In certain other embodiments, the green light-emitting device can have a peak external quantum efficiency of at least about 1.5%, or at least about 2.0%, or at least about 2.5%, or at least about 2.8%.

In accordance with another aspect of the present invention, there is provided a display including at least one light-emitting device including an emissive material disposed between a first electrode and a second electrode. The emissive material comprises semiconductor nanocrystals capable of emitting green light upon excitation. The light-emitting device can have a luminescent efficiency of at least about 3 lumens per watt. In certain embodiments, the light-emitting device can have a luminescent efficiency of at least about 7.1 lumens per watt. In certain embodiments, the at least one light-emitting device can further include at least one layer comprising a material capable of transporting charge. In certain other embodiments, the emissive material can be disposed as one or more separate layers. In certain other embodiments, the emissive material can be included in a layer comprising a matrix material disposed between the two electrodes. In certain embodiments, for example, the light-emitting device can have a peak emission at a wavelength in the range from about 520 nm to about 550 nm.

As used herein, "external quantum efficiency" (EQE) is the ratio of emitted light intensity to current flow (e.g., photons out/electrons in). EQE is described in more detail, including examples of how it is measured, in S. R. Forrest, D. D. C. Bradley, M. E. Thompson, "Measuring the Efficiency of Organic Light-Emitting Devices", Advanced Materials, Volume 15. Issue 13, Pages 1043-1048 (2003 WILEY-VCH Verlag GmbH & Co. KGaA, Weinheim), which is hereby incorporated herein by reference in its entirety.

As used herein "peak external quantum efficiency" refers to the maximum measurable or recordable external quantum efficiency when plotted as current density vs. external quantum efficiency.

An example of an embodiment of a light-emitting device is shown in FIG. 1. The depicted example includes a first electrode disposed over a substrate, a first layer in electrical connection with the first electrode, a second layer in electrical connection with the first layer, and a second electrode in electrical connection with the second layer. The first layer can comprise a material capable of transporting holes (HTL) and the second layer can comprise a material capable of transporting electrons (ETL). At least one layer can be non-polymeric. An emissive material is included between the two electrodes. The emissive material can include a plurality of semiconductor nanocrystals that can be selected based upon their light-emissive characteristics (e.g., the wavelength of the photon emitted by the nanocrystal when voltage is applied across the device). The emissive material can be included as one or more layers (as shown in FIG. 1) between the first layer and the second layer. A layer including an emissive material comprising a plurality of semiconductor nanocrystals can be a monolayer of semiconductor nanocrystals. Alternatively, the emissive material can be included in the first layer and/or second layer. In the embodiment depicted in FIG. 1 the first electrode of the structure is in contact with the substrate. Each electrode can be connected to a power supply to provide a voltage across the structure. Electroluminescence can be produced by the semiconductor nanocrystals included in the device when a voltage of proper polarity is applied across the heterostructure.

As described above, in certain embodiments, the first layer and/or the second layer can include an emissive material comprising a plurality of semiconductor nanocrystals, for example, a substantially monodisperse population of nanocrystals. Light emitting devices including an emissive material comprising a plurality of semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. No. 10/400,907, filed Mar. 28, 2003, and U.S. Patent Application Publication No. 2004/0023010, each of which is incorporated by reference in its entirety). This phase separation technique can reproducibly place a monolayer of semiconductor nanocrystals between an organic semiconductor HTL and ETL, thereby effectively exploiting the favorable light emission properties of semiconductor nanocrystals, while minimizing their impact on electrical performance.

Making a light-emitting device by this technique can be limited by impurities in the solvent, by the necessity to use organic semiconductor molecules that are soluble in the same solvents as the semiconductor nanocrystals. The phase separation technique can be unsuitable for depositing a monolayer of semiconductor nanocrystals on top of both a HTL and a HIL, (due to the solvent destroying the underlying organic thin film). The phase separation method can also be unsuitable for controlling the location of semiconductor nanocrystals that emit different colors on the same substrate and for patterning of the different color emitting nanocrystals on that same substrate.

The device structure depicted in FIG. 1 may be fabricated as follows. A substrate having a first electrode (e.g., an anode) disposed thereon may be obtained or fabricated using any suitable technique. The first electrode may be patterned. A first layer (e.g., comprising a material capable of transporting holes) may be deposited using any suitable technique. An emissive layer can be deposited by spin-casting, drop-casting, Langmuir-Blodgett techniques, contact printing or other techniques known or readily identified by one skilled in the relevant art. A second layer (e.g., comprising a material capable of transporting electrons) may be deposited using any suitable technique. A second electrode (e.g., a cathode) may be deposited using any suitable technique.

In the example shown in FIG. 1, light is emitted from the bottom of the structure. If an adequately light transmissive top electrode is used, the structure could emit light from the top of the structure.

Alternatively, the structure of FIG. 1 can be inverted, in which case light can be emitted from the top.

In certain embodiments in which the substrate and all other device materials are transparent, the light-emitting device can be transparent.

The simple layered structure illustrated in FIG. 1 is provided by way of non-limiting example, and it is understood that embodiments of the invention may be used in connection with a wide variety of other structures. The specific materials and structures described herein are exemplary in nature, and other materials and structures may be used. Functional light-emitting devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Optionally, one or more of the layers can be patterned. For example, patterned layers (other than the emissive layer) can be deposited by vapor deposition using shadow masks or other masking techniques.

Figure 2:
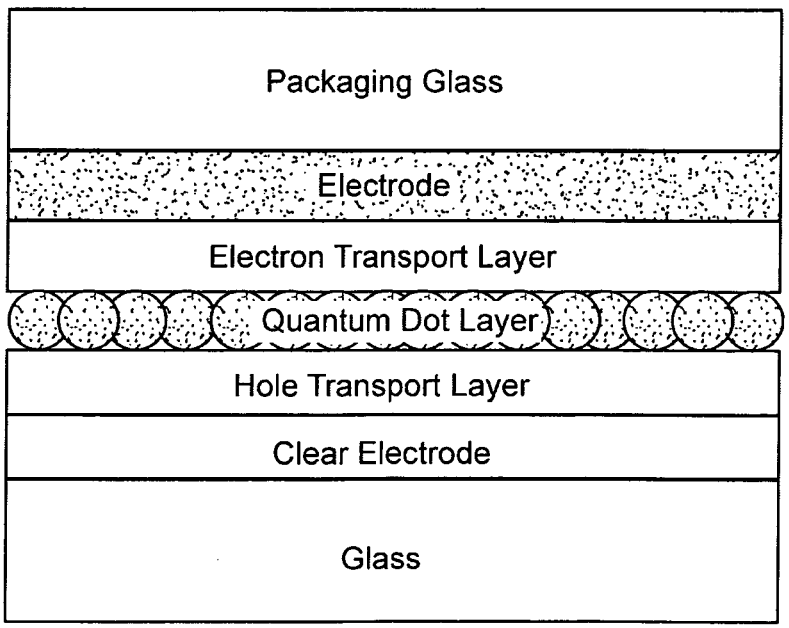
FIG. 2 is schematic drawing depicting a light-emitting device.
Figure 13:
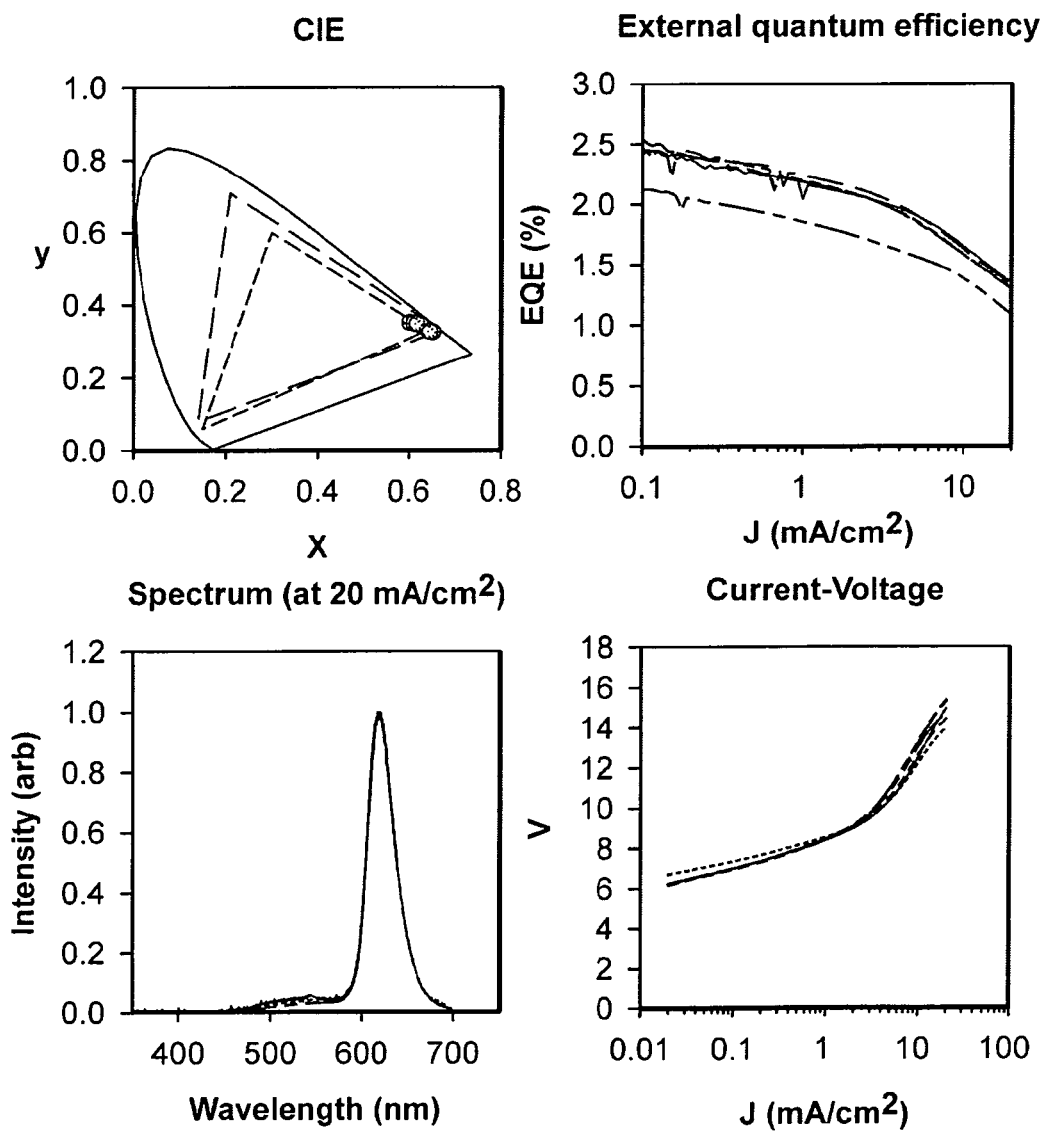
FIGS. 13-22 depict graphical representations of CIE coordinates, current density versus external quantum efficiency, emission wavelength versus intensity; and current density versus voltage for the different pixels (individual light-emitting devices) included on test device coupons of the examples.
Figure 14:
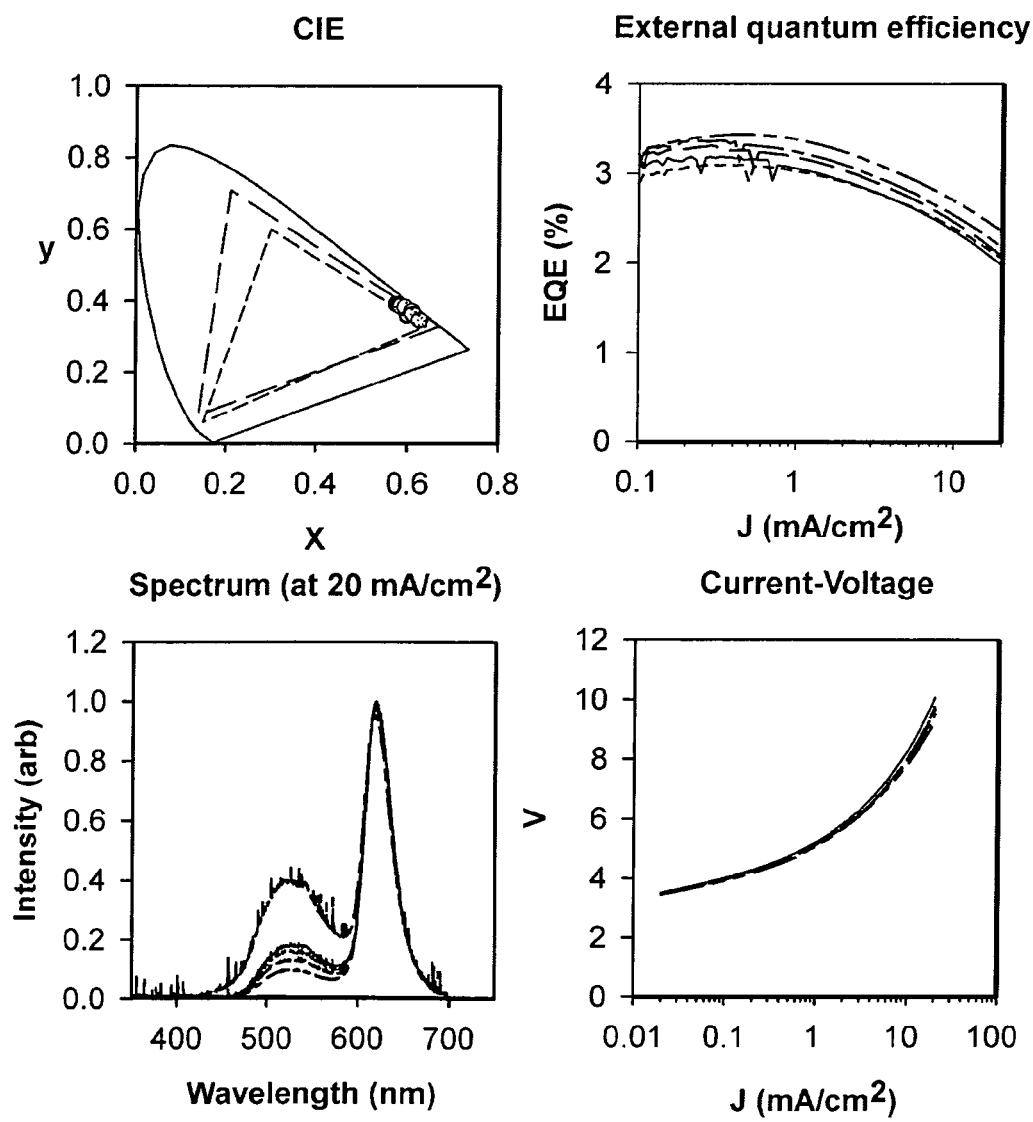
Figure 15:
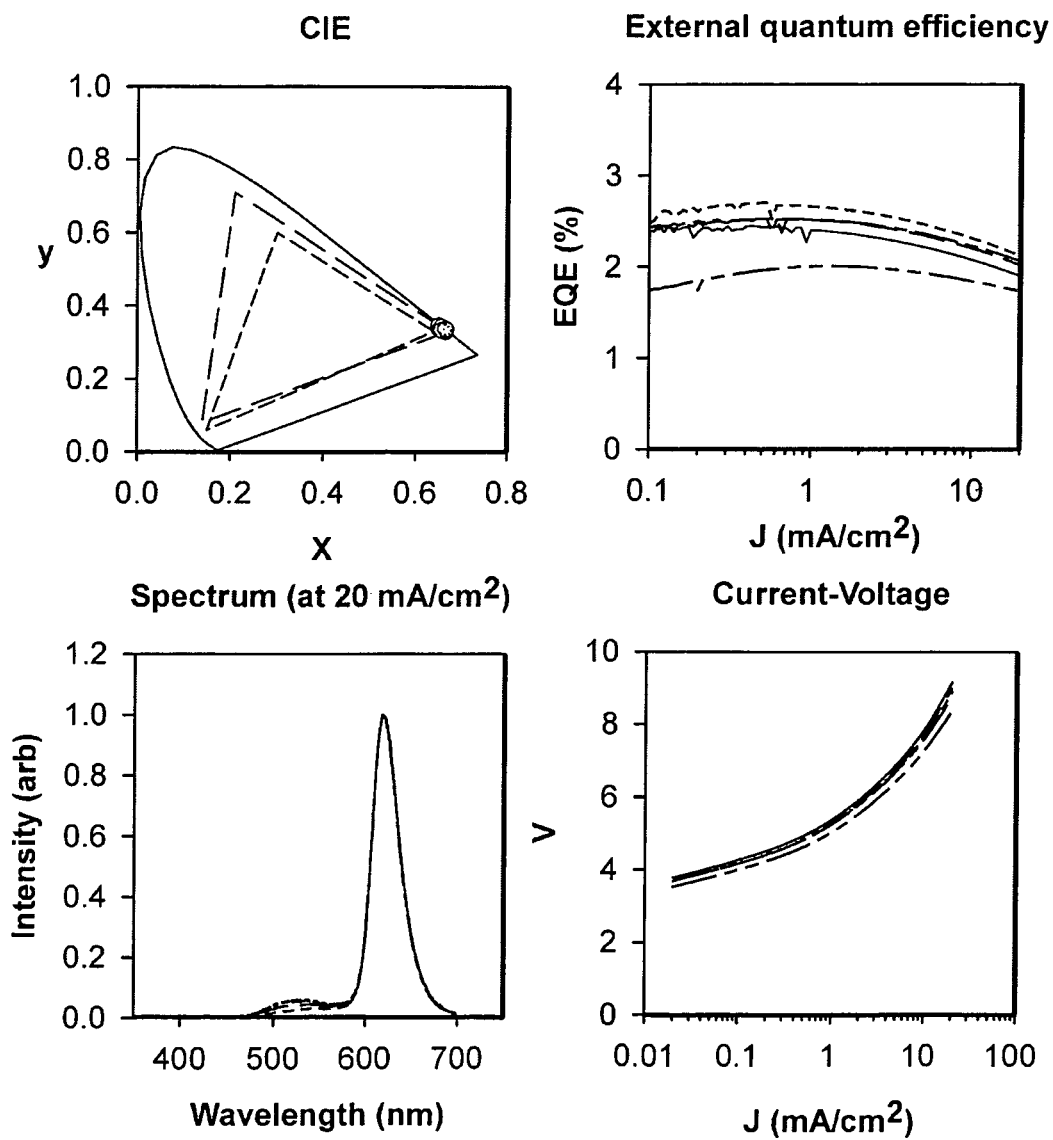
Figure 16:
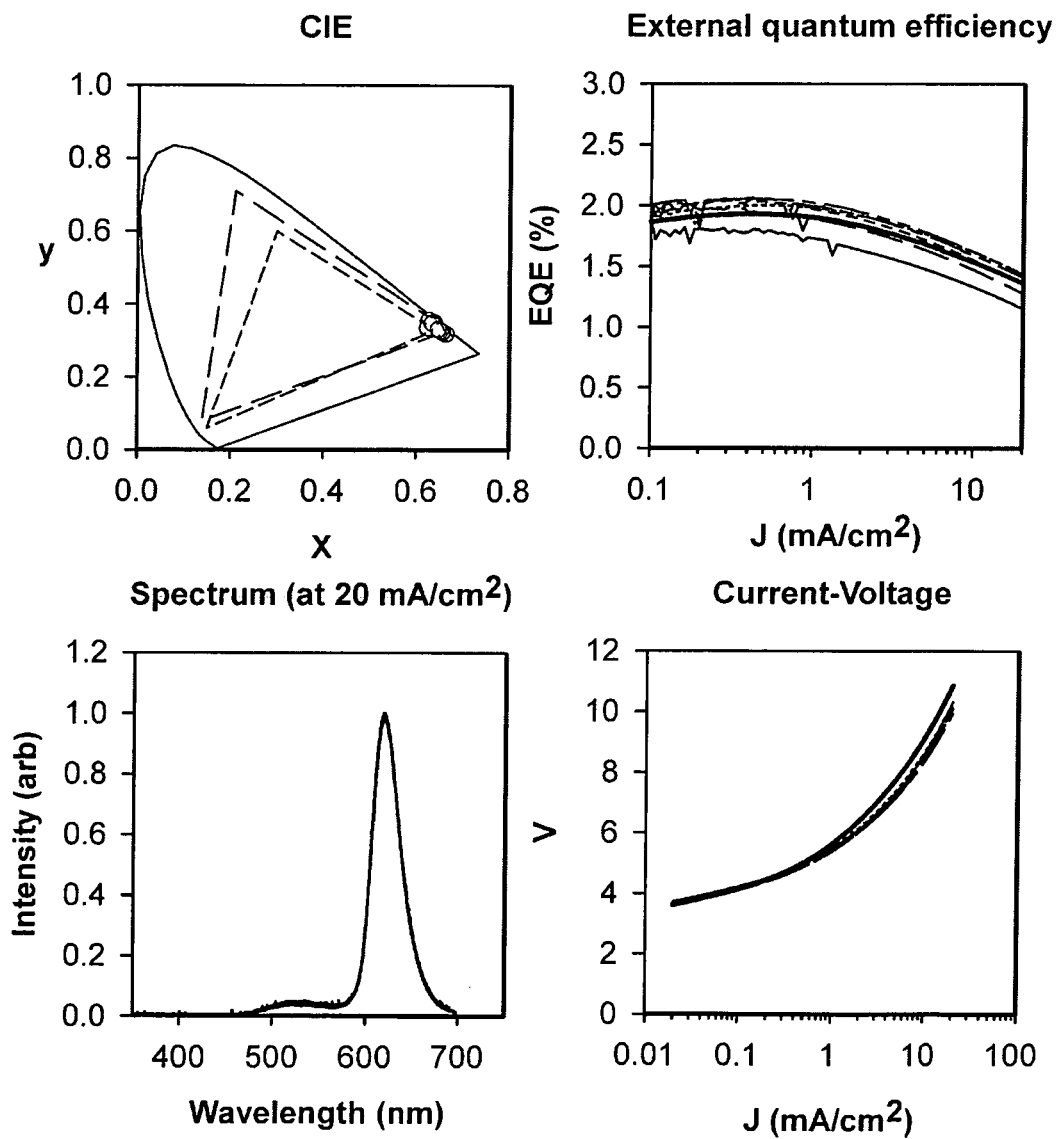
Figure 17:
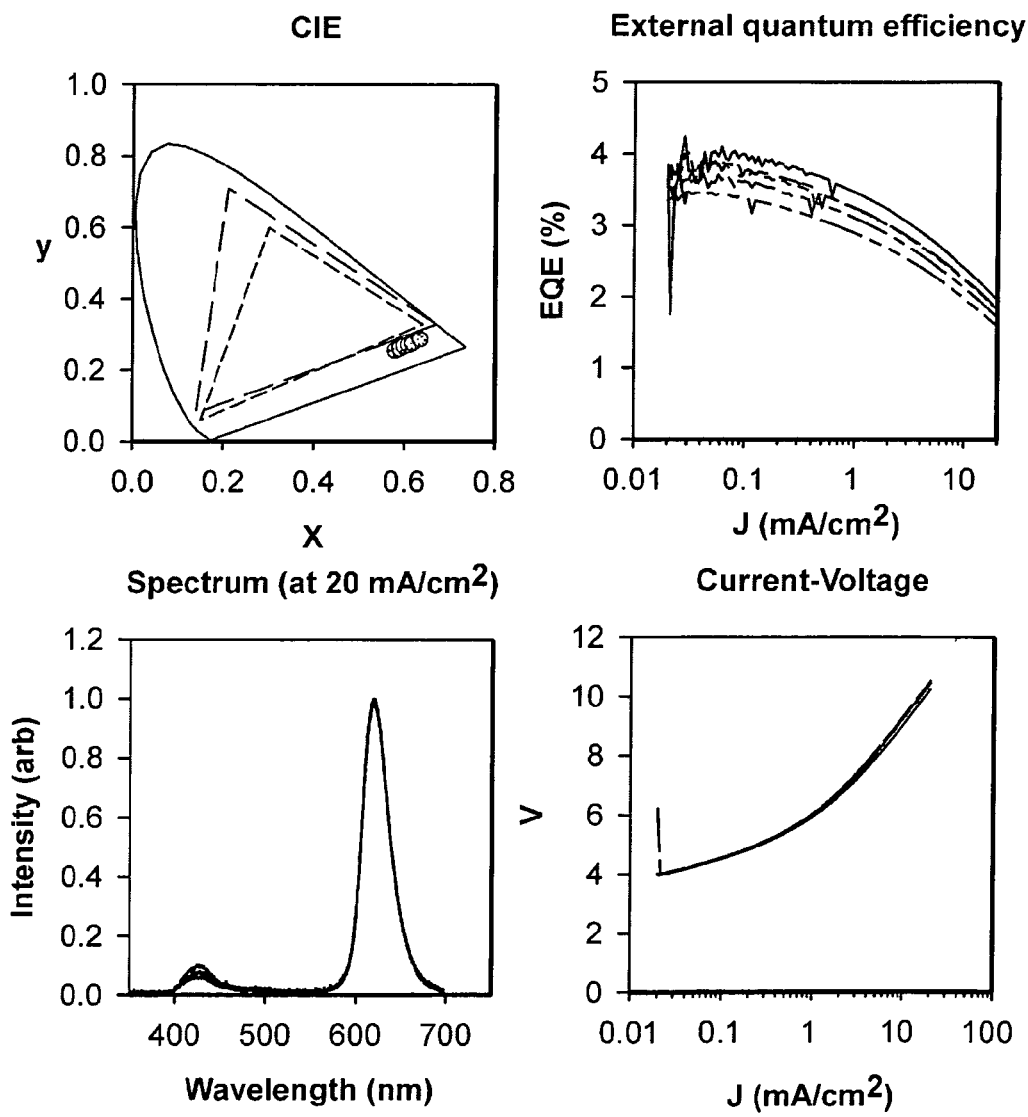
Figure 18:
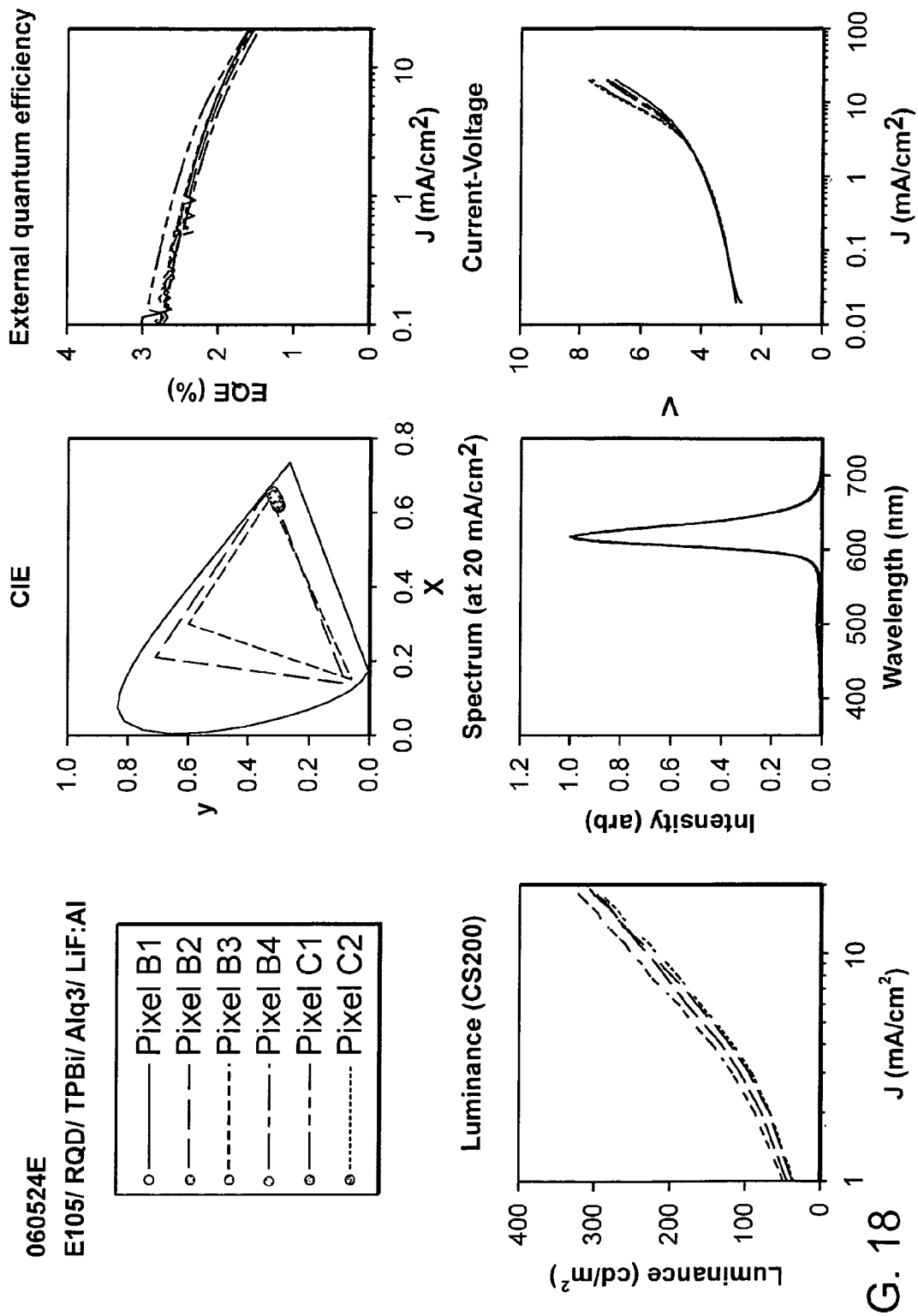
Figure 19:
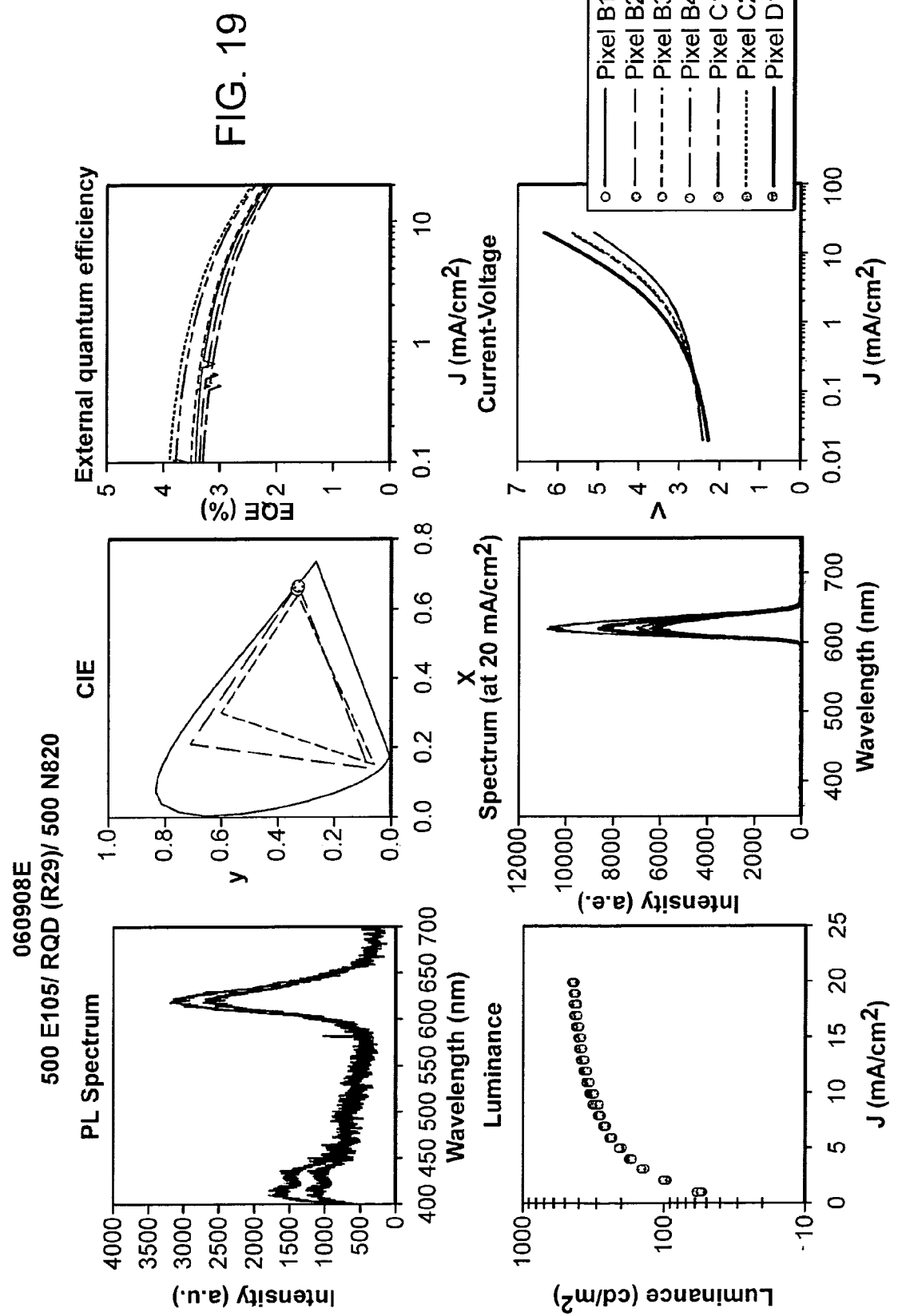
Figure 20:
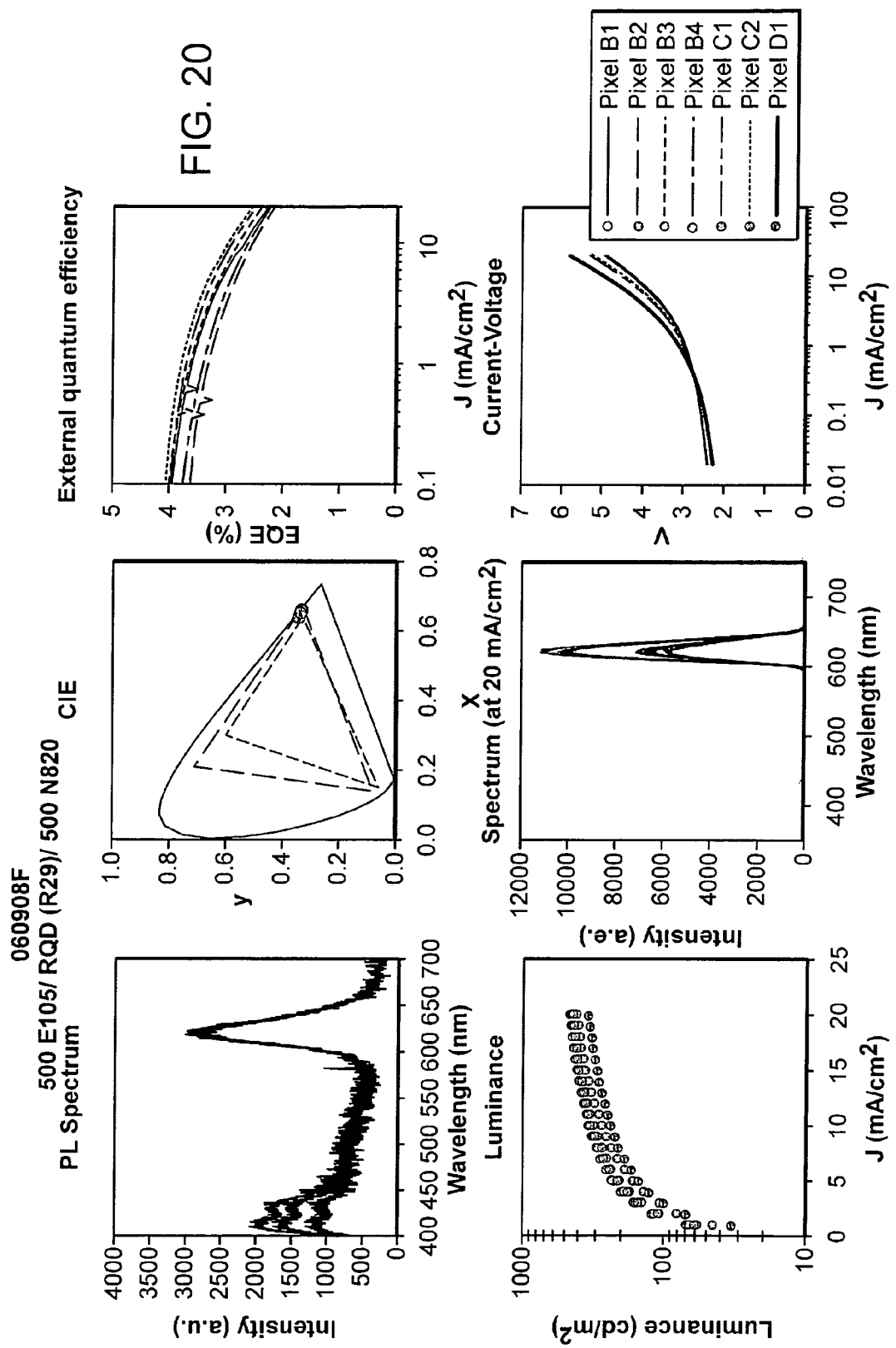
Figure 21:
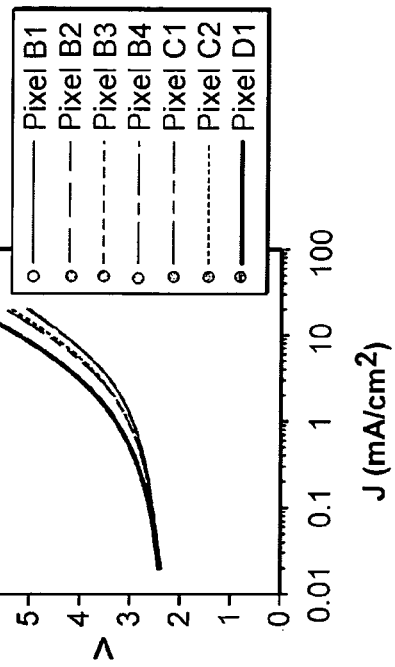
Figure 22:
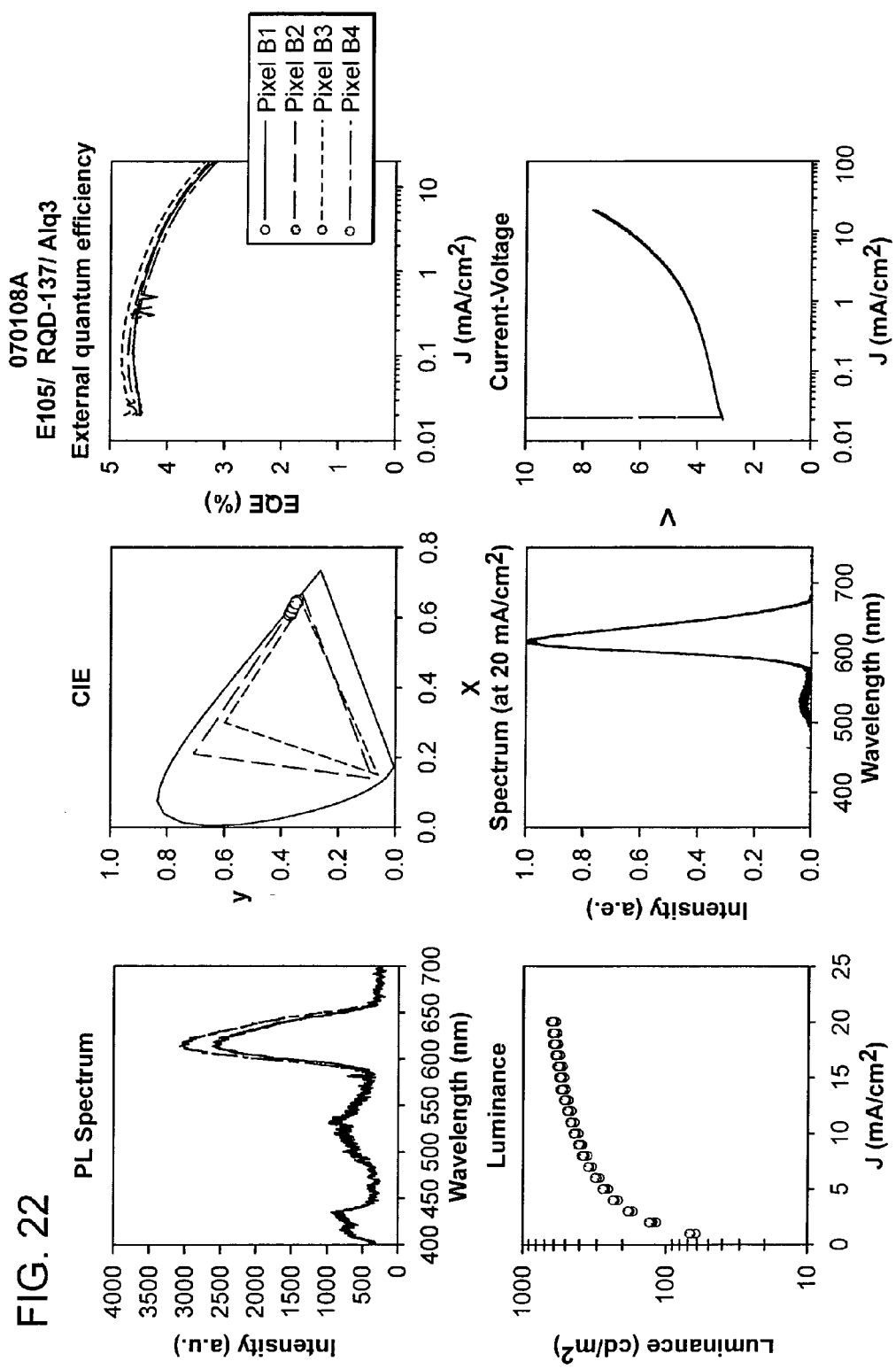
Figure 23:
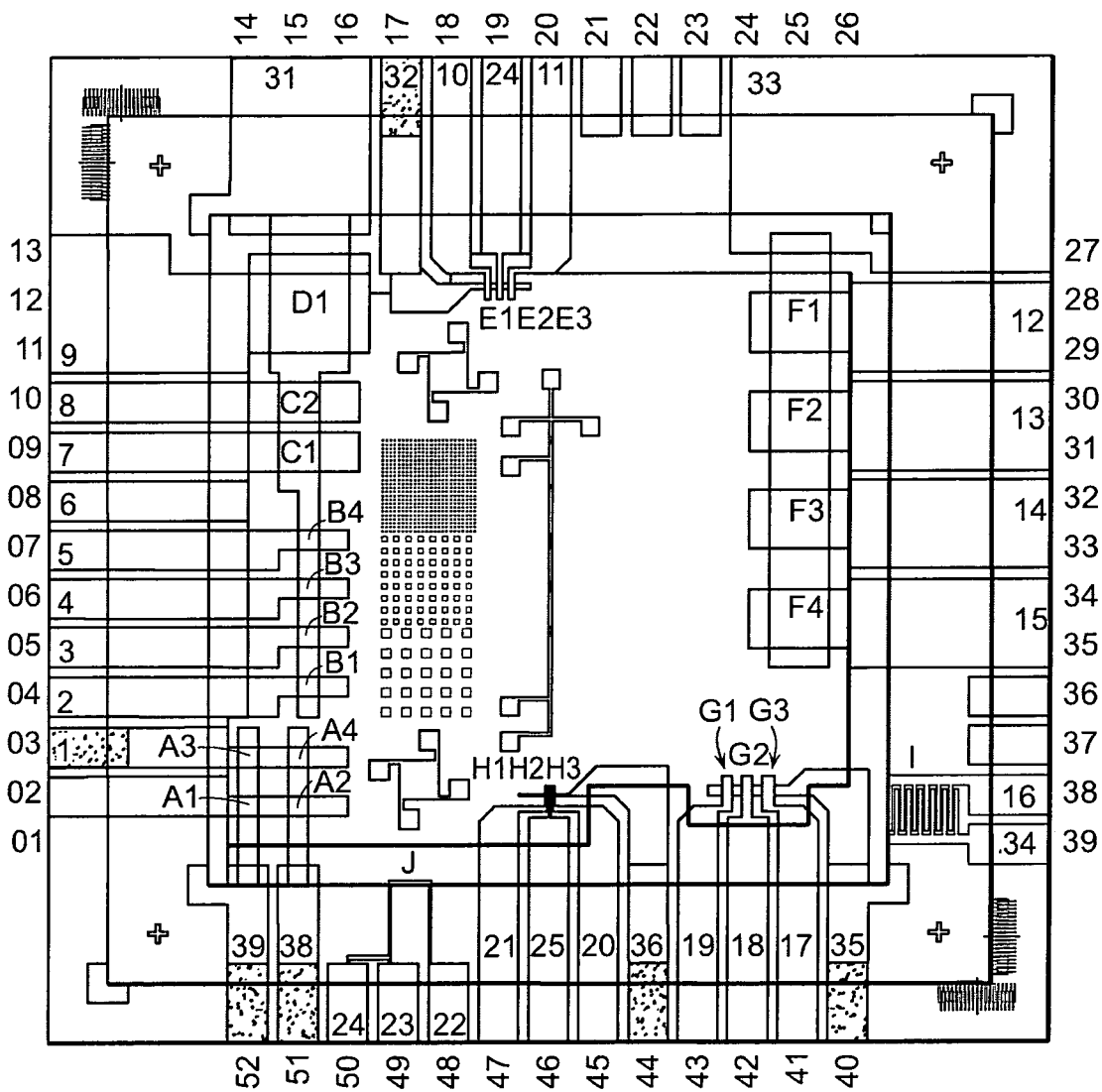
FIG. 23 depicts the arrangement of the pixels (designated as B1, B2, B3, B4, C1, C2, and D1) included on test device coupons.
Figure 26:
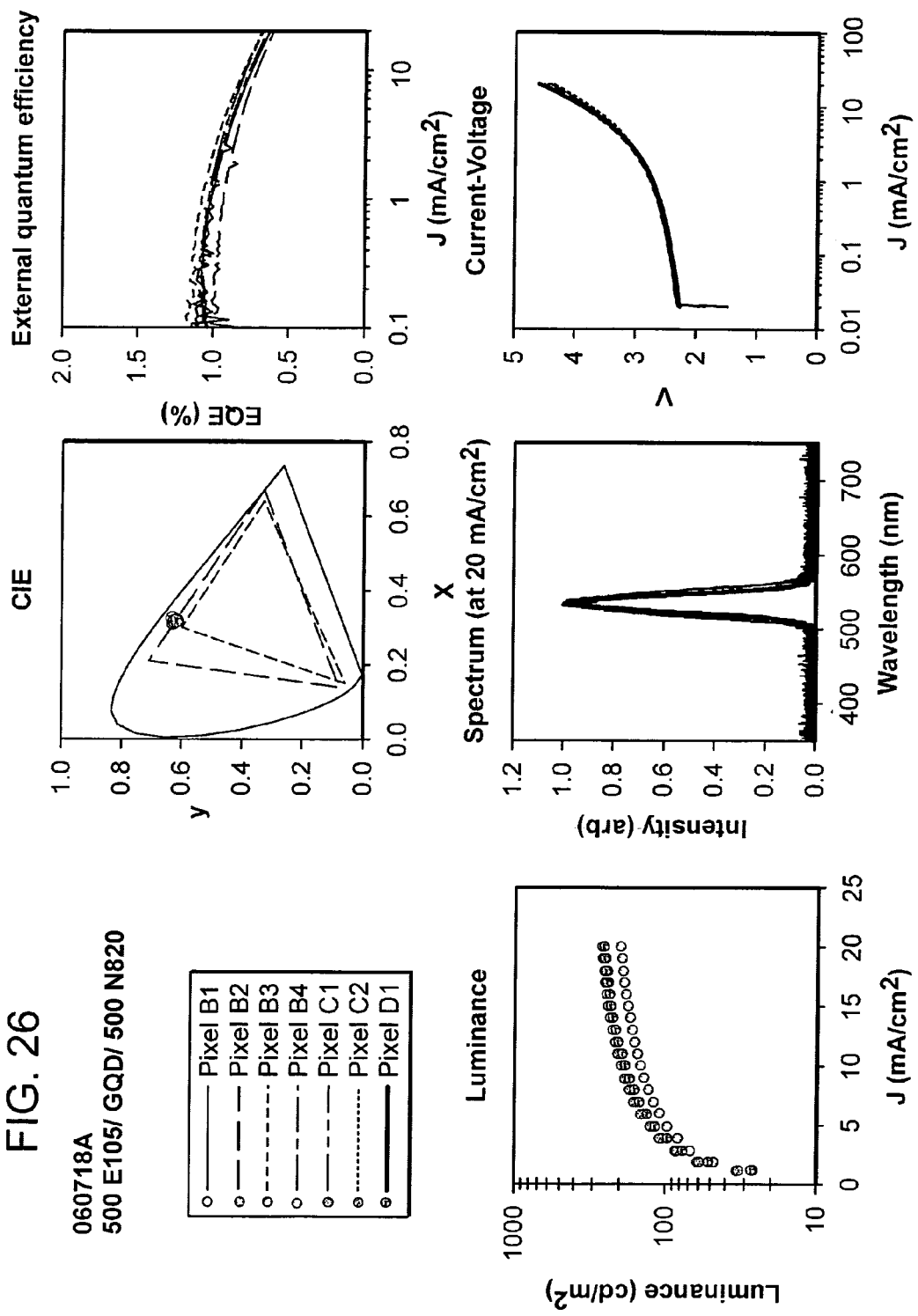
FIGS. 26-30 depict graphical representations of CIE coordinates, current density versus external quantum efficiency, emission wavelength versus intensity; and current density versus voltage for the different pixels (individual light-emitting devices) included on test device coupons of the examples.
Figure 27:
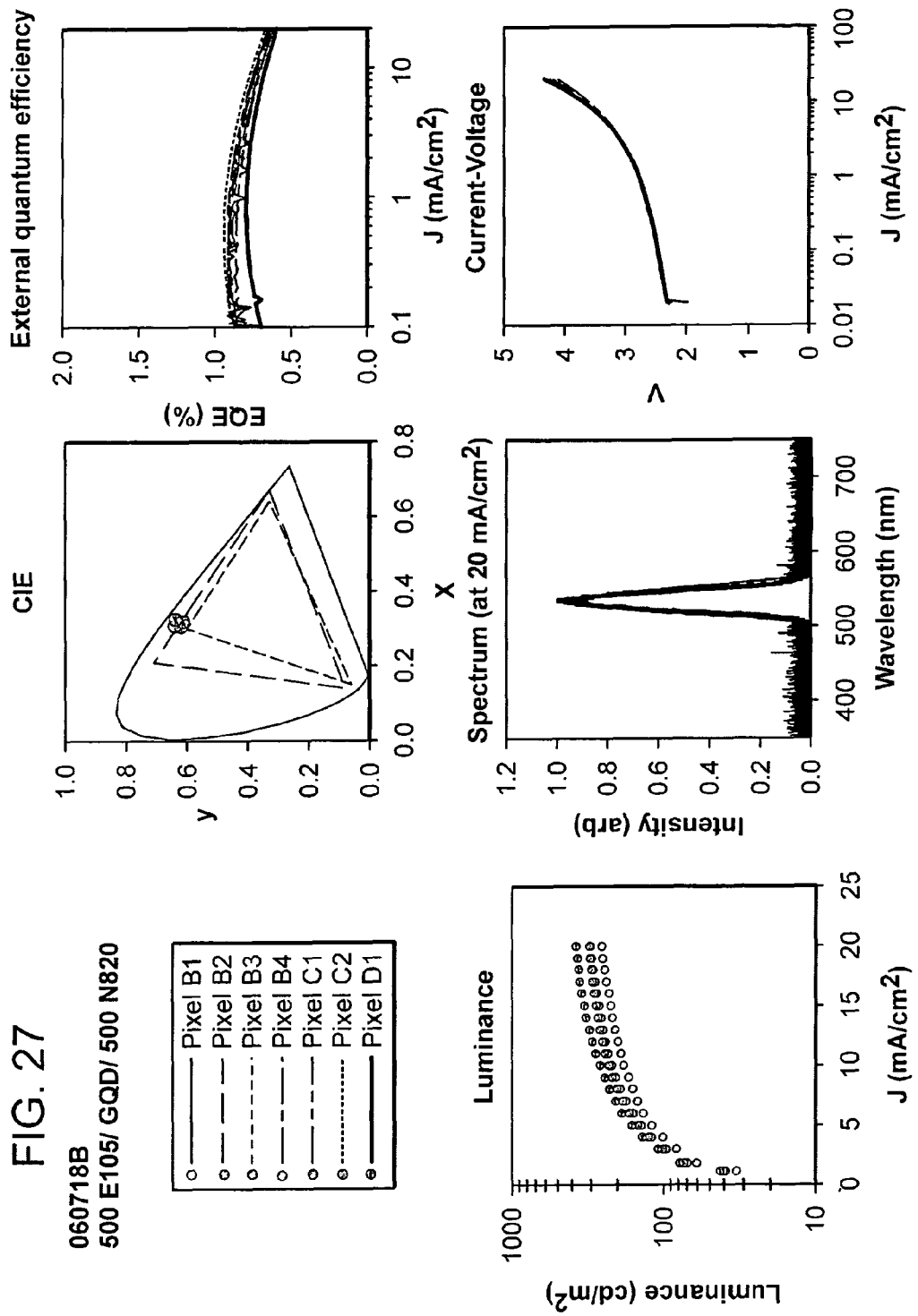
Figure 28:
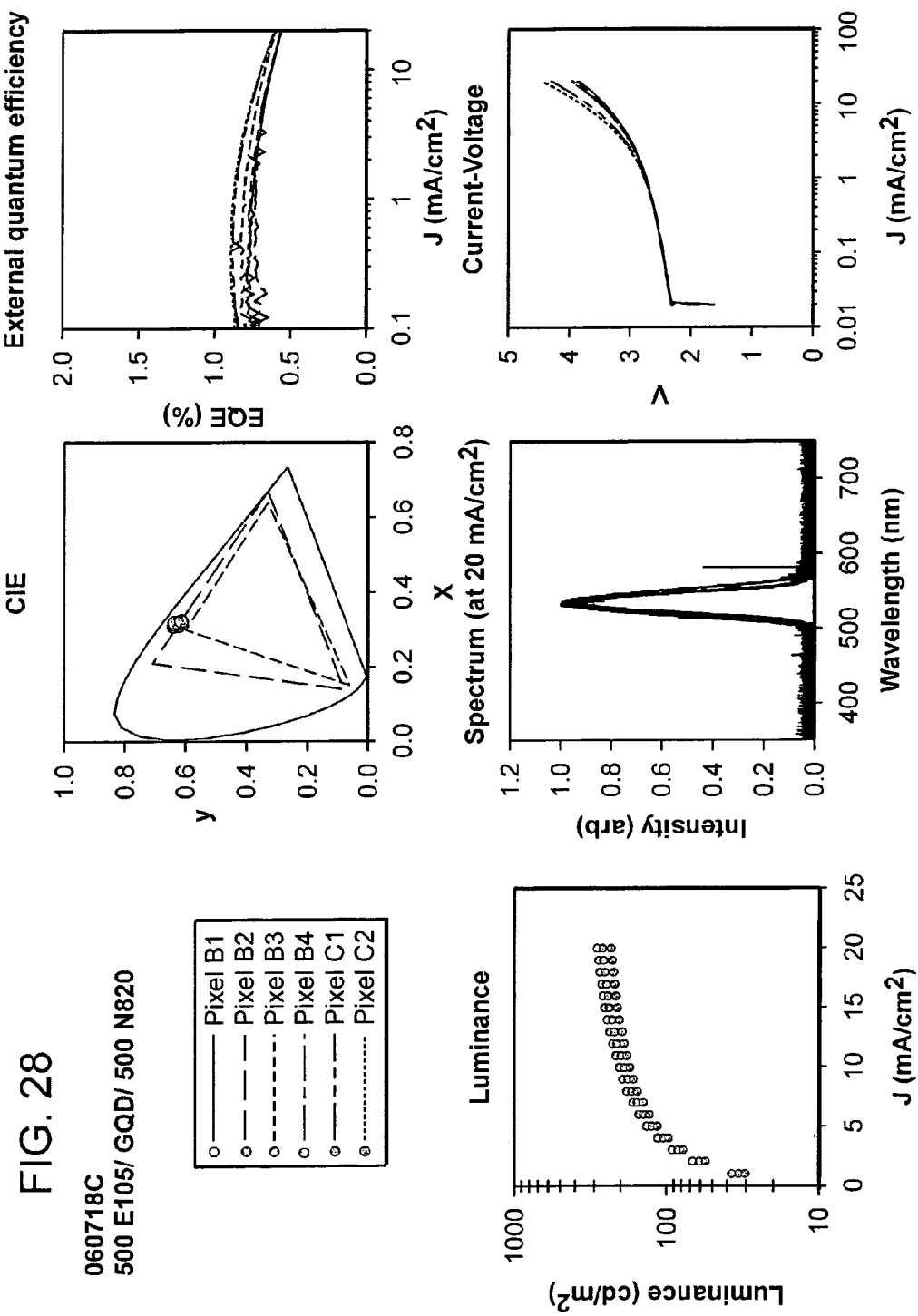
Figure 29:
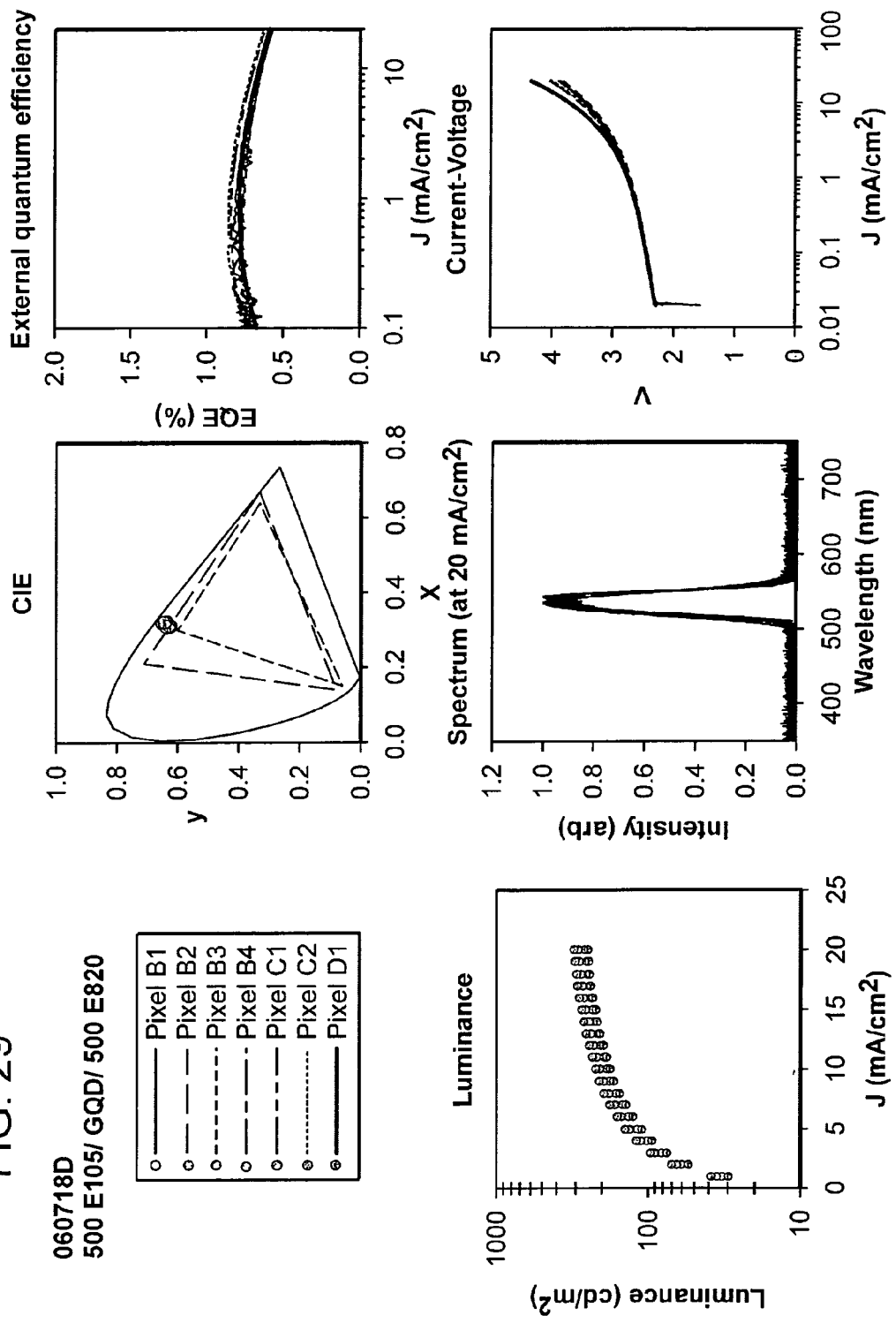

FIG. 2 illustrates an example of another embodiment of a light-emitting device showing a glass substrate on which the device can be built and a protective glass layer that can be used to encapsulate the device. Optionally a desiccant or other moisture absorptive material can be included in the device before it is sealed, e.g., with an epoxy, such as a UV curable expoxy. Other desiccants or moisture absorptive materials can be used.

The color of the light output of a light-emitting device can be precisely controlled by the selection of the composition, structure, and size of the various semiconductor nanocrystals included in a light-emitting device as the emissive material. In certain embodiments, two or more different semiconductor nanocrystals (having different compositions, structures, and/or sizes) can be included.

Semiconductor nanocrystals include, for example, inorganic crystallites between about 1 nm and about 1000 nm in diameter, preferably between about 2 nm and about 50 nm, more preferably about 5 nm to about 20 nm (such as about 6, 7, 8, 9, 10, 11, 12, 13, 14, 15, 16, 17, 18, 19, or 20 nm).

The semiconductor forming the semiconductor nanocrystals can comprise a Group W element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TIN, TIP, TIAs, TISb, PbO, PbS, PbSe, PbTe, Ge, Si, an alloy including any of the foregoing, and/or a mixture including any of the foregoing, including ternary and quaternary mixtures or alloys.

Examples of the shape of the semiconductor nanocrystals include sphere, rod, disk, other shape or mixtures thereof.

Preferably, the semiconductor nanocrystals include a "core" of one or more first semiconductor materials, which may be surrounded by an overcoating or "shell" of one or more second semiconductor materials. A semiconductor nanocrystal core surrounded by a semiconductor shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TIN, TIP, TIAs, TISb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

Additional examples of core/shell semiconductor structures are described in U.S. application Ser. No. 10/638,546, for "Semiconductor Nanocrystal Heterostructures", filed 12 Aug. 2003, and U.S. Published Patent Application No. US 2004-0023010 A1, for "Light Emitting Device Including Semiconductor Nanocrystals" of Bulovic et al. The foregoing applications are hereby incorporated herein by reference in its entirety.

Preparation and manipulation of semiconductor nanocrystals are described, for example, in U.S. Pat. Nos. 6,322,901 and 6,576,291, and U.S. Patent Application No. 60/550,314, each of which is hereby incorporated herein by reference in its entirety. One method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of semiconductor nanocrystals can be carried out in the presence of an amine. See, for example, U.S. Pat. No. 6,576,291 for "Preparation of Nanocrsytallites" of Bawendi et al. issued 10 Jun. 2003, which is hereby incorporated herein by reference in its entirety.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. The X donor can be a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis (trimethylsilyl) selenide ($(TMS)_2Se$), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-noctylphosphine) sulfide (TOPS), an ammonium salt such as an ammonium halide (e.g., NH4Cl), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

As discussed herein, the semiconductor nanocrystals preferably have ligands attached thereto.

In one embodiment, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

The organic ligands can be useful in facilitating large area, non-epitaxial deposition of highly stable inorganic nanocrystals within a device.

More specifically, the coordinating ligand can have the formula:

$$(Y-)_{k-n}-(X)-(-L)_n$$

wherein k is 2, 3 4, or 5, and n is 1, 2, 3, 4 or 5 such that k–n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O-C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

When the electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of semiconductor nanocrystals shift to the blue, or to higher energies, as the size of the crystallites decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region. The narrow size distribution of a population of semiconductor nanocrystals can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. Spectral emissions in a narrow range of no greater than about 75 nm, preferably 60 nm, more preferably 40 nm, and most preferably 30 nm full width at half max (FWHM) for semiconductor nanocrystals that emit in the visible can be observed. IR-emitting semiconductor nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of semiconductor nanocrystal diameters decreases. Semiconductor nanocrystals can have high emission quantum efficiencies such as greater than about 10%, greater than about 20%, greater than about 30%, greater than about 40%, greater than about 50%, greater than about 60%, greater than about 70%, or greater than about 80%.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures can emit light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau \sim 10$ ns) than a typical phosphor ($\tau > 0.1$ μs), enabling semiconductor nanocrystal lighting devices to operate efficiently even at high current density and high brightness.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

In certain embodiments, the emissive material can be deposited as one or more separate layers. In certain embodiments, a layer comprising emissive material can be disposed between any two layers of the device. For example, the layer comprising emissive material can be disposed between two hole transport layers and/or between two electron transport layers. In either case, each of the charge transport layers may further comprise one or more layers. In another embodiment, the emissive material can be deposited as one or more separate layers disposed between a hole transport layer and an electron transport layer. As discussed elsewhere herein, other layers may also be included between the electron transport layers and the hole transport layers. When included in the device as a separate layer, for example, emissive material comprising a plurality of semiconductor nanocrystals can be disposed as a continuous or substantially continuous thin film or layer. When disposed as a separate layer, the layer can be patterned or unpatterned. Preferably, emissive material comprising a plurality of semiconductor nanocrystals comprises a substantially monodisperse population of semiconductor nanocrystals.

In certain embodiments, the emissive material comprising a plurality of semiconductor nanocrystals is deposited at a thickness of multiple monolayers or less. For example, the thickness can be greater than three monolayers, three or less monolayers, two or less monolayers, a single monolayer, a partial monolayer, etc. The thickness of each deposited layer of emissive material comprising a plurality of semiconductor nanocrystals may vary. Preferably, the variation of the thickness at any point of the deposited semiconductor nanocrystals is less than three monolayers, more preferably less than two monolayers, and most preferably less than one monolayer. When deposited as a single monolayer, preferably at least about 60% of the semiconductor nanocrystals are at single monolayer thickness, more preferably, at least about 80% of the semiconductor nanocrystals are at single monolayer thickness, and most preferably, at least about 90% of the semiconductor nanocrystals are at single monolayer thickness. In a light-emitting device, a monolayer can provide the beneficial light emission properties of semiconductor nanocrystals while minimizing the impact on electrical performance.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

As discussed herein, in certain embodiments, emissive material comprising a plurality of semiconductor nanocrystals can be deposited in a patterned arrangement. Patterned semiconductor nanocrystals can be used to form an array of light-emitting devices (or pixels) comprising, e.g., red, green, and blue, or alternatively, red, orange, yellow, green, blue-green, blue, violet, or other visible, infrared, or ultraviolet emitting, or other combinations of distinguishable wavelength emitting subpixels, that are energized to produce light of a predetermined wavelength.

An array of light-emitting devices on a substrate may be referred to as a display; each light-emitting device of a display may also be referred to as a pixel.

Generally, a device or array of devices capable of emitting a variety of colors includes a pattern of emissive materials capable of emitting different colors.

When deposited in a patterned arrangement, the emissive material can be deposited in a pattern comprising features having at least one dimension at a micron-scale (e.g., less than 1 mm, less than 500 μm, less than 200 μm, less than 100 μm or less, less than 50 µm or less, less than 20 µm or less). The emissive material can also be deposited in a patterned arrangement comprising features at greater than micronscale.

A pattern comprising deposited emissive material having features on the micron scale may also be referred to herein as a micropattern. A micropattern can have features on the micron scale, such as less than 1 mm, less than 500 µm, less than 200 µm, less than 100 µm, less than 50 µm, or 20 µm or less in size. A 20 µm feature size or smaller is suitable for many light emitting devices.

The size of a display can have dimensions of >1 mm, 1 cm or greater, 10 cm or greater, 100 cm or greater, or 1,000 cm or greater.

For example, displays can have dimensions of small areas (for example, 100 µm catheters) to large areas, (for example, 12" square areas). In further example, displays can be fabricated on mother glass having dimensions such as GEN2 (360 mm×465 mm), GEN3 (550 mm×650 mm), GEN3.5 (600 mm×720 mm), GEN4 (730 mm×920 mm), GEN5 (1110 mm×1250 mm), GEN6 (1500 mm×1800 mm), GEN7 (1900 mm×2100 mm), and subsequent generations of glass. Optionally, displays can be stitched (or tiled) together, to expand display sizes from 12" squares, to 'n×12" squares' as is frequently done in the semiconductor lithography field.

Contact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In some embodiments, contact printing can begin by forming a patterned or unpatterned mold. The mold has a surface with a pattern of elevations and depressions. The stamp can include planar and/or non-planar regions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. patent application Ser. No. 11/253,612, filed Oct. 21, 2005, which is incorporated by reference in its entirety.

Other techniques, methods and applications that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim et al., for "Applicator For Depositing Materials And Methods" filed on 14 Apr. 2006; U.S. Provisional Patent Application 60/793,990 of LeeAnn Kim et al., for "Applicator For Depositing Materials And Methods" filed by Express Mail on 21 Apr. 2006; U.S. Provisional Patent Application No. 60/790,393 of Seth Coe-Sullivan et al., for "Methods And Articles Including Nanomaterial", filed on 7 Apr. 2006; U.S. Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan et al., for "Methods And Articles Including Nanomaterial", filed on 24 Jun. 2006; and U.S. Provisional Patent Application No. 60/804,921 of Seth Coe-Sullivan et al., for "Light-Emitting Devices And Displays With Improved Performance", filed on 15 Jun. 2006. Each of the above-listed provisional patent applications is hereby incorporated herein by reference in its entirety.

Light-emitting devices in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

The first electrode can be, for example, an anode comprising a high work function (e.g., greater than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. In certain embodiments, the first electrode is light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly (thiophenes) are also conducting and could be used, as well as emaraldine salt form of polyaniline.

The second electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). The second electrode, such as Mg:Ag, can optionally be covered with an opaque protective metal layer, for example, a layer of Ag for protecting the cathode layer from atmospheric oxidation, or a relatively thin layer of substantially transparent ITO. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

In a device such as that shown in FIG. 1, for example, the first electrode can have a thickness of about 500 Angstroms to 4000 Angstroms. The first layer can have a thickness of about 50 Angstroms to about 1000 Angstroms. The second layer can have a thickness of about 50 Angstroms to about 1000 Angstroms. The second electrode can have a thickness of about 5 Angstroms to greater than about 10,000 Angstroms.

Non-polymeric electrode materials can be deposited by, for example, sputtering or evaporating. Polymeric electrode materials can be deposited by, for example, spin-casting.

As discussed above, the electrodes can be patterned. Electrode material, including light-transmittable electrode material, can be patterned by, for example, a chemical etching method such as a photolithography or a physical etching method using laser, etc. Also, the electrode may be patterned by vacuum vapor deposition, sputtering, etc. while masking.

Hole transport and electron transport layers can be collectively referred to as charge transport layers. Either or both of these layers can comprise organic or inorganic materials. Examples of inorganic material include, for example, inorganic semiconductors. The inorganic material can be amorphous or polycrystalline. An organic charge transport material can be polymeric or non-polymeric.

An example of a typical organic material that can be included in an electron transport layer includes a molecular matrix. The molecular matrix can be non-polymeric. The molecular matrix can include a small molecule, for example, a metal complex. The metal complex of 8-hydroryquinoline can be an aluminum, gallium, indium, zinc or magnesium complex, for example, aluminum tris(8-hydroxyquinoline) (Alq$_3$). In certain embodiments, the electron transport material can comprise LT-N820 or LT-N821 (1,3-Bis[2-(2,2'-bypyridine-6-yl)-1,3,4-oxadiazo-5-yl]benzene (also abbreviated as Bpy-OXD), available from Luminescent Technologies, Taiwan. For additional information relating to Bpy-OXD, see M. Ichikawa et al., J. Mater. Chem., 2006, 16, 221-25, the disclosure of which is hereby incorporated herein by reference in its entirety. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An examples of a typical organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include spiro-TPD, 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity. Examples of doped hole transport layers are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Charge transport layers comprising organic materials and other information related to fabrication of organic charge transport layers are discussed in more detail in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions from about $1 \times 10^{-7}$ to about $5 \times 10^{-6}$ torr. Alternatively, organic layers may be formed by multi-layer coating while appropriately selecting solvent for each layer.

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals", filed 16 Feb. 2005 and U.S. patent application Ser. No. 11/354,185, filed 15 Feb. 2006, the disclosures of each of which are hereby incorporated herein by reference in their entireties.

Charge transport layers comprising an inorganic semiconductor can be deposited on a substrate at a low temperature, for example, by a known method, such as a vacuum vapor deposition method, an ion-plating method, sputtering, inkjet printing, etc.

The substrate can be opaque, light transmissive, or transparent. The substrate can be rigid or flexible. The substrate can comprise plastic, metal, glass, or semiconductor (e.g., silicon).

In some applications, the substrate can include a backplane. The backplane includes active or passive electronics for controlling or switching power to individual pixels or light-emitting devices. Including a backplane can be useful for applications such as displays, sensors, or imagers. In particular, the backplane can be configured as an active matrix, passive matrix, fixed format, direct drive, or hybrid. The display can be configured for still images, moving images, or lighting. A display including an array of light emitting devices can provide white light, monochrome light, or color-tunable light.

In addition to the charge transport layers, a device may optionally further include one or more charge-injection layers, e.g., a hole-injection layer (either as a separate layer or as part of the hole transport layer) and/or an electron-injection layer (either as a separate layer as part of the electron transport layer). Charge injection layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

One or more charge blocking layers may still further optionally be included. For example, an electron blocking layer (EBL), a hole blocking layer (HBL), or an exciton blocking layer (eBL), can be introduced in the structure. A blocking layer can include, for example, 3-(4-biphenylyl)-4-phenyl-5-tert butylphenyl-1,2,4-triazole (TAZ), 3,4,5-triphenyl-1,2,4-triazole, 3,5-bis(4-tert-butylphenyl)-4-phenyl-1, 2,4-triazole, bathocuproine (BCP), 4,4',4''-tris {N-(3-methylphenyl)-Nphenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino) phenyl-1,3,4-oxadiazol-2-yl)benzene, 1,3,5-tris[5-(4-(1,1-dimethylethyl)phenyl)-1,3,4-oxadiazol-2-yl)benzene, or 2,2',2''-1,3,5-Benzinetriyl)-tris(1-phenyl-1-H-benzimidazole) (TPBi).

Charge blocking layers comprising organic materials can be intrinsic (un-doped) or doped. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

The charge injection layers (if any), and charge blocking layers (if any) can be deposited on a surface of one of the electrodes by spin coating, dip coating, vapor deposition, or other thin film deposition methods. See, for example, M. C. Schlamp, et al., J. Appl. Phys., 82, 5837-5842, (1997); V. Santhanam, et al., Langmuir, 19, 7881-7887, (2003); and X. Lin, et al., J. Phys. Chem. B, 105, 3353-3357, (2001), each of which is incorporated by reference in its entirety.

Other multilayer structures may optionally be used to improve the performance (see, for example, U.S. patent application Ser. Nos. 10/400,907 and 10/400,908, filed Mar. 28, 2003, each of which is incorporated by reference in its entirety) of the light-emitting devices and displays of the invention. The performance of light-emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety.

Preferably, a light-emitting device including an emissive material comprising a plurality of semiconductor nanocrystals is processed in a controlled (oxygen-free and moisture-free) environment, preventing the quenching of luminescent efficiency during the fabrication process.

The present invention will be further clarified by the following examples, which are intended to be exemplary of the present invention.

EXAMPLES

Example 1

A. Synthesis of CdSe Semiconductor Nanocrystal Cores 230 mg of anhydrous cadmium acetate ($Cd(OAc)_2$) (1 mmol) (Prochem) and 4 ml of Tri-n-octylphosphine (TOP) (Strem 97%) is added to a 20 mL septum capped vial. The vial is suspended in a 140° C. oil bath (silicon oil). The content of the vial is degassed for about one-half hour. After the cadmium acetate solution is degassed, and the cadmium acetate is dissolved, the vacuum is closed and the vial is opened to nitrogen. The vial is removed from the oil bath and permitted to cool to room temperature while under nitrogen.

6.00 grams of Tri-n-octylphosphine oxide (TOPO) (99% Strem) and 0.668 grams of octadecylphosphonic acid (ODPA) (Polycarbon) are added to a 50 ml three necked round bottom flask. The ingredients are stirred and heated to a temperature of about 120° C. Once the flask reaches 120° C., the solution is degassed for 2 hours while maintained at 120° C. When the solution in the round bottom flask has finished degassing, the vacuum valve is closed and the flask is opened to nitrogen and stirred.

4 mL of the cadmium acetate solution is mixed and injected into the round bottom flask via a septum cap from a syringe filled under nitrogen. The temperature is increased to about 270° C. When the temperature of the solution in the round bottom flask stabilizes at 270° C., 2 ml of Tri-n-butylphosphine (TBP) (Strem 99%) is injected into the round bottom flask from a 5 ml syringe. When the contents of the round bottom flask has restabilized at 270° C., 1.1 mL of Tri-n-butylphosphine selenide (TBPSe) (1.5M) is injected into the round bottom flask. The temperature controller is adjusted to 250° C. After a brief delay (5 secs), the solution turns yellow then red.

A sample is then taken every 15 minutes until an absorbance of ~560 nm is obtained, at which time the heating mantle is removed and the solution is permitted to cool while stirring. When the temperature is 100° C., the solution is divided into half into 2 centrifuge tubes and 2× volume of 3:1 methanol/isopropanol is added to each tube to precipitate semiconductor nanocrystal cores. The supernatant is poured off, and the semiconductor nanocrystal cores are mixed with hexane (minimum volume 2.5 ml in each tube). The contents of the two centrifuge tubes are then combined, centrifuged for 5 minutes at 4000 rpm, and filtered with hexane using a 0.2 micron filter.

Results/Characterization:

The absorption peak measured for the first sample taken was at about 559 nm. After purification a peak emission was at a wavelength of about 569 nm with a FWHM=26-28 nm). The reaction yield of CdSe cores was ~20%.

B. Overcoating the CdSe Cores Prepared in Example 1A

Two 5 mL syringes are prepared in the glove box with the precursors for the overcoating.

The first syringe: 4 mL of Tri-n-octylphosphine (TOP) (97% Strem), 48.24 mg dimethylcadmium, and 41.81 mg diethylzinc.

The second syringe: 4 mL of Tri-n-octylphosphine (TOP) (97% Strem) and 241.68 mg of Bis(TMS)sulfide.

The overcoating precursor mixture for each syringe is prepared by placing the Tri-n-octylphosphine into an 8 mL glass vial. The precursors (dimethylcadmium, diethylzinc, or Bis(TMS)sulfide) are then dripped into the Tri-n-octylphosphine using a syringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.18 mmol) as described in Example 1A in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is turned down to 100° C., and 10 ml of toluene is added and allowed to sit overnight under nitrogen.

Results/Characterization:

The overcoated cores had a peak emission at a wavelength of 607 nm (FWHM=30 nm).

C. Clean Up of Core CdSe/CdZnS Core-shell Particles

The total growth solution is divided into two aliquots, each being put into a 50 mL centrifuge tube. An excess ~30 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another two centrifuge tubes. (The solid is a salt that has formed and is waste.) The hexane/overcoated core supernatant is filtered using a 0.2 µm syringe filter. An excess of 3:1 methanol/isopropanol is added to each tube to precipitate the overcoated cores. The tubes are centrifuged for 5 minutes at 4000 rpm. The supernatant is poured off. The purified overcoated cores are now at the bottom of the tube and the supernatant is waste. The solution quantum efficiency was 56%.

Example 2

A. Synthesis of CdSe Semiconductor Nanocrystal Cores 230 mg of anhydrous cadmium acetate ($Cd(OAc)_2$) (1 mmol) (Prochem) and 4 ml of Tri-n-octylphosphine (TOP) (Strem 97%) is added to a 20 mL septum capped vial. The vial is suspended in a 140° C. oil bath (silicon oil). The content of the vial is degassed for about one-half hour. After the cadmium acetate solution is degassed, and the cadmium acetate is dissolved, the vacuum is closed and the vial is opened to nitrogen. The vial is removed from the oil bath and permitted to cool to room temperature while under nitrogen.

6.00 grams of Tri-n-octylphosphine oxide (TOPO) (99% Strem) and 0.668 grams of octadecylphosphonic acid (ODPA) (Polycarbon) are added to a 50 ml three necked round bottom flask. The ingredients are stirred and heated to a temperature of about 120° C. Once the flask reaches 120° C., the solution is degassed for 2 hours while maintained at 120° C. When the solution in the round bottom flask has finished degassing, the vacuum valve is closed and the flask is opened to nitrogen and stirred.

4 mL of the cadmium acetate solution is mixed and injected into the round bottom flask via a septum cap from a syringe filled under nitrogen. The temperature is increased to about 270° C. When the temperature of the solution in the round bottom flask stabilizes at 270° C., 2 ml of Tri-n-butylphosphine (TBP) (Strem 99%) is injected into the round bottom flask from a 5 ml syringe. When the contents of the round bottom flask has restabilized at 270° C., 1.1 mL of Tri-n-butylphosphine selenide (TBPSe) (1.5M) is injected into the round bottom flask. (Unlike Example 1, the temperature is not reduced to 250° C., but rather maintained at 270° C.) After a brief delay (5 secs), the solution turns yellow then red.

A sample is then taken every 5 minutes until an absorbance of ~570 nm is obtained, at which time the heating mantle is removed and the solution is permitted to cool while stirring. When the temperature is 100° C., the solution is divided into half into 2 centrifuge tubes, and 2× volume of 3:1 methanol/isopropanol is added to each tube to precipitate semiconductor nanocrystal cores. The supernatant is poured off, and the semiconductor nanocrystal cores are mixed with hexane (minimum volume 2.5 ml in each tube). The contents of the two centrifuge tubes are then combined, centrifuged for 5 minutes at 4000 rpm, and filtered with hexane using a 0.2 micron filter. The exact volume of solution is recorded; 25 micro liters is then diluted with 2.5 ml hexane in a UV/VIS cuvette. The first peak wavelength/absorbance and absorbance at 350 nm is recorded to calculate the yield of core nanocrystals.

Results/Characterization:

The absorption peak measured for the first sample taken was at about 575 nm. After purification the peak emission was at a wavelength of about 585 nm with a FWHM=26-28 nm). The reaction yield of CdSe cores was ~15%.

B. Overcoating the CdSe Cores Prepared in Example 2A

Two 5 mL syringes are prepared in the glove box with the precursors for the overcoating.

The first syringe: 4 mL of Tri-n-octylphosphine (TOP) (97% Strem), 34.715 mg dimethylcadmium, and 30.094 mg diethylzinc.

The second syringe: 4 mL of Tri-n-octylphosphine (TOP) (97% Strem) and 173.91 mg of Bis(TMS)sulfide.

The overcoating precursor mixture for each syringe is prepared by placing the Tri-n-octylphosphine into an 8 mL glass vial. The precursors (dimethylcadmium, diethylzinc, or Bis(TMS)sulfide) are then dripped into the Tri-n-octylphosphine using a syringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.15 mmol) as described in Example 2A in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is turned down to 100° C., and 10 ml of toluene is added and allowed to sit overnight under nitrogen.

Results/Characterization:

The overcoated cores had a peak emission at a wavelength of 615 nm (FWHM=28 nm).

C. Clean Up of Core CdSe/CdZnS Core-shell Particles

The total growth solution is divided into two aliquots, each being put into a 50 mL centrifuge tube. An excess ~30 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another two centrifuge tubes. (The solid is a salt that has formed and is waste.) The hexane/overcoated core supernatant is filtered using a 0.2 µm syringe filter. An excess of 3:1 methanol/isopropanol is added to each tube to precipitate the overcoated cores. The tubes are centrifuged for 5 minutes at 4000 rpm. The supernatant is poured off. The purified overcoated cores are now at the bottom of the tube and the supernatant is waste. The solution quantum efficiency was 47%.

Example 3

A. Synthesis of CdSe Semiconductor Nanocrystal Cores 230 mg of anhydrous cadmium acetate ($Cd(OAc)_2$) (1 mmol) (Prochem) and 4 ml of Tri-n-octylphosphine (TOP) (Strem 97%) is added to a 20 mL septum capped vial. The vial is suspended in a 140° C. oil bath (silicon oil). The content of the vial is degassed for about one-half hour. After the cadmium acetate solution is degassed, and the cadmium acetate is dissolved, the vacuum is closed and the vial is opened to nitrogen. The vial is removed from the oil bath and permitted to cool to room temperature while under nitrogen.

6.00 grams of Tri-n-octylphosphine oxide (TOPO) (99% Strem) and 0.668 grams of octadecylphosphonic acid (ODPA) (Polycarbon) are added to a 50 ml three necked round bottom flask. The ingredients are stirred and heated to a temperature of about 120° C. Once the flask reaches 120° C., the solution is degassed for 2 hours while maintained at 120° C. When the solution in the round bottom flask has finished degassing, the vacuum valve is closed and the flask is opened to nitrogen and stirred.

4 mL of the cadmium acetate solution is mixed and injected into the round bottom flask via a septum cap from a syringe filled under nitrogen. The temperature is increased to about 270° C. When the temperature of the solution in the round bottom flask stabilizes at 270° C., 2 ml of Tri-n-butylphosphine (TBP) (Strem 99%) is injected into the round bottom flask from a 5 ml syringe. When the contents of the round bottom flask has restabilized at 270° C., 1.1 mL of Tri-n-butylphosphine selenide (TBPSe) (1.5M) is injected into the round bottom flask. (Unlike Example 1, the temperature is not reduced to 250° C., but rather maintained at 267° C.) After a brief delay (5 secs), the solution turns yellow then red.

A sample is then taken every 5 minutes until an absorbance of ~570 nm is obtained, at which time the heating mantle is removed and the solution is permitted to cool while stirring. When the temperature is 100° C., the solution is divided into half into 2 centrifuge tubes, and 2× volume of 3:1 methanol/isopropanol is added to each tube to precipitate semiconductor nanocrystal cores. The supernatant is poured off, and the semiconductor nanocrystal cores are mixed with hexane (minimum volume 2.5 ml in each tube). The contents of the two centrifuge tubes are then combined, centrifuged for 5 minutes at 4000 rpm, and filtered with hexane using a 0.2 micron filter. The exact volume of solution is recorded; 25 micro liters is then diluted with 2.5 ml hexane in a UV/VIS cuvette. The first peak wavelength/absorbance and absorbance at 350 nm is recorded to calculate the yield of core nanocrystals.

Results/Characterization:

The absorption peak measured for the first sample taken was at about 561 nm. After purification a peak emission was at a wavelength of about 572 nm with a FWHM=26-28 nm). The reaction yield of CdSe cores was ~15%.

B. Overcoating the CdSe Cores Prepared in Example 3A

Two 5 mL syringes are prepared in the glove box with the precursors for the overcoating.

The first syringe: 4 mL of Tri-n-octylphosphine (TOP) (97% Strem), 30.69 mg dimethylcadmium, and 26.61 mg diethylzinc.

The second syringe: 4 mL of Tri-n-octylphosphine (TOP) (97% Strem) and 153.8 mg of Bis(TMS)sulfide.

The overcoating precursor mixture for each syringe is prepared by placing the Tri-n-octylphosphine into an 8 mL glass vial. The precursors (dimethylcadmium, diethylzinc, or Bis(TMS)sulfide) are then dripped into the Tri-n-octylphosphine using a syringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.12 mmol) as described in Example 3A in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is turned down to 100° C., and 10 ml of toluene is added and allowed to sit overnight under nitrogen.

Results/Characterization:

The overcoated cores had a peak emission at a wavelength of 605 nm (FWHM=30 nm).

C. Clean Up of Core CdSe/CdZnS Core-shell Particles

The total growth solution is divided into two aliquots, each being put into a 50 mL centrifuge tube. An excess ~30 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another two centrifuge tubes. (The solid is a salt that has formed and is waste.) The hexane/overcoated core supernatant is filtered using a 0.2 µm syringe filter. An excess of 3:1 methanol/isopropanol is added to each tube to precipitate the overcoated cores. The tubes are centrifuged for 5 minutes at 4000 rpm. The supernatant is poured off. The purified overcoated cores are now at the bottom of the tube and the supernatant is waste.

The solution quantum efficiency was 67%.

Example 4

Devices Fabricated with Purified CdSe/CdZnS Core-Shell Particles

Devices # 060510D, #060510E, #060510H, # 060510K, and # 060516M were fabricated with CdSe/CdZnS core-shell particles made in accordance with Example 2. Device #060524E was fabricated with CdSe/CdZnS core-shell particles made in accordance with Example 3. The devices were made as follows:

Glass (50 mm×50 mm) with patterned indium tin oxide (ITO) electrode on one surface (obtained from Thin Film Devices, Anaheim, Calif.) is cleaned in an oxygen plasma for about 6 minutes to remove contaminants and oxygenate the surface. The cleaning takes place on 100% oxygen at about 20 psi. The glass is placed on a water cooled plate to help control the increase in temperature during cleaning.

A layer of hole injection material (PEDOT, obtained from H. C. Starck, GmbH) (HIL) is spun onto the surface of the glass including the patterned electrode at a speed of 4000 RPM, to a thickness of about 750 Angstroms. This step is carried out under ambient conditions (i.e., not in a glove box). The PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the PEDOT layer in a deposition chamber (an ÅMOD chamber, obtained from Angstrom Engineering, Ottowa, Canada) after the chamber is pumped down to $10^{-6}$ torr or better. (In the figures, spiro-TPD is referred to as E105.)

The spiro-TPD coated glass is then returned to the nitrogen environment and stamped with an ink including the CdSe/CdZnS core-shell semiconductor nanocrystals made in accordance with the Example 2 or 3, as identified above, and hexane. The optical density of the dispersion of the semiconductor nanocrystals in the ink was 0.0365. The ink was stamped into the spiro-TPD layer using an unfeatured curved Parylene-C coated PDMS stamp using printing machine model XP-05 made by Pad Printing Machinery of Vermont.

After printing, the device was returned to the deposition chamber and pumped back down to $10^{-6}$ torr or better for evaporation of the next layer, which can be a hole blocking layer or an electron transport layer.

In devices including a hole blocking layer, the hole blocking material was either 3-(4-biphenylyl)-4-phenyl-5-tert-butylphenyl-1,2,4-triazole (TAZ) (OLED grade, gradient sublimation purified (from Luminescent Technologies, Taiwan)) or 2,2',2"-(1,3,5-Benzinetriyl)-tris(1-phenyl-1-H-benzimidazole) (TPBi) (OLED grade, gradient sublimation purified (from Luminescent Technologies, Taiwan)). The hole blocking material (if any) included in a device is identified in the Table 1 (below).

When no hole blocking layer (HBL) is included, or after the hole blocking layer is deposited, a layer of electron transport material (OLED grade, gradient sublimation purified) from Luminescent Technologies, Taiwan) is deposited. Various electron transport materials were used. For example, $Alq_3$ or $bAlq_2$. The electron transport material included in a device is identified in the Table 1 (below).

Each of the vapor deposited layers are patterned with use of shadow masks. After deposition of the electron transport material layer, the mask is changed before deposition of the metal cathode.

The details of the materials and layer thickness for the various devices of Example 4 are set forth in Table 1 below.

TABLE 1

| Vacuum (torr) | Material | Thickness (Angstroms) |
|---|---|---|
| DEVICE # 060510D | | |
| HTL 1.20E-007 | E105 | 500 A |
| HBL 2.00E-007 | Balq$_2$ | 200 A |
| ETL 2.00E-007 | Alq$_3$ | 300 A |
| CATHODE 2.00E-007 | MgAg (50:1 by wt) | 690 A |
| TOP LAYER 3.00E-007 | Ag | 300 A |
| DEVICE # 060510E | | |
| HTL 1.00E-007 | E105 | 500 A |
| ETL 1.00E-007 | Alq$_3$ | 500 A |
| CATHODE 3.00E-007 | MgAg (50:1 by wt) | 690 A |
| TOP LAYER 3.00E-007 | Ag | 300 A |
| The ink also included BME (bis-mercaptoethanol) (saturated solution in hexane) | | |
| DEVICE # 060510H | | |
| HTL 1.00E-007 | E105 | 500 A |
| ETL 1.00E-007 | Alq$_3$ | 500 A |
| CATHODE 3.00E-007 | MgAg (50:1 by wt) | 690 A |
| TOP LAYER 3.00E-007 | Ag | 300 A |
| DEVICE # 060510K | | |
| HTL 2.00E-007 | E105 | 500 A |
| ETL 2.00E-007 | Alq$_3$ | 500 A |
| CATHODE 2.00E-007 | MgAg (50:1 by wt) | 690 A |
| TOP LAYER 3.00E-007 | Ag | 300 A |
| DEVICE # 060516M | | |
| HTL 7.00E-007 | E105 | 500 A |
| HBL 8.00E-007 | TAZ | 200 A |
| ETL 8.00E-007 | Alq$_3$ | 300 A |
| CATHODE 8.00E-007 | LiF | 5 A |
| TOP LAYER 8.00E-007 | Al | 1200 A |
| DEVICE # 060524E | | |
| HTL 1.40E-007 | E105 | 500 A |
| HBL 2.00E-007 | TPBi | 200 A |
| ETL 2.00E-007 | Alq$_3$ | 300 A |
| CATHODE 2.00E-007 | LiF | 5 A |
| TOP LAYER 3.00E-007 | Al | 750 A |

Example 5

A. Synthesis of CdSe Semiconductor Nanocrystal Cores 230 mg of anhydrous cadmium acetate (Cd(OAc)$_2$) (1 mmol) (Prochem) and 4 ml of Tri-n-octylphosphine (TOP) (Strem 97%) is added to a 20 mL septum capped vial. The vial is suspended in a 140° C. oil bath (silicon oil). The content of the vial is degassed for about one-half hour. After the cadmium acetate solution is degassed, and the cadmium acetate is dissolved, the vacuum is closed and the vial is opened to nitrogen. The vial is removed from the oil bath and permitted to cool to room temperature while under nitrogen.

6.00 grams of Tri-n-octylphosphine oxide (TOPO) (99% Strem) and 0.668 grams of octadecylphosphonic acid (ODPA) (Polycarbon) are added to a 50 ml three necked round bottom flask. The ingredients are stirred and heated to a temperature of about 120° C. Once the flask reaches 120° C., the solution is degassed for 2 hours while maintained at 120° C. When the solution in the round bottom flask has finished degassing, the vacuum valve is closed and the flask is opened to nitrogen and stirred.

4 mL of the cadmium acetate solution is mixed and injected into the round bottom flask via a septum cap from a syringe filled under nitrogen. The temperature is increased to about 270° C. When the temperature of the solution in the round bottom flask stabilizes at 270° C., 2 ml of Tri-n-butylphosphine (TBP) (Strem 99%) is injected into the round bottom flask from a 5 ml syringe. When the contents of the round bottom flask has restabilized at 270° C., 1.1 mL of Tri-n-butylphosphine selenide (TBPSe) (1.5M) is injected into the round bottom flask. (Unlike Example 1, the temperature is not reduced to 250° C., but rather maintained at 270° C.) After a brief delay (5 secs), the solution turns yellow then orange then red.

A sample is then taken until an absorbance of 570 nm is obtained, at which time the heating mantle is removed and the solution is permitted to cool while stirring. Transfer and work up is carried out in a glove box containing nitrogen. When the crude is melted, the solution is divided into half into 2 centrifuge tubes, and 1× volume of 3:1 methanol/isopropanol is added to each tube to precipitate semiconductor nanocrystal cores. The supernatant is poured off, and the semiconductor nanocrystal cores are mixed with hexane (minimum volume 2.5 ml in each tube), centrifuged for 5 minutes at 4000 rpm, and filtered with hexane using a 0.2 micron filter. The exact volume of solution is recorded; 30 micro liters is then diluted with 3.0 ml hexane in a UV/VIS cuvette. The first peak wavelength/absorbance and absorbance at 350 nm is recorded to calculate the yield of core nanocrystals.

Results/Characterization:

The absorption peak measured for the first sample taken was at about 578 nm. After purification a peak emission was at a wavelength of about 584 nm with a FWHM=26-28 nm). The reaction yield of CdSe cores was 29.95%.

B. Overcoating the CdSe Cores Prepared in Example 5A

Two 5 mL syringes are prepared in the glove box with the precursors for the overcoating.

The first syringe: 4 mL of Tri-n-octylphosphine (TOP) (97% Strem), 22 mg dimethylcadmium, and 20 mg diethylzinc.

The second syringe: 4 mL of Tri-n-octylphosphine (TOP) (97% Strem) and 112 mg of Bis(TMS)sulfide.

The overcoating precursor mixture for each syringe is prepared by placing the Tri-n-octylphosphine into an 8 mL glass vial. The precursors (dimethylcadmium, diethylzinc, or Bis (TMS)sulfide) are then dripped into the Tri-n-octylphosphine using a syringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.1 mmol) as described in Example 5AA in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is turned down to 100° C., and 10 ml of anhydrous toluene is added and allowed to sit overnight under nitrogen.

C. Clean Up of Core CdSe/CdZnS Core-shell Particles (Transfer and Work Up is Carried Out in a Glove box)

The total growth solution is divided into two aliquots, each being put into a 50 mL centrifuge tube. An excess ~15 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another centrifuge tube. (The solid is a salt that has formed and is waste.) An excess of 3:1 methanol/isopropanol is added to the tube to precipitate the overcoated cores. The tube is centrifuged for 5 minutes at 4000 rpm. The supernatant is poured off. The purified overcoated cores are now at the bottom of the tube and the supernatant is waste. Approximately 10 ml hexane is mixed with the overcoated cores and filtered using a 0.2 micron syringe filter. The solution quantum efficiency was 64%. The FWHM is about 27 nm and a peak emission maximum is about 615 nm.

Example 6

Purified CdSe/CdZnS core-shell particles were prepared substantially in accordance with the procedure of Example 5. (All steps were carried out in a glove box and with use of anhydrous solvents.) The solution quantum efficiency was 84%. The FWHM was about 34 nm and a peak emission maximum was about 605 nm.

Example 7

Devices Fabricated with Purified CdSe/CdZnS Core-Shell Particles

Devices # 060908E, #060908F, and #060908H were fabricated with CdSe/CdZnS core-shell particles made in accordance with Example 5. Device #070108A was fabricated with CdSe/CdSnS core-shell particles made in accordance with Example 6. The devices were made as follows:

Glass (50 mm×50 mm) with patterned indium tin oxide (ITO) electrode on one surface (obtained from Thin Film Devices, Anaheim, Calif.) is cleaned in an oxygen plasma for about 6 minutes to remove contaminants and oxygenate the surface. The cleaning takes place on 100% oxygen at about 20 psi. The glass is placed on a water cooled plate to help control the increase in temperature during cleaning.

A layer of hole injection material (PEDOT, obtained from H. C. Starck, GmbH) (HIL) is spun onto the surface of the glass including the patterned electrode at a speed of 4000 RPM, to a thickness of about 750 Angstroms. This step is carried out under ambient conditions (i.e., not in a glove box). The PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the PEDOT layer in a deposition chamber (an ÅMOD chamber, obtained from Angstrom Engineering, Ottowa, Canada) after the chamber is pumped down to $10^{-6}$ torr or better. (In the figures, spiro-TPD is referred to as E105.)

The spiro-TPD coated glass is then returned to the nitrogen environment and stamped with an ink including the CdSe/CdZnS core-shell semiconductor nanocrystals made in accordance with the Example 5 and hexane. The optical density of the dispersion of the semiconductor nanocrystals in the ink was 0.02. The ink was stamped into the spiro-TPD layer using an unfeatured curved Parylene-C coated PDMS stamp using printing machine model XP-05 made by Pad Printing Machinery of Vermont.

After printing, the device was returned to the deposition chamber and pumped back down to $10^{-6}$ torr or better for evaporation of the next layer, which can be a hole blocking layer or an electron transport layer.

A layer of electron transport material is deposited. The electron transport material comprised either LT-N820 (available from Luminescent Technologies, Taiwan) or Alq3.

Each of the vapor deposited layers are patterned with use of shadow masks. After deposition of the electron transport material layer, the mask is changed before deposition of the metal cathode.

The details of the materials and layer thickness for the various devices of Example 7 are set forth in Table 2 below:

TABLE 2

|  | Vacuum (torr) | Material | Thickness (Angstroms) |
|---|---|---|---|
| DEVICE # 0600908E | | | |
| HTL | 1.20E−007 | E105 | 500 A |
| ETL | 8.00E−008 | LT-N820 | 500 A |
| CATHODE | 7.00E−008 | LiF | 5 A |
| TOP LAYER | 6.00E−008 | Al | 1000 A |
| DEVICE # 0600908F | | | |
| HTL | 1.20E−007 | E105 | 500 A |
| ETL | 8.00E−008 | LT-N820 | 500 A |
| CATHODE | 7.00E−008 | LiF | 5 A |
| TOP LAYER | 6.00E−008 | Al | 1000 A |

TABLE 2-continued

|  | Vacuum (torr) | Material | Thickness (Angstroms) |
|---|---|---|---|
| DEVICE # 060908H | | | |
| HTL | 1.20E-007 | E105 | 500 A |
| ETL | 8.00E-008 | LT-N820 | 500 A |
| CATHODE | 7.00E-008 | LiF | 5 A |
| TOP LAYER | 6.00E-008 | Al | 1000 A |
| DEVICE # 070108A | | | |
| HTL | 5.00E-008 | E105 | 500 A |
| ETL | 5.00E-008 | Alq3 | 500 A |
| CATHODE | 1.00E-007 | LiF | 5 A |
| TOP LAYER | 4.50E-007 | Al | 1000 A |

Additional data for the devices described in Tables 1 and 2 are shown in FIGS. 3-22.

Example 8

A. Overcoating the CdSe Cores Prepared in Example 5A

Two 5 mL syringes are prepared in the glove box with the precursors for the overcoating.

The first syringe: 4 mL of Tri-n-octylphosphine (TOP) (97% Strem), 22 mg dimethylcadmium, and 20 mg diethylzinc.

The second syringe: 4 mL of Tri-n-octylphosphine (TOP) (97% Strem) and 112 mg of Bis(TMS)sulfide.

The overcoating precursor mixture for each syringe is prepared by placing the Tri-n-octylphosphine into a 20 ml glass vial. The precursors (dimethylcadmium, diethylzinc, or Bis(TMS)sulfide) are then dripped into the Tri-n-octylphosphine using a microsyringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C. When the flask has lowered to 70° C., the CdSe cores prepared (approximately 0.1 mmol) as described in Example 5A in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is held at 155° C. for 10 minutes and is then turned down to 100° C., and 10 ml of anhydrous toluene is added and allowed to sit overnight under nitrogen.

B. Clean Up of Core CdSe/CdZnS Core-shell Particles (Transfer and Work Up is Carried Out in a Glove Box)

The total growth solution is divided into two aliquots, each being put into a 50 mL centrifuge tube. An excess ~15 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another centrifuge tube. (The solid is a salt that has formed and is waste.) An excess of 3:1 methanol/isopropanol is added to the tube to precipitate the overcoated cores. The tube is centrifuged for 5 minutes at 4000 rpm. The supernatant is poured off. The purified overcoated cores are now at the bottom of the tube and the supernatant is waste. Approximately 10 ml hexane is mixed with the overcoated cores and filtered using a 0.2 micron syringe filter. The solution quantum efficiency was 72%. The FWHM is about 26 nm and a peak emission maximum is about 613 nm.

Example 9

A. Overcoating the CdSe Cores Prepared in Example 5A

Two 5 mL syringes are prepared in the glove box with the precursors for the overcoating.

The first syringe: 4 mL of Tri-n-octylphosphine (TOP) (97% Strem), 22 mg dimethylcadmium, and 19 mg diethylzinc.

The second syringe: 4 mL of Tri-n-octylphosphine (TOP) (97% Strem) and 112 mg of Bis(TMS)sulfide.

The overcoating precursor mixture for each syringe is prepared by placing the Tri-n-octylphosphine into a 20 ml glass vial. The precursors (dimethylcadmium, diethylzinc, or Bis(TMS)sulfide) are then dripped into the Tri-n-octylphosphine using a syringe until the right weight of material has been added to each vial. The solution is mixed gently with the vial capped and then drawn up into the 5 mL syringe.

Micro capillary tubing is then loaded onto each syringe and a small amount of solution is pushed through to clear the tubing of nitrogen (this is all done inside the glove box).

Ten (10) grams of Tri-n-octylphosphine oxide (TOPO) (99% Strem) and 0.8 grams of octadecylphosphonic acid (ODPA) (Polycarbon Industries) are added to a 4 neck 50 mL round bottom flask including a football-shaped magnetic stirrer bar. The flask is also equipped with a rubber septum on two of the four necks, a distillation column on the middle neck and the temperature probe in the last neck. The contents of the flask are heated to 130° C. while under nitrogen. When the temperature reaches 130° C., the nitrogen line is closed, and the flask is slowly opened up to vacuum. The contents of the flask are degassed under vacuum at 130° C. for roughly 2 hours. When the solution in the round bottom flask has finished degassing, the vacuum is closed and the flask is opened up to nitrogen. The temperature of the flask is set to 70° C.

When the flask has lowered to 70° C., the CdSe cores prepared (approximately 0.1 mmol) as described in Example 5A in hexane is added to the round bottom flask using a 5 mL syringe. The vacuum is slowly opened up and all of the hexane is removed from the flask, leaving behind the CdSe cores (this can take as long as an hour). When all of the hexane has been removed, the vacuum is closed and the flask is opened up to nitrogen. 0.5 mL of Decylamine (using 1 ml syringe) is added and the temperature is increased to 155° C. under nitrogen. Once the temperature of the flask reaches 155° C., the syringes are loaded into syringe pumps to introduce the two lines into the flask (one going through each septum, so that the micro capillary tubing is hugging the flask wall and about 0.5 cm submerged into the stirring solution). When the flask is at 155° C., the syringe pumps are turned on and the two solutions are pumped into the flask at a rate of 33 µL/min. with rapid stirring (this will take about two hours). When all of the overcoating solutions from the two syringes has been added to the flask, the syringe pump lines are removed from the flask, the temperature is held at 155° C. for 10 minutes and is then turned down to 100° C., and 10 ml of anhydrous toluene is added and allowed to sit overnight under nitrogen.

B. Clean Up of Core CdSe/CdZnS Core-shell Particles (Transfer and Work Up is Carried Out in a Glove Box)

The total growth solution is divided into two aliquots, each being put into a 50 mL centrifuge tube. An excess ~15 ml of a 3:1 MeOH/Isopropanol mixture is added to each centrifuge tube and stirred. The centrifuge tubes are centrifuged 5 minutes at 4000 rpm. The particles in each tube are dispersed in about 10 mL of hexane with stirring using a vortexer. The centrifuge tubes are then centrifuged for 5 minutes at 4000 rpm. The supernatant includes the hexane and the overcoated cores. The supernatant from each tube is placed into another centrifuge tube. (The solid is a salt that has formed and is waste.) An excess of 3:1 methanol/isopropanol is added to the tube to precipitate the overcoated cores. The tube is centrifuged for 5 minutes at 4000 rpm. The supernatant is poured off. The purified overcoated cores are now at the bottom of the tube and the supernatant is waste. Approximately 10 ml hexane is mixed with the overcoated cores and filtered using a 0.2 micron syringe filter. The solution quantum efficiency was 73%. The FWHM is about 26 nm and a peak emission maximum is about 612 nm. (All solvents are anhydrous.)

Example 10

A. Synthesis of CdZnSe Semiconductor Nanocrystal Cores

ZnSe semiconductor nanocrystals are prepared by rapidly injecting 86 mg (0.7 mmol) diethyl zinc (Strem) and 1 ml tri-n-octylphosphine selenide (TOP) (97% Strem) (1M) dispersed in 5 ml of tri-n-octylphosphine (TOP) (97% Strem), into a round bottom flask containing 7 grams of degassed hexadecylamine (distilled from 98% Sigma-Aldrich and degassed at 120° C. under nitrogen with stirring) at 310° C. and then growing at 270° C. for one hour.

8 ml of the above ZnSe semiconductor nanocrystal growth solution is transferred, while at 160° C., into a degassed solution of 16 grams tri-n-octylphosphine oxide (TOPO) (99% Strem), and 0.665 grams (4 mmol) hexylphosphonic acid (HPA) (Polycarbon Industries), which is also at 160° C. A solution of 1:1 mmol dimethylcadmium (Strem) and 1.2 ml TOPSe (1M) dispersed in 8 ml TOP (97% Strem) is then introduced dropwise (1 drop/~seconds) into the ZnSe semiconductor nanocrystal growth solution/TOPO/HPA mixture, which is at 150° C. The solution is then stirred at 150° C. for 21 hours. Before overcoating the CdZnSe cores with CdZnS, the CdZnSe cores are isolated by precipitating them out of solution twice with a miscible non-solvent.

The CdZnS shell is grown by introducing dropwise a solution of dimethylcadmium (20% of total moles of cation for a shell of predetermined thickness) (Strem), diethylzinc (Strem), and hexamethyldisithiane (2 fold excess of amount for a shell of predetermined thickness) (Fluka) in 8 ml of TOP into a degassed solution of 10 grams of TOPO (99% Strem) and 0.4 grams (2.4 mmol) HPA (Polycarbon Industries), which contains the CdZnSe cores, at a temperature of 140° C. (the CdZnSe cores dispersed in hexane are added to the degasses TOPO/HPA solution and the hexane is pulled off at 70° C. under vacuum prior to addition of the shell precursors).

The solution quantum efficiency was 39%. The FWHM is about 42 nm and a peak emission maximum is about 526 nm.

Example 11

Devices Fabricated with Purified CdZnSe/CdZnS Core-Shell Particles

Devices # 060718A, #060718B, and #060718C, and #060718D were fabricated with CdZnSe/CdZnS core-shell particles made in accordance with Example 1. The devices were made as follows:

Glass (50 mm×50 mm) with patterned indium tin oxide (ITO) electrode on one surface (obtained from Thin Film Devices, Anaheim, Calif.) is cleaned in an oxygen plasma for about 6 minutes to remove contaminants and oxygenate the surface. The cleaning takes place on 100% oxygen at about 20 psi. The glass is placed on a water cooled plate to help control the increase in temperature during cleaning.

A layer of hole injection material (PEDOT, obtained from H. C. Starck, GmbH) (HIL) is spun onto the surface of the glass including the patterned electrode at a speed of 4000 RPM, to a thickness of about 750 Angstroms. This step is carried out under ambient conditions (i.e., not in a glove box). The PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the PEDOT layer in a deposition chamber (an ÁMOD chamber, obtained from Angstrom Engineering, Ottowa, Canada) after the chamber is pumped down to $10^{-6}$ torr or better. (In the figures, spiro-TPD is referred to as E105.)

The spiro-TPD coated glass is then returned to the nitrogen environment and stamped with an ink including the CdZnSe/CdZnS core-shell semiconductor nanocrystals made in accordance with the Example 10 and hexane. The optical density of the dispersion of the semiconductor nanocrystals in the ink was 0.02. The ink was stamped into the spiro-TPD layer using an unfeatured curved Parylene-C coated PDMS stamp using printing machine model XP-05 made by Pad Printing Machinery of Vermont.

After printing, the device was returned to the deposition chamber and pumped back down to $10^{-6}$ torr or better for evaporation of the next layer, which can be a hole blocking layer or an electron transport layer.

A layer of LT-N820 electron transport material from Luminescent Technologies, Taiwan) is deposited.

Each of the vapor deposited layers are patterned with use of shadow masks. After deposition of the electron transport material layer, the mask is changed before deposition of the metal cathode.

The details of the materials and layer thickness for the various devices of Example 11 are set forth below in Table 3:

TABLE 3

|  | Vacuum (torr) | Material | Thickness (Angstroms) |
|---|---|---|---|
| DEVICE # 0600718A | | | |
| HTL | 9E-007 | E105 | 500 A |
| ETL | 1E-007 | LT-N820 | 500 A |
| CATHODE | 7E-007 | LiF | 5 A |
| TOP LAYER | 5E-007 | Al | 800 A |
| DEVICE # 060718B | | | |
| HTL | 9E-007 | E105 | 500 A |
| ETL | 1E-007 | LT-N820 | 500 A |
| CATHODE | 7E-007 | LiF | 5 A |
| TOP LAYER | 5E-007 | Al | 800 A |
| DEVICE # 060718C | | | |
| HTL | 9E-007 | E105 | 500 A |
| ETL | 1E-007 | LT-N820 | 500 A |
| CATHODE | 7E-007 | LiF | 5 A |
| TOP LAYER | 5E-007 | Al | 800 A |
| HTL | 9E-007 | E105 | 500 A |
| DEVICE # 0600718D | | | |
| HTL | 9E-007 | E105 | 500 A |
| ETL | 1E-007 | LT-N820 | 500 A |
| CATHODE | 7E-007 | LiF | 5 A |
| TOP LAYER | 5E-007 | Al | 800 A |

Additional data for the devices described in Table 3 are shown in FIGS. 24 and 26-29.

Example 12

A. Synthesis of CdZnSe Semiconductor Nanocrystal Cores

ZnSe semiconductor nanocrystals are prepared by rapidly injecting 6 ml of a mixture of 86 mg (0.7 mmol) diethyl zinc (Strem) and 1 ml tri-n-octylphosphine selenide (TOPSe) (97% Strem) (1M) dispersed in 5 ml of tri-n-octylphosphine (TOP) (97% Strem), into a round bottom flask containing 7 grams of degassed oleylamine (distilled from 98% Sigma-Aldrich and degassed at 120° C. under nitrogen with stirring) at 310° C. and then growing at 270° C. for 1.5 hour. When the particles have finished growing, the temperature is set at 160° C. and let cool to 160° C. with stirring.

8 ml of the above ZnSe semiconductor nanocrystal growth solution is transferred, while at 160° C., into a degassed solution of 16 grams tri-n-octylphosphine oxide (TOPO) (99% Strem), and 0.665 grams (4 mmol) hexylphosphonic acid (HPA) (Polycarbon Industries), which is also at 160° C. A solution of 1:1 mmol dimethylcadmium (Strem) and 1.2 ml TOPSe (1M) dispersed in 8 ml Tri-n-octylphosphine (TOP) (97% Strem) is then introduced dropwise (1 drop/~1-2 seconds) into the ZnSe semiconductor nanocrystal growth solution/TOPO/oleylamine mixture, which is at 150° C. The solution is then stirred at 150° C. for 24-26 hours.

Before overcoating the CdZnSe cores with CdZnS, the CdZnSe cores are purified and isolated as follows. (In this example, the precipitation step was carried out two times for each sample.) The solution was divided in half; each half was added to a separate centrifuge tube. 2 ml hexane, 2 ml butanol were added to each centrifuge tube, followed by excess methanol. Each tube was then centrifuged for 5 min, 4000 rpm. After centrifuging, the supernatant liquid was poured off, retaining the solid in each centrifuge tube. ~10 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding 0.2-0.6 ml butanol followed by excess methanol with stirring. The new tubes containing the precipitated cores were centrifuged, the supernatant liquid decanted, leaving precipitated cores in each tube. ~2-4 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.

CdZnS is deposited on cores by introducing dropwise (using a syringe pump) a solution of dimethylcadmium (25% of total moles of cation for a shell of predetermined thickness) (Strem), diethylzinc (Strem), and hexamethyldisithiane (2 fold excess of amount for a shell of predetermined thickness) (Fluka) in 8 ml of TOP into a degassed solution of 10 grams of TOPO (99% Strem) and 0.4 grams (2.4 mmol) HPA (Polycarbon Industries), which contains the CdZnSe cores, at a temperature of 140° C. (the CdZnSe cores dispersed in hexane are added to the degasses TOPO/HPA solution and the hexane is pulled off at 70° C. under vacuum prior to addition of the shell precursors). Cores including CdZnS deposited thereon are purified and isolated using a method similar to that described above for purifying and isolating cores.

Example 13

Device Fabricated with Purified CdZnSe/CdZnS Core-Shell Particles

Devices # 061128K was fabricated with CdZnSe/CdZnS core-shell particles made in accordance with Example 12. The device was made as follows:

Glass (50 mm×50 mm) with patterned indium tin oxide (ITO) electrode on one surface (obtained from Thin Film Devices, Anaheim, Calif.) is cleaned in an oxygen plasma for about 8 minutes to remove contaminants and oxygenate the surface. The cleaning takes place in 100% oxygen under vacuum (0.1-1.5 torr). The glass is placed on a water cooled plate to help control the increase in temperature during cleaning.

A layer of hole injection material (PEDOT, obtained from H. C. Starck, GmbH) (HIL) is spun onto the surface of the glass including the patterned electrode at a speed of 4000 RPM, to a thickness of about 750 Angstroms. This step is carried out under ambient conditions (i.e., not in a glove box). The PEDOT coated glass is then heated on a 120° C. hot plate in a chamber (<20 ppm water & <10 ppm oxygen), in a HEPA filter environment (approx. Class 1), in a nitrogen atmosphere for >20 minutes to dry the PEDOT. The PEDOT coated glass is then allowed to cool to room temperature.

A layer of hole transport material (N,N'-bis(3-methylphenyl)-N,N'-bis(phenyl)-spiro (spiro-TPD) (OLED grade, gradient sublimation purified) from Luminescent Technologies, Taiwan)) is then evaporated onto the PEDOT layer in a deposition chamber (an ÁMOD chamber, obtained from Angstrom Engineering, Ottowa, Canada) after the chamber is pumped down to $10^{-6}$ torr or better. (In the figures, spiro-TPD is Referred to as E105.)

The spiro-TPD coated glass is then returned to the nitrogen environment and stamped with an ink including the CdZnSe/CdZnS core-shell semiconductor nanocrystals made in accordance with the Example 12 and hexane. The optical density of the dispersion of the semiconductor nanocrystals in the ink was 0.02. The ink was stamped into the spiro-TPD layer using an unfeatured curved Parylene-C coated PDMS stamp using printing machine model XP-05 made by Pad Printing Machinery of Vermont.

After printing, the device was returned to the deposition chamber and pumped back down to $10^{-6}$ torr or better for evaporation of the next layer, which can be a hole blocking layer or an electron transport layer.

A layer of 2,2',2"-(1,3,5-Benzinetriyl)-tris(1-phenyl-1-H-benzimidazole) (TPBi) (OLED grade, gradient sublimation purified) from Luminescent Technologies, Taiwan) is deposited.

Each of the vapor deposited layers are patterned with use of shadow masks. After deposition of the electron transport material layer, the mask is changed before deposition of the metal cathode.

The details of the materials and layer thickness for device 061128K of this Example 13 are set forth below in Table 4:

TABLE 4

| | Vacuum (torr) DEVICE # 061128K | Material | Thickness (Angstroms) |
|---|---|---|---|
| HIL | 0.1-1.5 | PEDOT | 750 A |
| HTL | 6E-008 | E105 | 500 A |
| ETL | 9E-007 | TPBi | 500 A |
| CATHODE | 7E-008 | LiF | 5 A |
| TOP LAYER | 6E-007 | Al | 1000 A |

Figure 30:
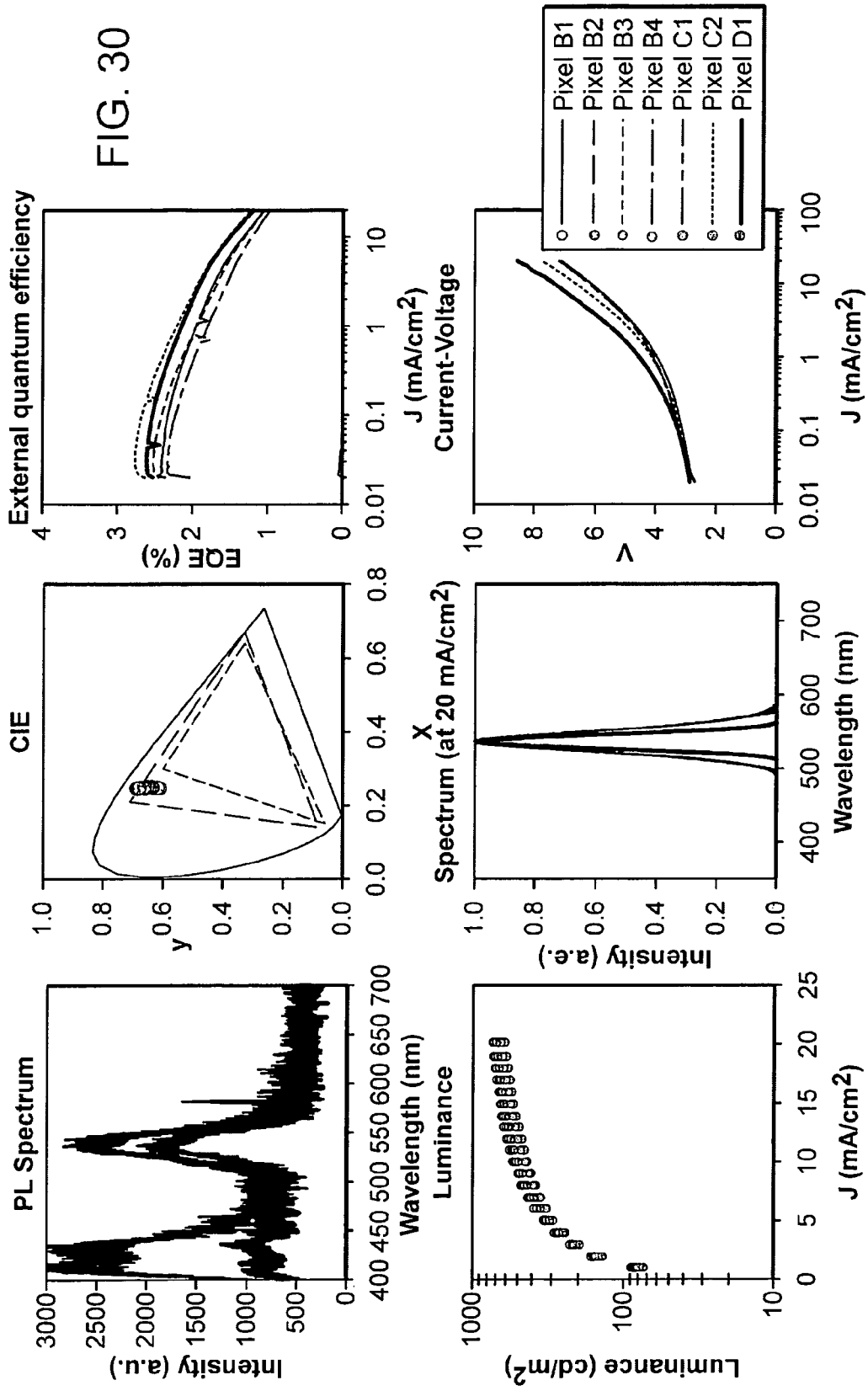

Additional data for the devices described in Table 4 are shown in FIGS. 25 and 30.

Semiconductor nanocrystals (including core-shell semiconductor nanocrystals) that are particularly advantageous for use in preparing devices in accordance with various aspects and embodiments of the invention described herein are preferably prepared and purified with use of anhydrous solvents and reagents in an environment that includes less than about 10 ppm of each of water and oxygen, more preferably less than about 1 ppm of each of water and oxygen, and most preferably less than 0.1 ppm each of water and oxygen.

The measurements set forth in the Figures were made without use of any outcoupling enhancing optics such as lenses, microlenses or scatterers, and do not utilize microcavity optimization to enhance the normal direction emitted light. Generally accepted techniques for conducting the types of measurements included in the Figures are described in Forrest, et al. (Supra)

As used herein, "top" and "bottom" are relative positional terms, based upon a location from a reference point. More particularly, "top" means furthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. A light-emitting device comprising: a first electrode comprising an anode opposite a second electrode comprising a cathode, a hole injection layer adjacent the first electrode, and an emissive layer of inorganic semiconductor nanocrystals disposed between the hole injection layer and the second electrode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material, and wherein the device has a peak external quantum efficiency of at least about 2.2 percent.

2. A light-emitting device in accordance with claim 1 wherein the device has a peak external quantum efficiency of at least about 2.5 percent.

3. A light-emitting device in accordance with claim 1 wherein the device has a peak external quantum efficiency of at least about 3.0 percent.

4. A light-emitting device in accordance with claim 1 wherein the device has a peak external quantum efficiency of at least about 3.5 percent.

5. A light-emitting device in accordance with claim 1 wherein the device has a peak external quantum efficiency of at least about 4.0 percent.

6. A light-emitting device in accordance with claim 1 wherein the device has a peak external quantum efficiency of at least about 4.5 percent.

7. A light-emitting device in accordance with claim 1 wherein the emissive layer comprises semiconductor nanocrystals capable of emitting red light upon excitation.

8. A light-emitting device in accordance with claim 1 wherein at least a portion of the semiconductor nanocrystals include a core comprising CdSe and a shell on at least a portion of a surface of the core, the shell comprising CdZnS 9. A light-emitting device in accordance with claim 1 wherein the emissive layer comprises semiconductor nanocrystals capable of emitting green light upon excitation.

10. A light-emitting device in accordance with claim 1 wherein at least a portion of the semiconductor nanocrystals include a core comprising CdZnSe and a shell on at least a portion of a surface of the core, the shell comprising CdZnS.

11. A light-emitting device in accordance with claim 1 wherein at least a portion of the semiconductor nanocrystals include a ligand attached thereto.

12. A light-emitting device in accordance with claim 1 wherein the device further comprises a layer comprising a material capable of transporting charge disposed between the hole injection layer and the second electrode.

13. A light-emitting device in accordance with claim 1 further comprising a layer comprising a matrix disposed between the hole injection layer and the second electrode.

14. A light-emitting device in accordance with claim 1 wherein the layer of inorganic semiconductor nanocrystals is included in the device in a predetermined arrangement at a thickness of three or less monolayers.

15. A light-emitting device in accordance with claim 1 wherein the layer of inorganic semiconductor nanocrystals is included in the device in a predetermined arrangement at a thickness of two or less monolayers.

16. A light-emitting device in accordance with claim 1 wherein the layer of inorganic semiconductor nanocrystals is included in the device in a predetermined arrangement at a thickness of about one monolayer.

17. A light-emitting device in accordance with claim 1 wherein the emissive layer is disposed as monolayer.

18. A display including at least one light-emitting device in accordance with claim 1.

19. A light-emitting device in accordance with claim 1 wherein the light-emitting device emits light with a luminescent efficiency of at least about 3.7 cd/A.

20. A light-emitting device in accordance with claim 1 wherein the light-emitting device emits light with a luminescent efficiency of at least about 2.7 lumens/watt.

21. A light-emitting device in accordance with claim 1, wherein the device emits light having a CIE color coordinate of x greater than 0.63.

22. A light-emitting device in accordance with claim 1 wherein the first semiconductor material comprises a Group II-VI compound, Group II-V compound, Group III-VI compound, Group III-V compound, Group IV-VI compound, Group I-III-VI compound, Group II-IV-VI compound, or Group II-IV-V compound, Group IV element, an alloy including any of the foregoing, and/or a mixture including any of the foregoing.

23. A light-emitting device in accordance with claim 1 wherein the second semiconductor material comprises a ternary semiconductor material including a Group II-VI compound, Group II-V compound, Group III-VI compound, Group III-V compound, Group IV-VI compound, Group I-III-VI compound, Group II-IV-VI compound, or Group II-IV-V compound, Group IV element, an alloy including any of the foregoing, and/or a mixture including any of the foregoing.

24. A light-emitting device in accordance with claim 1 wherein the semiconductor nanocrystals when excited in solution emit light with a quantum efficiency of at least about 60%.

25. A light-emitting device in accordance with claim 1 wherein the semiconductor nanocrystals when excited in solution emit light with a quantum efficiency of at least about 70%.

26. A light-emitting device in accordance with claim 1 wherein the semiconductor nanocrystals when excited in solution emit light with a quantum efficiency of at least about 80%.

27. A light emitting device in accordance with claim 1 wherein the device is capable of emitting light with a full width at half maximum of not more than 40 nm.

28. A light emitting device in accordance with claim 1 wherein the device is capable of emitting light with a full width at half maximum of not more than 30 nm.

29. The light emitting device in accordance with claim 1 wherein the device is capable of emitting light with a full width at half maximum of not more than 20 nm.

30. A light emitting device in accordance with claim 1 wherein the emissive layer has a thickness of more than one monolayer.

31. A light-emitting device in accordance with claim 12 wherein the material capable of transporting charge comprises a material capable of transporting holes.

32. A light-emitting device in accordance with claim 12 wherein the material capable of transporting charge comprises a material capable of transporting electrons.

33. A light-emitting device in accordance with claim 12 wherein the material capable of transporting charge comprises a material capable of transporting holes and electrons.

34. A light-emitting device in accordance with claim 12 further comprising a second layer comprising a material capable of transporting charge disposed between the layer comprising a material capable of transporting charge and the second electrode.

35. A display in accordance with claim 18 further including one or more additional light-emitting devices wherein each light-emitting device includes a different emissive material.

36. A display in accordance with claim 35 wherein the each of the different emissive materials comprises a plurality of semiconductor nanocrystals that emit light with an emission wavelength that is distinguishable from that of the semiconductor nanocrystals including in each of the other different emissive materials.

37. A light-emitting device comprising: a first electrode comprising an anode opposite a second electrode comprising a cathode, a hole injection layer adjacent the first electrode, and an emissive layer of inorganic semiconductor nanocrystals disposed between the hole injection layer and the second electrode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material, and wherein the device has an external quantum efficiency of at least about 2.2 percent when measured at a current density of 5 mA/cm$^2$.

38. A light-emitting device in accordance with claim 37 wherein the device has an external efficiency of at least about 2.5 percent when measured at a current density of 5 mA/cm$^2$.

39. A light-emitting device in accordance with claim 37 wherein the device has an external efficiency of at least about 3.0 percent when measured at a current density of 5 mA/cm$^2$.

40. A light-emitting device in accordance with claim 37 wherein the device has an external efficiency of at least about 3.5 percent when measured at a current density of 5 mA/cm².

41. A light-emitting device in accordance with claim 37 wherein at least a portion of the semiconductor nanocrystals include a core comprising CdSe and a shell on at least a portion of a surface of the core, the shell comprising CdZnS.

42. A light emitting device in accordance with claim 37 wherein the emissive layer has a thickness of more than one monolayer.

43. A light-emitting device comprising:
a substrate;
an anode disposed on the substrate;
a hole injection layer disposed over the anode;
a material capable of transporting holes disposed over the hole injection layer;
a material capable of blocking holes disposed over the material capable of transporting holes;
a material capable of transporting electrons disposed over the material capable of blocking holes;
a cathode disposed over the material capable of transporting electrons; and
an emissive layer of inorganic semiconductor nanocrystals disposed between the anode and the cathode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material and wherein the device has a peak external quantum efficiency of at least about 2.2 percent.

44. A light-emitting device comprising:
a substrate;
a cathode disposed on the substrate;
a material capable of transporting electrons disposed over the cathode;
a material capable of blocking holes disposed over the material capable of transporting electrons;
a material capable of transporting holes disposed over the material capable of blocking holes;
a hole injection layer disposed over the material capable of transporting holes;
an anode disposed over the hole injection layer; and
an emissive layer of inorganic semiconductor nanocrystals disposed between the cathode and the anode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material and wherein the device has a peak external quantum efficiency of at least about 2.2 percent.

45. A light-emitting device comprising: a first electrode comprising an anode opposite a second electrode comprising a cathode, a hole injection layer adjacent the first electrode, and an emissive layer of inorganic semiconductor nanocrystals disposed between the hole injection layer and the second electrode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material, and wherein the device has a luminescent efficiency of at least about 3 lumens per watt when measured at a current density of 5mA/cm².

46. A light-emitting device comprising: a first electrode comprising an anode opposite a second electrode comprising a cathode, a hole injection layer adjacent the first electrode, and an emissive layer of inorganic semiconductor nanocrystals disposed between the hole injection layer and the second electrode, wherein the semiconductor nanocrystals when excited in solution emit light with a quantum efficiency of at least about 50% and at least a portion of the semiconductor nanocrystals include a core including a first semiconductor material and a shell overcoating the core, the shell comprising a second semiconductor material comprising a ternary semiconductor material, and wherein the device is capable of emitting light with a brightness of at least 100 nits when driven at a voltage less than or equal to 4 volts.

47. A light-emitting device in accordance with claim 46 wherein the emissive layer is a printed layer of the semiconductor nanocrystals.

48. A light emitting device in accordance with claim 46 further comprising a first layer comprising a material capable of transporting charge disposed between the hole injection layer and the second electrode, a second layer comprising a material capable of transporting charge disposed between the hole injection layer and second electrode.

* * * * *